(12) United States Patent
Hsiao et al.

(10) Patent No.: US 11,688,625 B2
(45) Date of Patent: Jun. 27, 2023

(54) METHOD FOR MANUFACTURING SEMICONDUCTOR DEVICE

(71) Applicant: TAIWAN SEMICONDUCTOR MANUFACTURING COMPANY, LTD., Hsinchu (TW)

(72) Inventors: Po-Kai Hsiao, Changhua County (TW); Tsai-Yu Huang, Taoyuan (TW); Hui-Cheng Chang, Tainan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/461,338

(22) Filed: Aug. 30, 2021

(65) Prior Publication Data
US 2023/0068951 A1   Mar. 2, 2023

(51) Int. Cl.
  *H01L 21/762* (2006.01)
  *H01L 29/66* (2006.01)
  *H01L 21/02* (2006.01)

(52) U.S. Cl.
  CPC .. *H01L 21/76224* (2013.01); *H01L 29/66545* (2013.01); *H01L 29/66742* (2013.01);
  (Continued)

(58) Field of Classification Search
  CPC ............ H01L 21/027; H01L 21/0332; H01L 21/0334; H01L 21/0335; H01L 21/0337; H01L 21/02667–02672; H01L 21/02494; H01L 21/02496; H01L 21/02502; H01L 21/02505; H01L 21/02532; H01L 21/02592; H01L 21/02595; H01L 21/02598; H01L 21/324; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 21/823412; H01L 21/823807; H01L 21/0223–02244; H01L 21/02249; H01L 21/02252; H01L 21/02614; H01L 21/76202–76221;
  (Continued)

(56) References Cited

U.S. PATENT DOCUMENTS 9,093,530 B2   7/2015   Huang et al.
9,171,929 B2   10/2015  Lee et al.
(Continued)

*Primary Examiner* — Sonya McCall-Shepard
(74) *Attorney, Agent, or Firm* — Birch, Stewart, Kolasch & Birch, LLP

(57) ABSTRACT

A method for manufacturing a semiconductor device is provided. The method includes forming at least one epitaxial layer over a substrate; forming a mask over the epitaxial layer; patterning the epitaxial layer into a semiconductor fin; depositing a semiconductor capping layer over the semiconductor fin and the mask, wherein the semiconductor capping layer has a first portion that is amorphous on a sidewall of the mask; performing a thermal treatment such that the first portion of the semiconductor capping layer is converted from amorphous into crystalline; forming an isolation structure around the semiconductor fin; and forming a gate structure over the semiconductor fin.

20 Claims, 46 Drawing Sheets

(52) U.S. Cl.
CPC .... *H01L 29/66795* (2013.01); *H01L 21/0243* (2013.01); *H01L 21/0245* (2013.01); *H01L 21/02488* (2013.01); *H01L 21/02502* (2013.01); *H01L 21/02532* (2013.01); *H01L 21/02667* (2013.01)

(58) Field of Classification Search
CPC . H01L 21/02323–02326; H01L 21/164; H01L 21/3165–31687; H01L 21/32105; H01L 21/76855; H01L 21/76888
See application file for complete search history.

(56) References Cited

U.S. PATENT DOCUMENTS

| | | |
|---|---|---|
| 9,209,247 B2 | 12/2015 | Colinge et al. |
| 9,214,555 B2 | 12/2015 | Oxland et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,548,303 B2 | 1/2017 | Lee et al. |
| 9,564,489 B2 * | 2/2017 | Yeo .................... H01L 29/42392 |
| 9,576,814 B2 | 2/2017 | Wu et al. |
| 9,601,342 B2 | 3/2017 | Lee et al. |
| 9,608,116 B2 | 3/2017 | Ching et al. |
| 2014/0110755 A1 * | 4/2014 | Colinge .............. H01L 29/0847 |
| | | 257/E21.409 |
| 2021/0125983 A1 * | 4/2021 | Choi ................. H01L 21/02532 |

\* cited by examiner though the semiconductor industry to manufacture low-cost, high-performance, and low-power integrated circuits (ICs). Thus far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

METHOD FOR MANUFACTURING SEMICONDUCTOR DEVICE

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
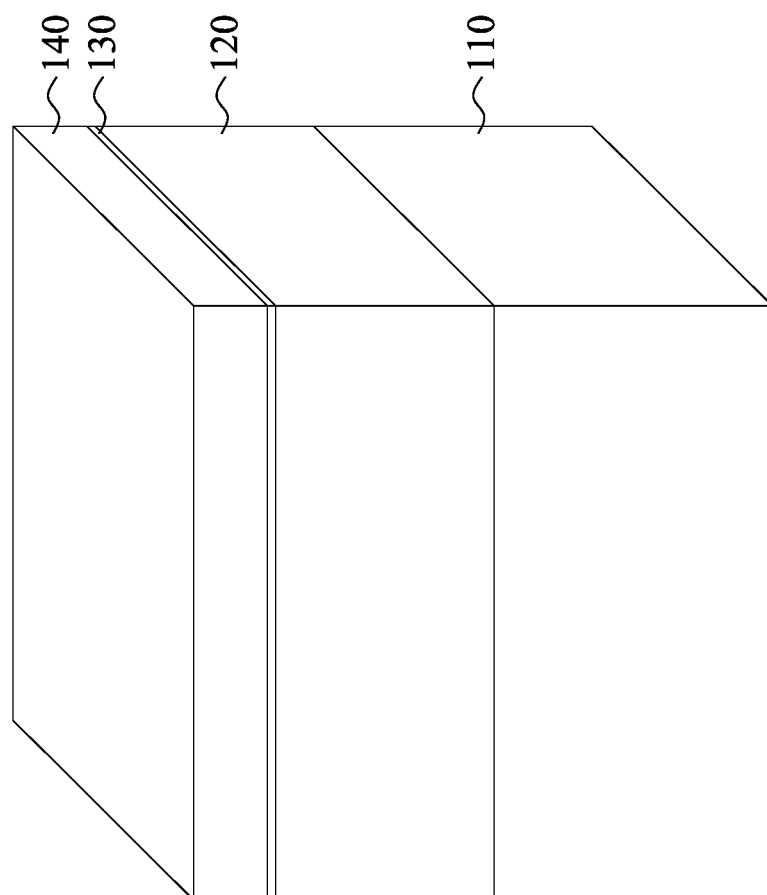
FIGS. 1 through 15 illustrate cross-sectional views and perspective views of intermediate stages in the formation of Fin Field-Effect transistors (FinFETs) in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of forming Fin Field-Effect transistors (FinFETs) and forming gate all around (GAA) transistors and the resulting structures are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1 through 15 illustrate cross-sectional views and perspective views of intermediate stages in the formation of Fin Field-Effect transistors (FinFETs) in accordance with some embodiments. The illustration is merely exemplary and is not intended to limit beyond what is specifically recited in the claims that follow. It is understood that additional operations may be provided before, during, and after the operations shown by FIGS. 1-15, and some of the operations described below can be replaced or eliminated for additional embodiments of the method. The order of the operations/processes may be interchangeable.

Referring to FIG. 1, an epitaxial layer 120, a pad oxide layer 130, and a hard mask layer 140 are formed over a substrate 110. In some embodiments, the substrate 110 may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the epitaxial layer 120 may be formed of a high-mobility semiconductor material such as silicon germanium, germanium (with no silicon), III-V compound semiconductor such as GaAs, InP, GaN, InGaAs, InAlAs, GaSb, AlSb, AlAs, AlP, GaP, combinations thereof, or multi-layers thereof. In some embodiments, the epitaxy processes of forming the epitaxial layer 120 include chemical vapor deposition (CVD) techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the underlying semiconductor materials. In some embodiments where the epitaxial layer 120 includes SiGe, examples of silicon-containing gases include silane ($SiH_4$) or the like, and examples of germanium-containing gases include germane ($GeH_4$) or the like.

The pad layer 130 may be a thin film comprising silicon oxide formed using, for example, a thermal oxidation process. The pad layer 130 may act as a buffer layer between the epitaxial layer 120 and hard mask layer 140. The pad layer 130 may also act as an etch stop layer for etching the hard mask layer 140 in subsequent process. In some embodiments, the hard mask layer 140 is formed of dielectric material, such as silicon nitride, for example, using low-pressure chemical vapor deposition (LPCVD) or plasma enhanced chemical vapor deposition (PECVD).

Figure 2:
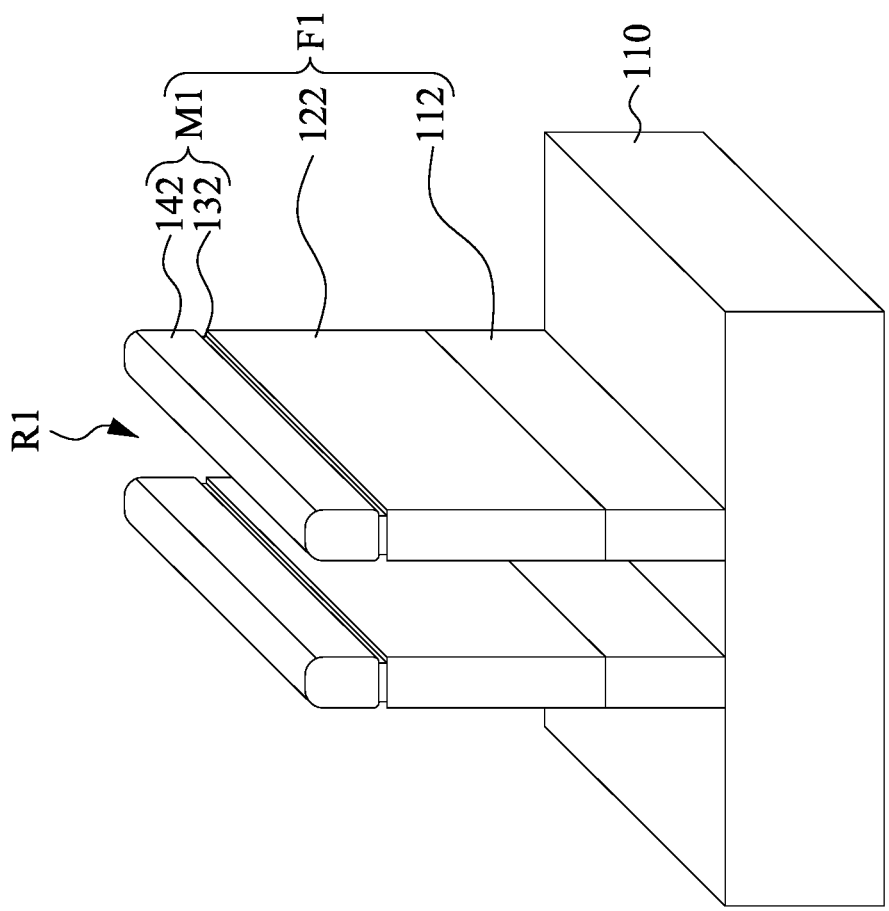

The following steps as shown in FIG. 2 illustrate the formation of semiconductor fins F1. The fins may be patterned by any suitable method. For example, the strips may be patterned using one or more photolithography processes, including double-patterning or multi-patterning processes. Double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

In accordance with some exemplary embodiments as shown in FIG. 2, the hard mask layer 140 and the pad layer 130 (referring to FIG. 1) are patterned to form masks M1, which are used as etching mask for forming semiconductor fins. For example, a photoresist layer is formed on the hard mask layer 140 (referring to FIG. 1) and then patterned by photolithography processes, forming openings in the photoresist layer, such that some regions of the hard mask layer 140 (referring to FIG. 1) are exposed by the photoresist layer. The exposed portions of the hard mask layer 140 and the underlying pad layer 130 (referring to FIG. 1) are etched and removed, and the remaining hard mask layer 140 and the underlying pad layer 130 (referring to FIG. 1) are referred to as hard mask layers 142 and pad layers 132 of the masks M1.

Subsequently, an etching process is performed to etch the epitaxial layer 120 and the substrate 110 (referring to FIG. 1), thereby forming semiconductor fins F1. For example, the etching process may include dry etch such as reactive-ion etching (RIE), wet etch using a liquid substrate etchant, or the combination thereof. For example, gas etchants like HBr, and $Cl_2$, may be used in the etching the epitaxial layer 120 and the substrate 110, and the masks M1 may have a higher etch resistance to the etchant than that of the epitaxial layer 120 and the substrate 110 (referring to FIG. 1). Through the etching process, recesses R1 are formed to separate the semiconductor fins F1 from each other. In some embodiments, each of the semiconductor fins F1 may include a substrate portion 112, an epitaxial portion 122, and a mask M1, which are respectively patterned from the substrate 110, the epitaxial layer 120, and a combination of the pad oxide layer 130 and the hard mask layer 140 in FIG. 1, respectively.

Figure 3A:
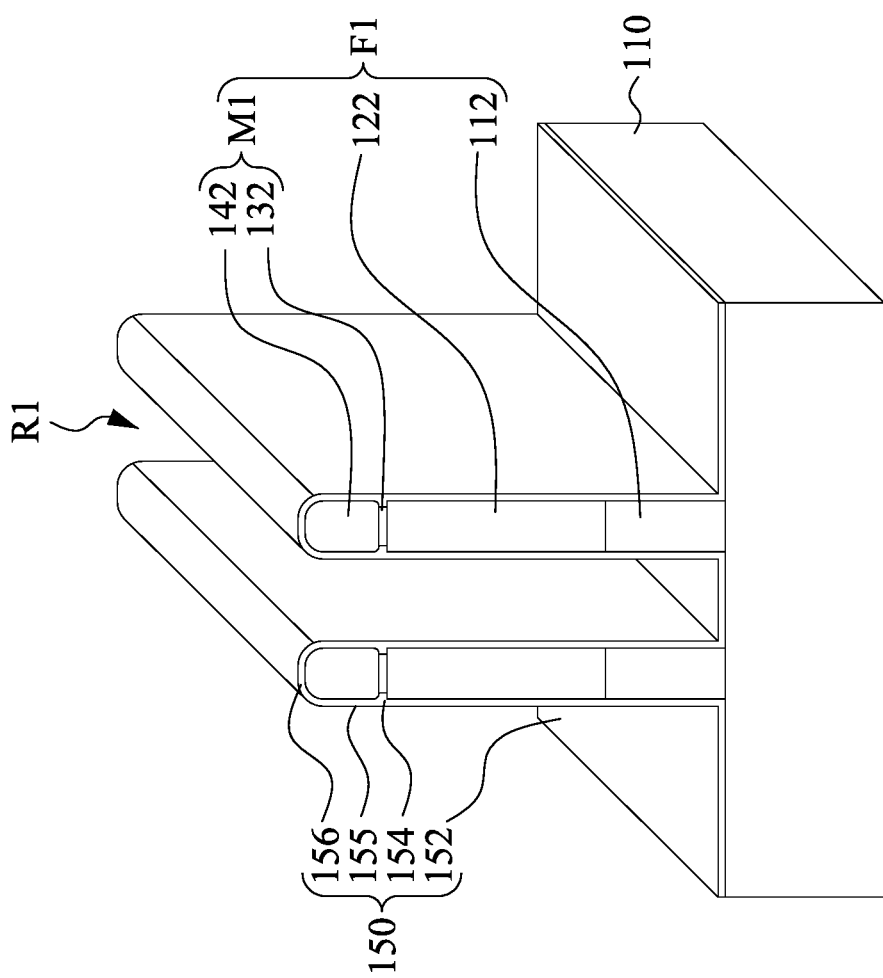
Figure 3B:
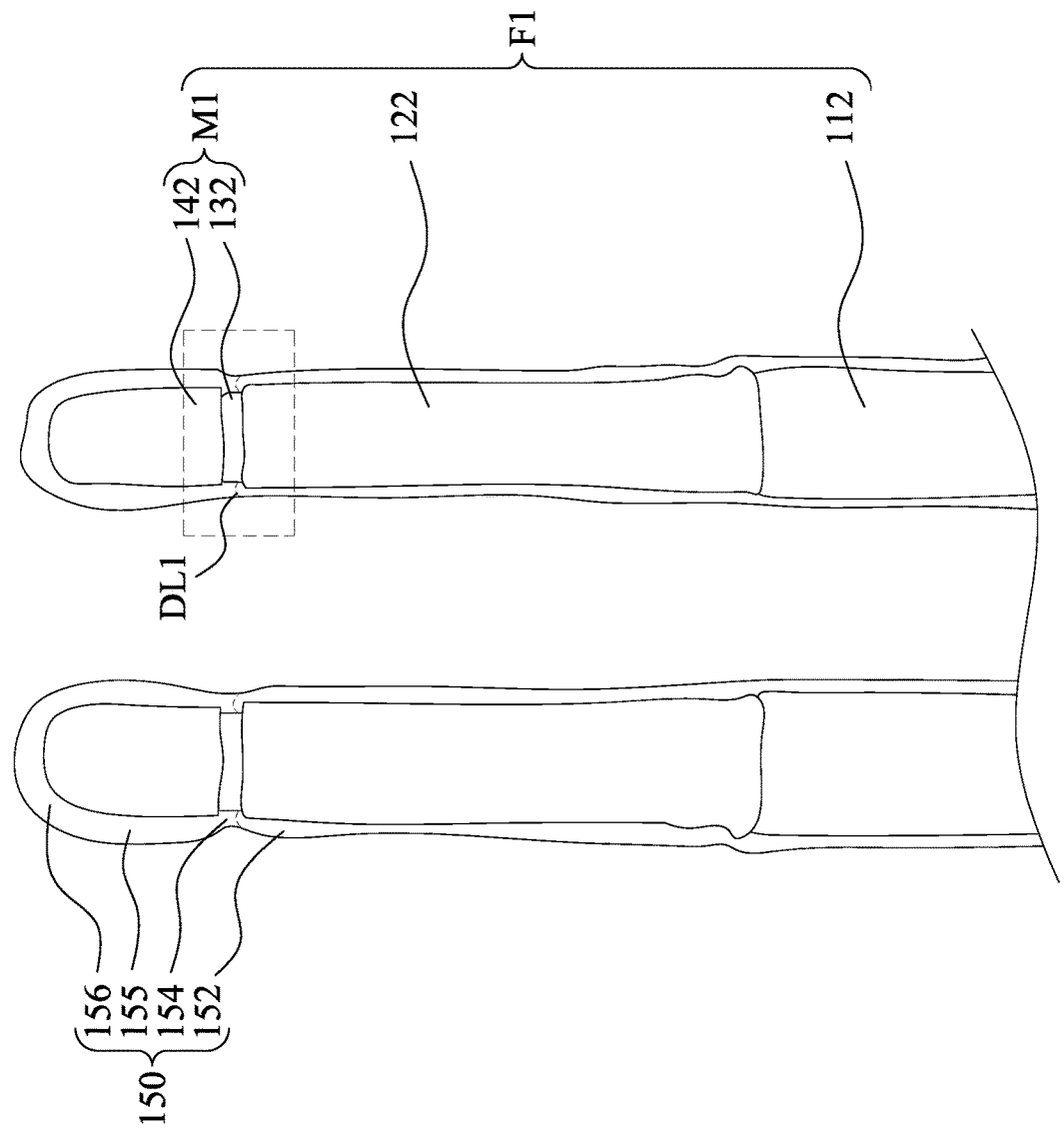
Figure 3C:
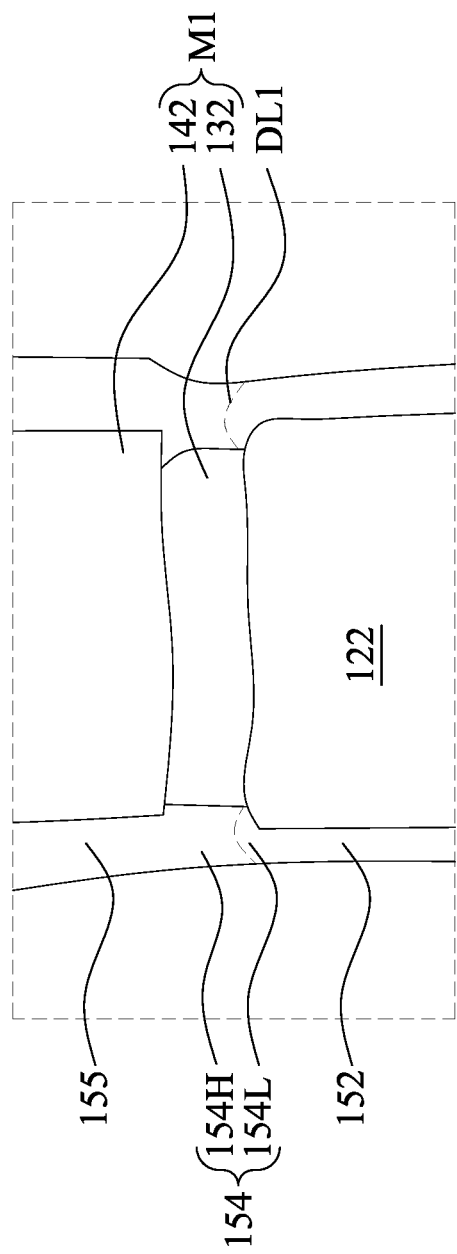

Reference is made to FIGS. 3A-3C. FIG. 3B is a schematic cross-sectional view of FIG. 3B. FIG. 3C is an enlarged correctional view of a portion of the structure of FIG. 3B (as indicated by dashed line box). A capping layer 150 is conformally formed over the structure of FIG. 2, thereby mask the sidewalls of the epitaxial portions 122 from oxidation. Silicon germanium is prone to oxidation, and also has an oxidation rate significantly higher than the oxidation rate of silicon. In some embodiments, the capping layer 150 is used for protect the underlying epitaxial portion 122 from being oxidized, for example, by an oxide annealing process performed later. The capping layer 150 may include silicon, and is free from germanium in some embodiments. Furthermore, the capping layer 150 may be free from oxygen and nitrogen, and hence does not include silicon oxide and silicon nitride. The formation of the capping layer 150 may be performed using a conformal deposition method such as Atomic Layer Deposition (ALD), Chemical Vapor Deposition (CVD), or the combination thereof. In some embodiments, the capping layer 150 may have a thickness in a range from about 0.5 nanometer to 3 nanometers. If the thickness of the capping layer 150 is greater than about 3 nanometers, the critical dimension (CD) between the fins F1 may be unnecessarily increased. If the thickness of the capping layer 150 is less than about 0.5 nanometer, the capping layer 150 may be easily oxidized, and therefore may not protect the SiGe layer from oxidation. In some embodiments, the capping layer 150 may also be referred to as a protection layer.

The deposition of the capping layer 150 may be achieved through an epitaxy process, so that at least a part of the capping layer 150 is a crystalline layer, such as a polysilicon layer. For example, portions 152 of the capping layer 150 over sidewalls of the epitaxial portion 122 and the substrate portion 112 and the top surface of the substrate 110 may be crystalline. In some cases, due to the presence of the masks M1, portions of the capping layer 150 over top surfaces and sidewalls of the masks M1 may be amorphous. For example, a dashed line DL1 in the figure indicates a boundary between the crystalline phase and the amorphous phase in the capping layer 150. For clear illustration, herein, portions of the capping layer 150 over the sidewalls of the layers 132 are referred to as the portions 154, portions of the capping layer 150 over the sidewalls of the layers 142 are referred to as the portions 155, and portions of the capping layer 150 over the top surface of the layers 142 are referred to as the portions 156. In some embodiments, through the epitaxial growth, while the portion 155 and 156 are amorphous, and the portion 154 may be amorphous and partially crystalline, in which a lower part 154L of the portion 154 adjacent to the epitaxial portion 122 may be crystalline, and a higher part 154H of the portion 154 away from the epitaxial portion 122 may be amorphous. In some embodiments, the capping layer 150 may include a transition region (e.g., the portion 154) from crystalline to amorphous, and the transition region nears the dashed line DL1.

In some embodiments, since the amorphous Si has a less dense structure than crystal Si, the amorphous Si has an oxidation rate higher than an oxidation rate of crystal Si. In some cases, a distance between the epitaxial portion 122 and the amorphous portions (e.g., the part 154H of the portion 154 and portions 155 and 156) is so short, such that a top part of the epitaxial portion 122 near the amorphous portion of the capping layer 150, may not be effectively protected by the capping layer 150 from the undesirable oxidation.

In some embodiments, since the amorphous Si has a less dense structure than crystal Si, the deposition may be performed such that a thickness of the amorphous Si is greater than a thickness of the crystal Si. For example, the thickness of the higher part 154H of the portion 154 and portions 155 and 156 is greater than the thickness of the lower part 154L of the portion 154 and portion 152.

Figure 4A:
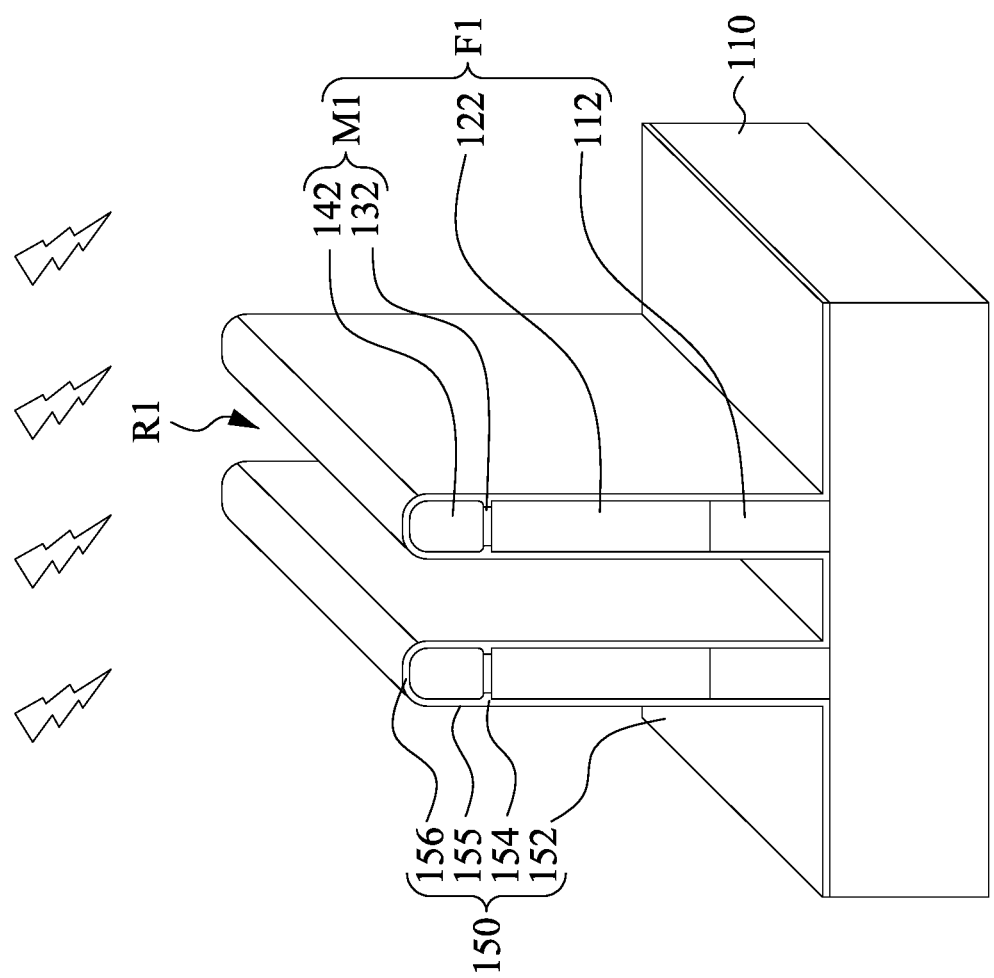
Figure 4B:
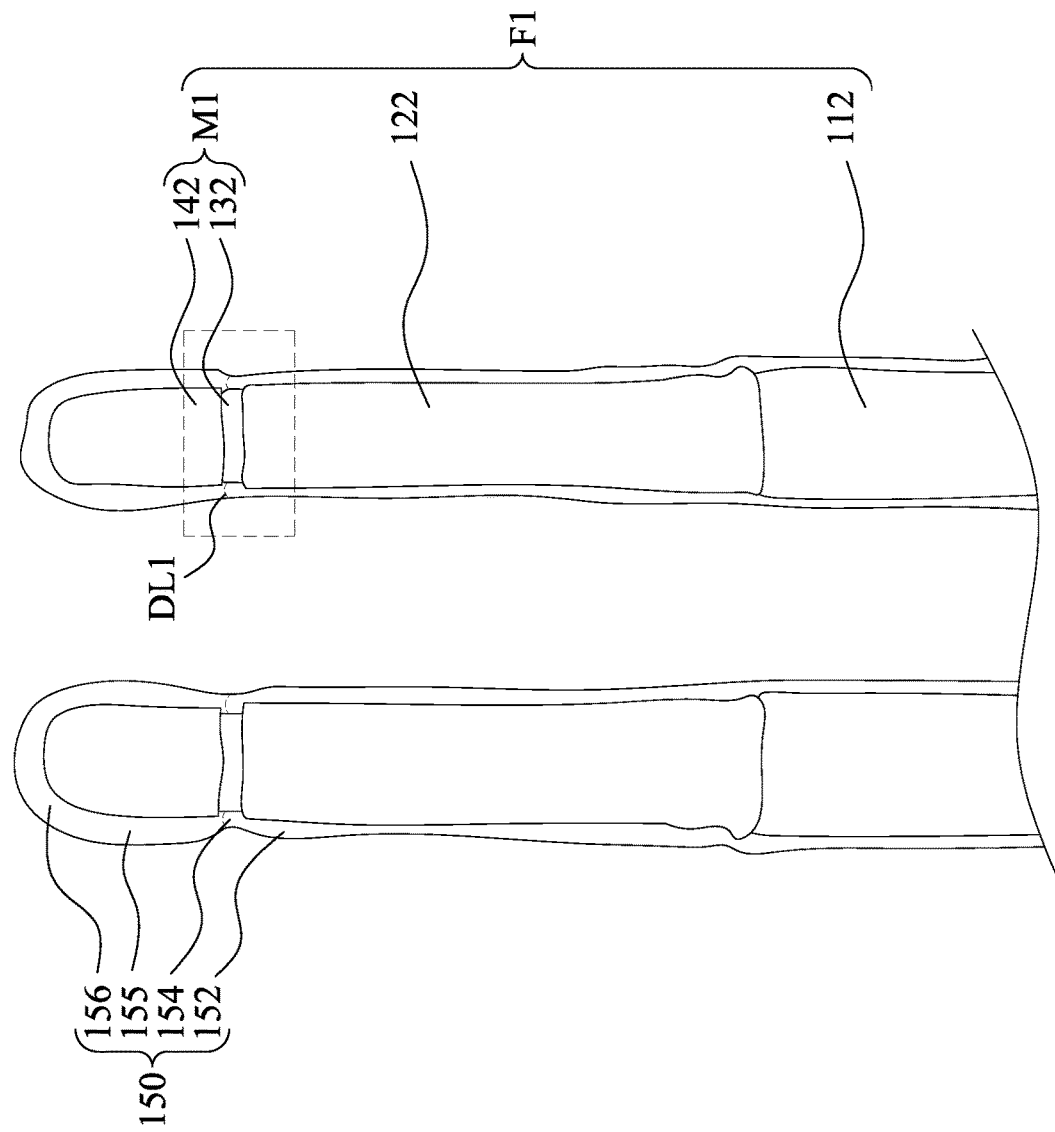
Figure 4C:
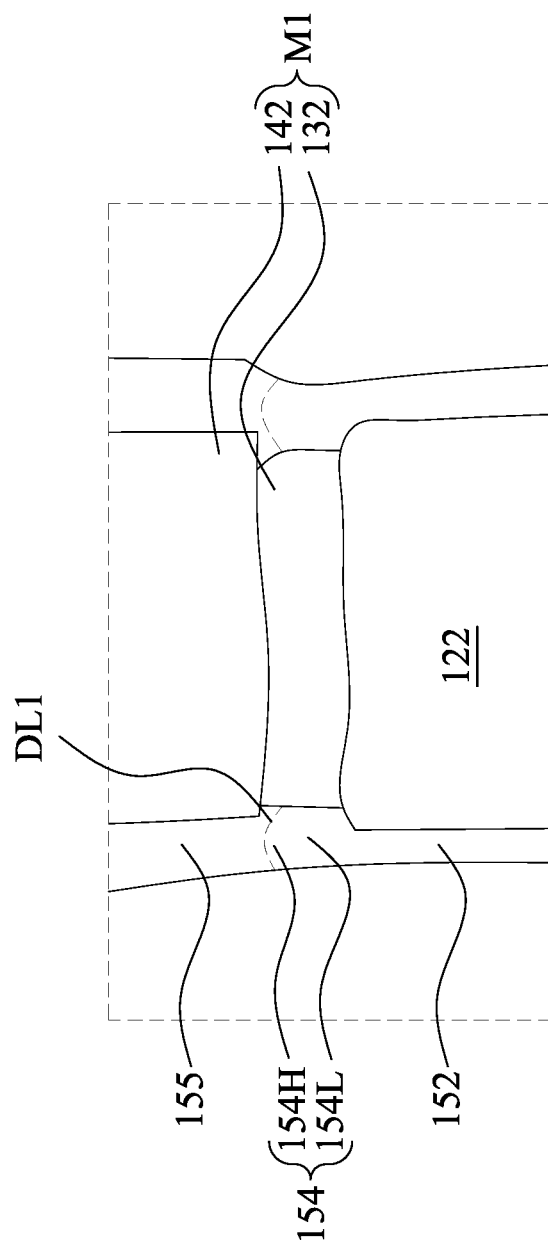

Reference is made to FIGS. 4A-4C. FIG. 4B is a schematic cross-sectional view of FIG. 4B. FIG. 4C is an enlarged correctional view of a portion of the structure of FIG. 4B (as indicated by dashed line box). A thermal treatment is performed to convert a portion of amorphous silicon in the capping layer 150, which is adjacent to the boundary indicated by dashed line DL1, to crystallized silicon. Through the treatment, the capping layer 150 may effectively protect the epitaxial portion 122 near the mask M1 from the undesirable oxidation by the capping layer 150.

In some embodiments, the thermal treatment induces the crystallization in the capping layer 150 (referring to FIGS. 3A and 3B), such that parts of the portion 154 (referring to FIGS. 3A and 3B) adjacent to the portion 152 and the epitaxial portion 122 is densified and converted into crystalline. As a result, more crystallized silicon on sidewalls of the mask M1 can be observed, for example, by High-Resolution Transmission Electron Microscopy (HR-TEM). In some embodiments, after the thermal treatment, the capping layer 150 includes portions 152 and 154 in crystalline phase, and portions 155 and 156 in amorphous phase. In some embodiments, the dashed line DL1, which indicates a boundary between the crystalline phase and the amorphous phase in the capping layer 150, gets higher after the thermal treatment. Therefore, a distance between the epitaxial portion 122 and the amorphous portions (e.g., portions 155 and 156 is increased by the thermal treatment, such that a top part of the epitaxial portion 122 near the amorphous portion of the capping layer may be more effectively protected by the capping layer 150 from the undesirable oxidation.

Furthermore, the thermal treatment also results in strain re-balance between the SiGe epitaxial portion 122 and the Si capping layer 150 (which has a smaller lattice constant than SiGe), such that the lattice constant of the SiGe epitaxial portion 122 is reduced due to the presence of the Si capping layer 150 after the thermal treatment. The SiGe epitaxial portion 122 with the reduced lattice constant has an oxidation rate lower than the oxidation rate of the SiGe prior to the thermal treatment. For example, a lattice constant of the SiGe epitaxial portion 122 in FIGS. 4A and 4B is less than a lattice constant of the SiGe epitaxial portion 122 in FIGS. 3A and 3B, and further less than a lattice constant of the SiGe epitaxial portion 122 in FIG. 2. As such, the SiGe epitaxial portion 122 becomes more resistant to oxidation after the thermal treatment.

In some embodiments, the thermal treatment heating a material past its recrystallization temperature, and then the material is cooled to room temperature or left to cool at room temperature. For example, the thermal treatment may be performed in a temperature range from about 650° C. to about 950° C. If the temperature is lower than about 650° C., the thermal treatment may not induce crystallization in the amorphous portion of the capping layer 150. If the temperature is greater than about 950° C., the thermal treatment may induce unwanted dopant diffusion of implanted regions (e.g., well regions). The thermal treatment may be performed in a nitrogen atmosphere with the oxygen partial pressure ($pO_2$) in the chamber is in a range from about 0.005 torr to about 760 torr. If the oxygen partial pressure ($pO_2$) in the chamber is greater than 760 torr, the thermal treatment may result in oxidation of the Si capping layer 150. If the oxygen partial pressure ($pO_2$) in the chamber is less than about 0.005 torr, the thermal treatment may make the amorphous portion in the Si capping layer 150 too flowable and get solidified and undesirably reshaped (e.g., having round shapes) due to the effects of defects. In some embodiments, the thermal treatment may be referred to as nitrogen annealing using an annealing furnace during the heating and cooling process.

The thermal treatment may be performed in soak or spike anneal means. For the soak anneal means, a temperature of the semiconductor structure is elevated to a determined value in the range from about 650° C. to about 950° C., and kept at the value for a determined time range, for example, from about 30 seconds to about 5 minutes, and then decrease. For the spike anneal means, a temperature of the semiconductor structure is elevated to a determined value in the range from about 650° C. to about 950° C., and then decrease. That is, the spike anneal means does not hold the semiconductor structure at the determined high temperature for a time range.

In some embodiments, the thickness of the capping layer 150 may be reduced by the crystallization induced by the thermal treatment. For example, thickness of the portions 152 and 154 are reduced. In some embodiments, the thickness of the lower part 154L and the higher part 154H of the portion 154 and portion 152 is less than the amorphous portions 155 and 156. In some embodiments, being converted from an amorphous portion, the higher part 154H of the portion 154 may have a thickness greater than the thickness of the lower part 154L of the portion 154 and portion 152.

Figure 5:
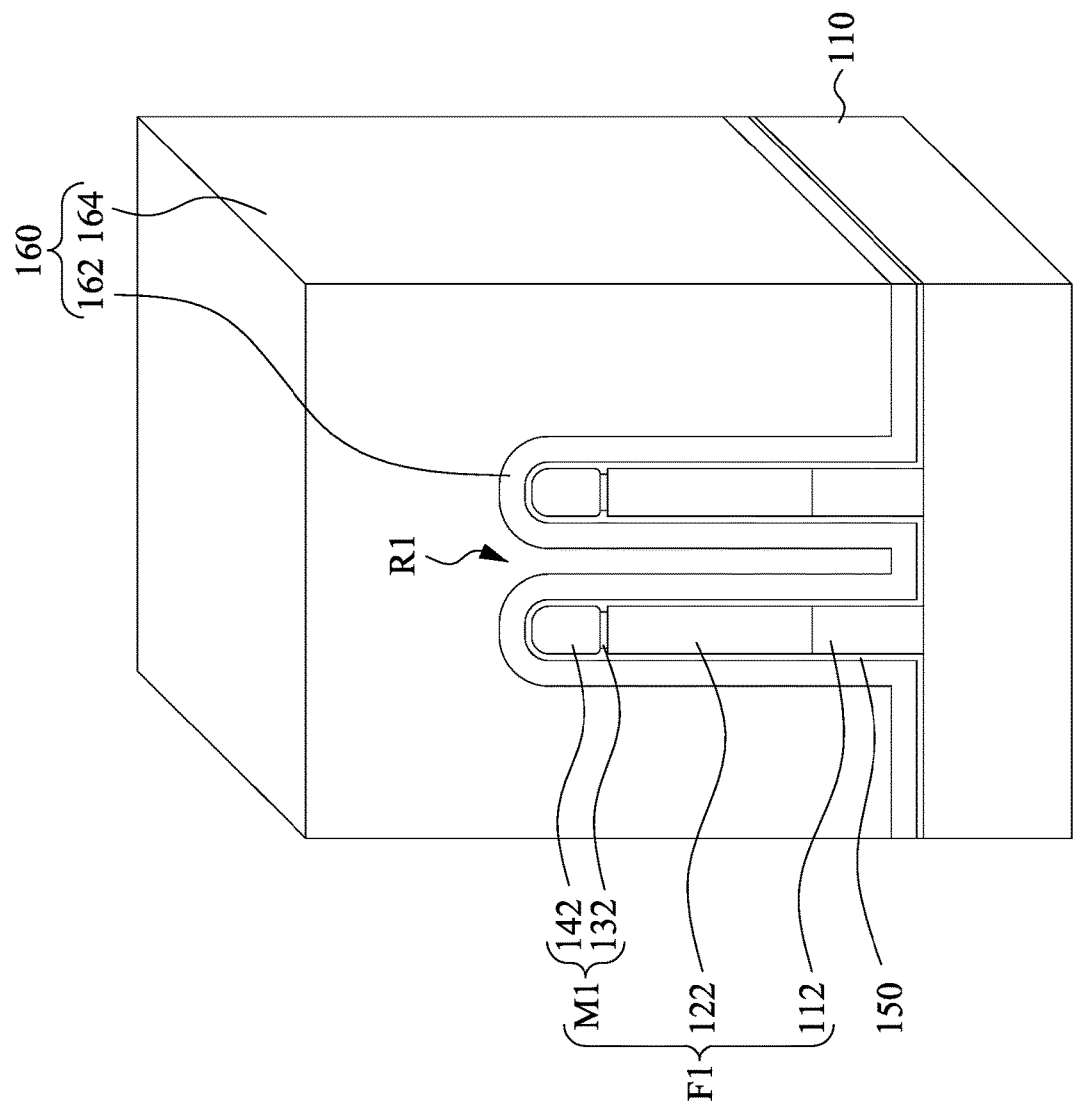

FIG. 5 illustrates the formation a dielectric material 160 in the recesses R1. The dielectric material 160 may include a dielectric liner 162 and a filling dielectric material 164 over the dielectric liner 162. In some embodiments, a conformal deposition method is used to deposit a conformal dielectric liner 162 on the exposed surfaces of the structure shown in FIGS. 4A and 4B. For example, the dielectric liner 162 may be formed using ALD or CVD. Next, the remaining portions of recesses R1 are overfilled with a dielectric material 164. The dielectric material 164 may be formed using Flowable Chemical Vapor Deposition (FCVD), spin-on coating, or the like. In accordance with some embodiments in which FCVD is used, a silicon-and nitrogen-containing precursor (for example, trisilylamine (TSA) or disilylamine (DSA)) is used, and hence the resulting dielectric material is flowable (jelly-like). In accordance with alternative embodiments of the present disclosure, the flowable dielectric material is formed using an alkylamino silane based precursor. During the deposition, plasma is turned on to activate the gaseous precursors for forming the flowable oxide. In some embodiments, the conformal dielectric liner 162 may be omitted, and the filling dielectric material 164 may be in contact with the capping layer 150 directly.

Figure 6:
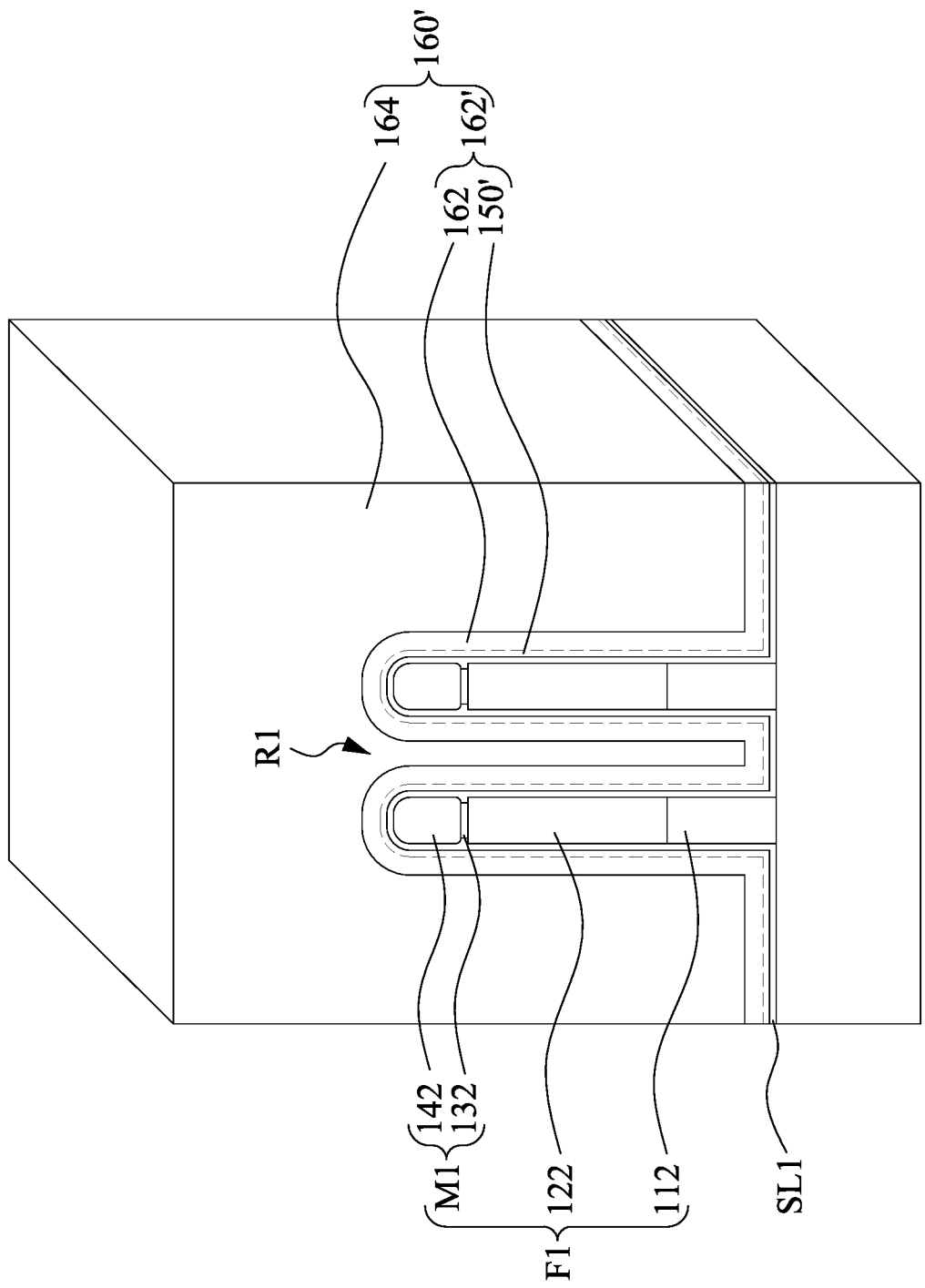

Reference is made to FIG. 6. After the flowable dielectric material 164 is deposited, an oxide annealing process may be performed for removing undesired elements (e.g., impurities such as, hydrogen and compounds of nitrogen and hydrogen) in the dielectric material 160. The oxide annealing process may increase the oxygen content of the as-deposited flowable dielectric material 164. The oxide annealing process may include introducing wet steam, such as $H_2O$, $O_2$, or the like. In some embodiments, the oxide annealing process is in-situ performed in the process chamber for depositing the flowable dielectric material 164. In some embodiments, the oxide annealing process is performed in a different chamber (or ex-situ). Afterwards, a dry anneal process may be performed in an ambient atmosphere comprising inert gas (e.g., nitrogen ($N_2$)) for curing and solidifying the dielectric material 160.

In some cases, in the absence of the capping layer 150, the oxide annealing process is likely to cause the oxidation of the epitaxial portions 122. In some further cases with the presence of the capping layer 150, if a distance between the amorphous portion of the capping layer 150 and the epitaxial portions 122 is too short, the capping layer 150 may not effectively stop the invasion of oxide, and the oxide annealing process may still cause the oxidation of the epitaxial portions 122.

In the present embodiments, the capping layer 150 is formed around the epitaxial portions 122, and the distance between the amorphous portion of the capping layer 150 and the epitaxial portions 122 is increased by the thermal treatment (referring FIG. 5), thereby keeping the epitaxial portions 122 from being oxidized during the oxide annealing process.

Through the oxide annealing process, the capping layer 150 (referring to FIG. 5) may be oxidized into a semiconductor-containing oxide layer 150', such as silicon oxide layer. In some embodiments, the semiconductor-containing oxide layer 150' may also be referred to as a dielectric liner. For example, the semiconductor-containing oxide layer 150' and the dielectric liner 162 may in combination referred to as a dielectric liner 162'. A combination of the filling dielectric material 164 and the dielectric liner 162' may be referred to as dielectric material 160'. In some embodiments, a remaining portion of the capping layer 150 (referring to FIG. 5) may form a Si residue layer SL1 between the semiconductor-containing oxide layer 150' and the semiconductor fins F1 after the annealing process. The Si residue layer SL1 may be oxidized and removed in a later process.

Figure 7:
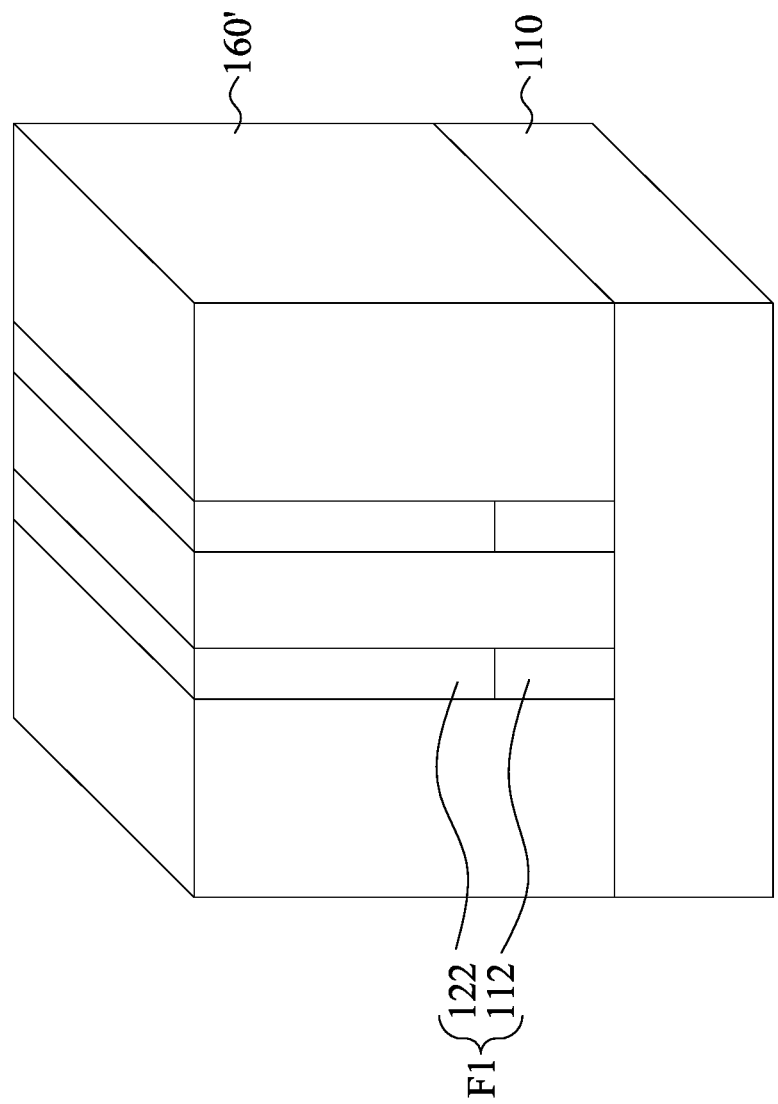

Reference is made to FIG. 7. Next, a planarization process, such as chemical mechanical polish (CMP) process, is performed on the dielectric material 160'. The planarization process may remove the masks M1. Tops of the epitaxial portions 122 may be exposed after the planarization process.

Figure 8:
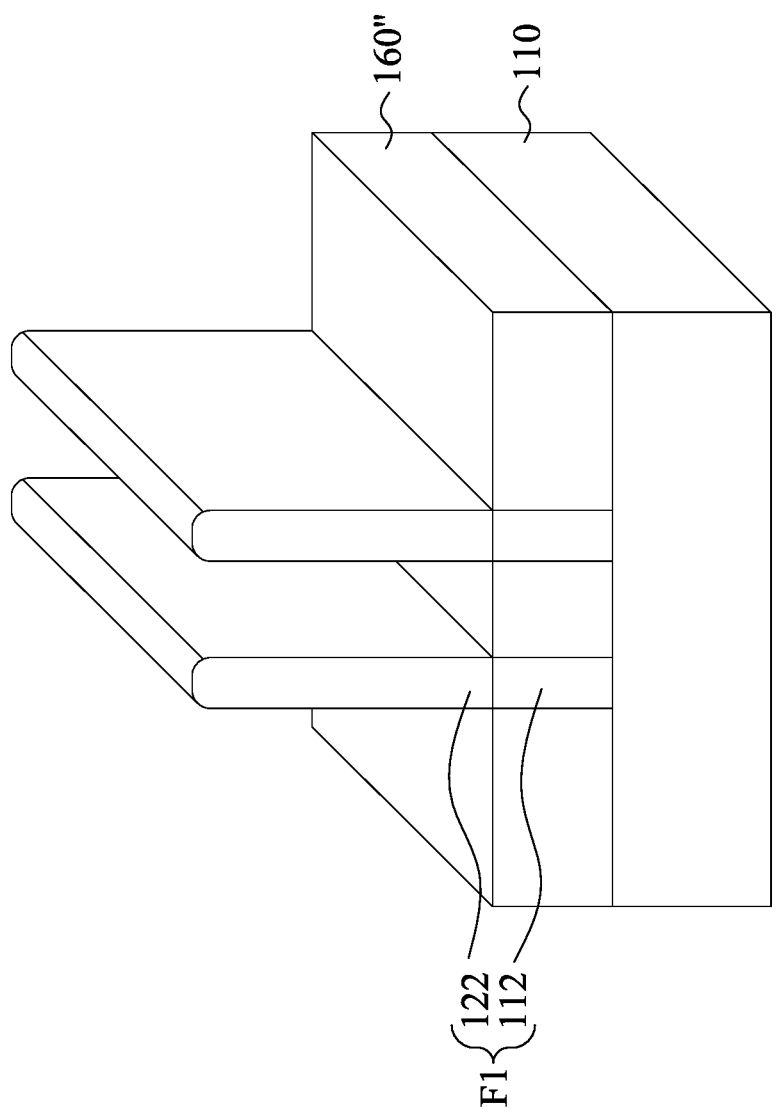

Reference is made to FIG. 8. Subsequently, the dielectric material 160' are recessed by suitable etching process. The remaining portions of the dielectric material 160' are referred to as the STI structures 160". In some embodiments, the recessing is performed such that the recessed STI structures 160" have their top surfaces lower than the top surfaces of the epitaxial portions 122 and higher than bottom surfaces of the epitaxial portions 122, so that the sidewalls of the epitaxial portions 122 have at least partially exposed. In accordance with alternative embodiments of the present disclosure, the recessed STI structures 160" have their top surfaces level with, higher than, or lower than the bottom surfaces of the epitaxial portions 122.

In some embodiments, one or more cleaning processes may be performed during or after the planarization process (referring to FIG. 7) and/or the recessing process (referring to FIG. 8). In some embodiments where the Si residue layer SL1 (referring to FIG. 6) is between the semiconductor-containing oxide layer 150' and the semiconductor fins F1, the cleaning processes may convert the Si residue layer SL1 into silicon oxide layer serving as a portion of the STI structures 160" (e.g., a portion of the dielectric liner 162'). As a result, there may be no Si residue layer SL1 (referring to FIG. 6) after the recessing process (referring to FIG. 8).

Figure 9A:
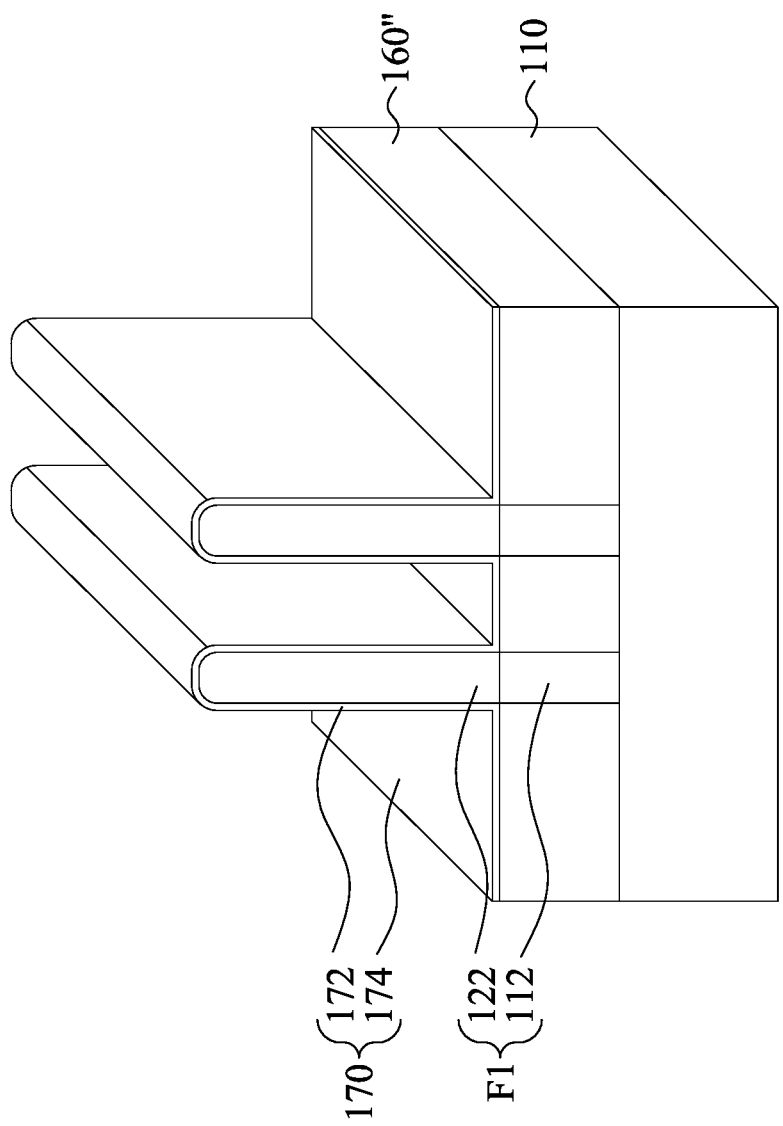
Figure 9B:
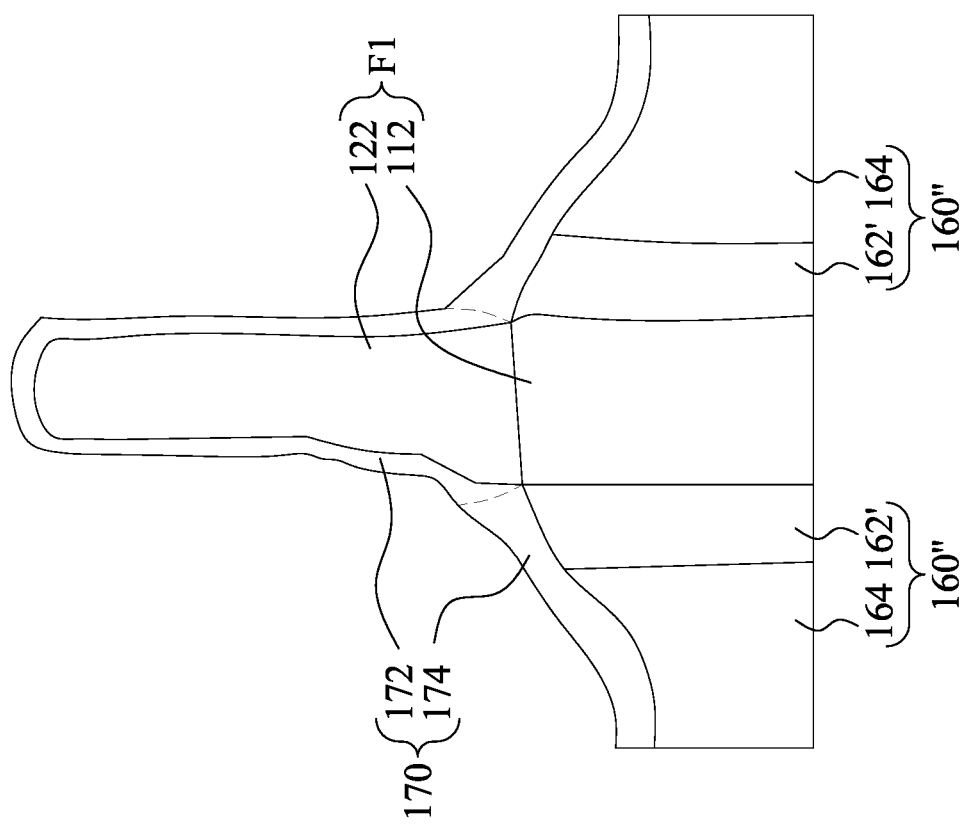

Reference is made to FIGS. 9A and 9B. FIG. 9B is an enlarged cross-sectional view of the structure of FIG. 9A. A capping layer 170 is conformally formed over the structure of FIG. 8, thereby mask the exposed sidewalls and top surfaces of the epitaxial portions 122 from oxidation. The capping layer 170 is used for protect the underlying epitaxial portion 122 from being oxidized in subsequent processes. The capping layer 170 may include silicon, and is free from germanium in some embodiments. Furthermore, the capping layer 170 may be free from oxygen and nitrogen, and hence does not include silicon oxide and silicon nitride. The formation of the capping layer 170 may be performed using a conformal deposition method such as Atomic Layer Deposition (ALD) or Chemical Vapor Deposition (CVD).

In some embodiments, the capping layer 170 may have a thickness in a range from about 0.5 nanometer to 3 nanometers. If the thickness of the capping layer 170 is greater than about 3 nanometers, the critical dimension (CD) between the fins F1 may be unnecessarily increased. If the thickness of the capping layer 150 is less than about 0.5 nanometer, the capping layer 170 may be easily oxidized, and therefore may not protect the SiGe layer from oxidation. In some embodiments, the capping layer 150 may also be referred to as a protection layer.

The deposition of the capping layer 170 may be achieved through an epitaxy process, so that at least a part of the capping layer 170 is a crystalline layer, such as a polysilicon layer. In some cases, due to the presence of the STI structures 160", portions of the capping layer 170 over top surfaces of the STI structures 160" may be amorphous. For example, a dashed line DL2 in the figure indicate a boundary between crystalline phase and the amorphous phase in the capping layer 170. In some embodiments, the portion 172 of capping layer 170 is formed on sidewalls and top surfaces of the epitaxial portion 122, and therefore is crystalline. In some embodiments, the portion 174 of capping layer 170 is formed on top surfaces of the STI structures 160", and therefore is almost amorphous. In some embodiments, the capping layer 150 may include a transition region (near the dashed line DL2) from crystalline to amorphous between the portions 172 and 174.

In some embodiments, since the amorphous Si has a less dense structure than crystal Si, the amorphous Si has an oxidation rate higher than an oxidation rate of crystal Si. Therefore, a bottom part of the epitaxial portion 122 near the portion 174 of the capping layer 170 may not be effectively protected by the capping layer 170 from the undesirable oxidation in subsequent process.

In some embodiments, since the amorphous Si has a less dense structure than crystal Si, the deposition may be performed such that a thickness of the amorphous Si is greater than a thickness of the crystal Si. For example, the thickness of the portion 174 of the capping layer 170 is greater than the thickness of the portion 172 of the capping layer 170.

Figure 10A:
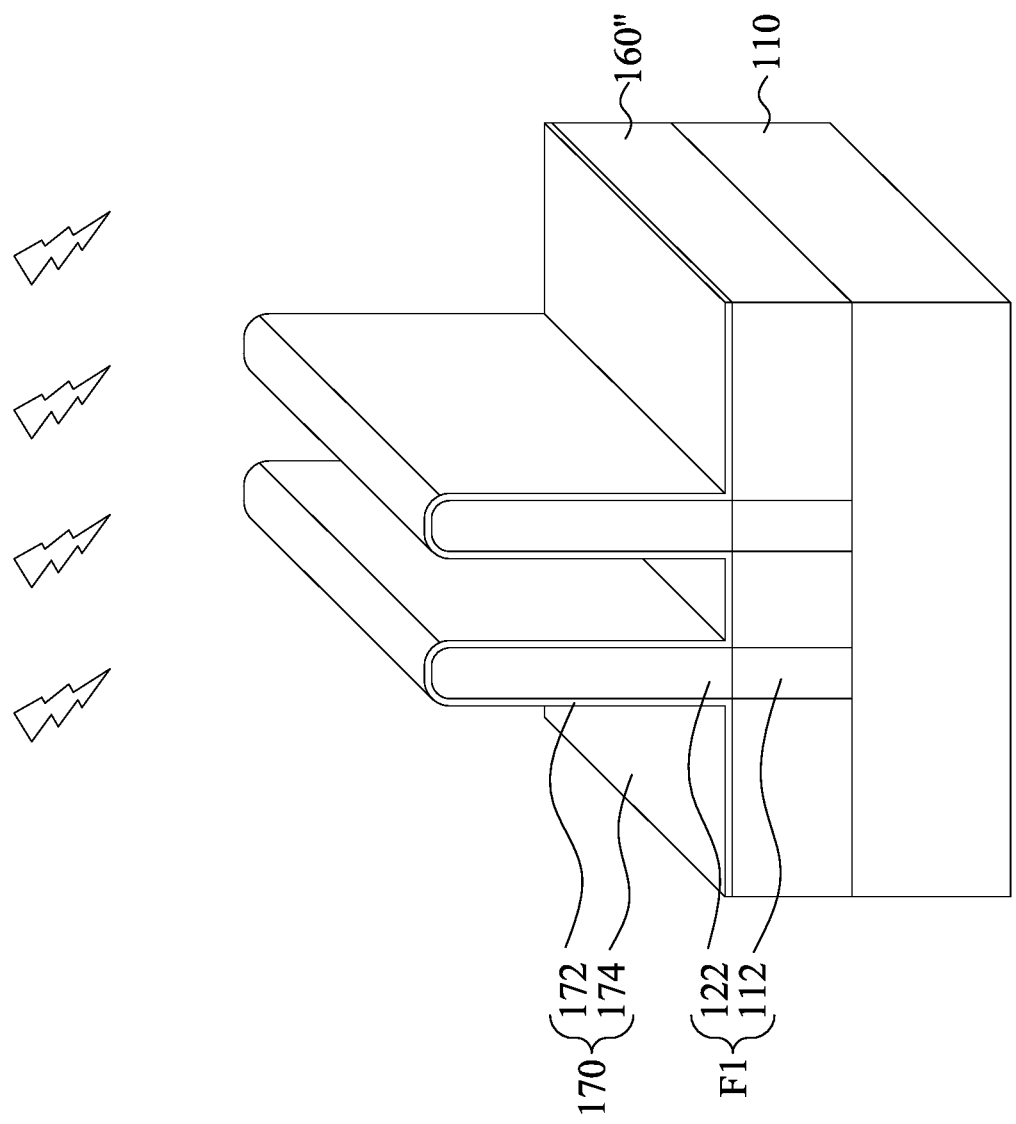
Figure 10B:
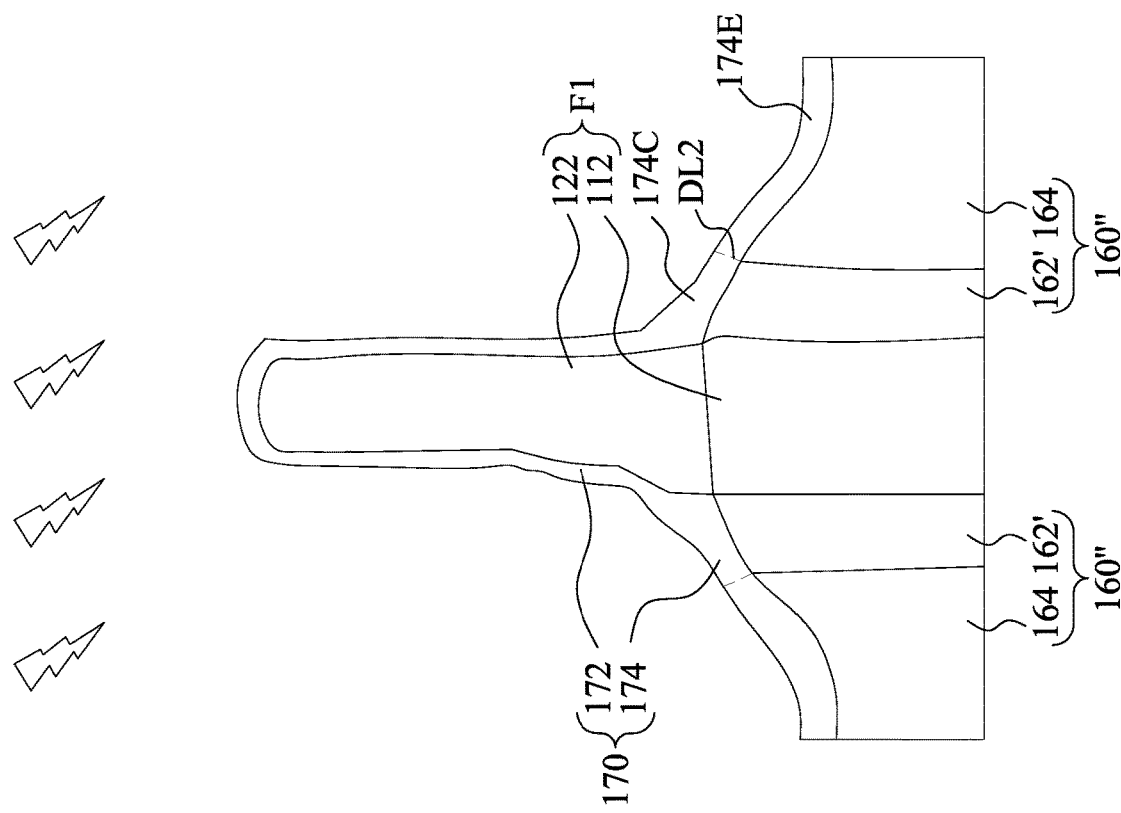

Reference is made to FIGS. 10A and 10B. FIG. 10B is an enlarged cross-sectional view of the structure of FIG. 10A. A thermal treatment is performed to convert amorphous silicon to crystallized silicon at the transition region in the capping layer 170, thereby effectively protecting the epitaxial portion 122 at bottom from the undesirable oxidation by the capping layer 170.

In some embodiments, the thermal treatment is performed to induce the crystallization in the portion 174 (referring to FIGS. 9A and 9B), such that the part 174C of the portion 174 adjacent to the portion 172 and the epitaxial portion 122 is densified and converted into crystalline. For example, a part of the portion 174 (referring to FIGS. 9A and 9B) over a top surface of the dielectric liner 162 and/or 150' turns into crystal phase.

After the thermal treatment, the capping layer 170 includes the parts 174C of the portion 174 and the portion 172 in crystalline phase, and parts 174E of the portion 174 away from the epitaxial portion 122 in amorphous phase. For example, the dashed line DL2, which indicates a boundary between the crystalline phase and the amorphous phase in the capping layer 170, gets shifted after the thermal treatment. Therefore, a distance between the epitaxial portion 122 and the amorphous portion of the capping layer 170 is increased by the thermal treatment, such that a bottom part of the epitaxial portion 122 near the amorphous portion of the capping layer 170 may be more effectively protected by the capping layer 170 from the undesirable oxidation.

Furthermore, the thermal treatment also results in strain re-balance between the SiGe epitaxial portion 122 and the Si capping layer 170 (which has a smaller lattice constant than SiGe), such that the lattice constant of the SiGe epitaxial portion 122 is reduced due to the presence of the Si capping layer 170 after the thermal treatment. The SiGe epitaxial portion 122 with the reduced lattice constant has an oxidation rate lower than the oxidation rate of the SiGe prior to the thermal treatment. For example, a lattice constant of the SiGe epitaxial portion 122 in FIGS. 10A and 10B is less than a lattice constant of the SiGe epitaxial portion 122 in FIGS. 9A and 9B, and further less than a lattice constant of the SiGe epitaxial portion 122 in FIG. 8. As such, the SiGe epitaxial portion 122 becomes more resistant to oxidation after the thermal treatment.

In some embodiments, the thermal treatment may be performed in a temperature range from about 650° C. to about 950° C. If the temperature is lower than about 650° C., the thermal treatment may not induce crystallization of the amorphous portion of the capping layer 170. If the temperature is greater than about 950° C., the thermal treatment may induce unwanted dopant diffusion of implanted regions (e.g., well regions). The thermal treatment may be performed with the oxygen partial pressure (pO$_2$) in the chamber is in a range from about 0.005 torr to about 760 torr. If the oxygen partial pressure (pO$_2$) in the chamber is greater than 760 torr, the thermal treatment may result in oxidation of the Si capping layer 170. If the oxygen partial pressure (pO$_2$) in the chamber is less than about 0.005 torr, the thermal treatment may make the amorphous portion in the Si capping layer 170 too flowable and get solidified and reshaped (e.g., having round shapes) due to the effects of defects.

The thermal treatment may be performed in soak or spike annealing means. For the soak anneal means, a temperature of the semiconductor structure is elevated to a determined value in the range from about 650° C. to about 950° C., and kept (e.g., soaked) at the value for a determined time range, for example, from about 30 seconds to about 5 minutes, and then decrease. For the spike anneal means, a temperature of the semiconductor structure is elevated to a determined value in the range from about 650° C. to about 950° C., and then decrease. That is, the spike anneal means may not hold or soak the semiconductor structure at the determined high temperature for a time range.

In some embodiments, the thickness of the capping layer 170 may be reduced by the crystallization induced by the thermal treatment. For example, thickness of the portion 172 and the part 174C of the portion 174 are reduced. In some embodiments, the thickness of the portion 172 and the part 174C of the portion 174 is less than the amorphous part 174E of the portion 174. In some embodiments, being converted from an amorphous portion, the part 174C of the portion 174 may have a thickness greater than the thickness of the portion 172.

Figure 11:
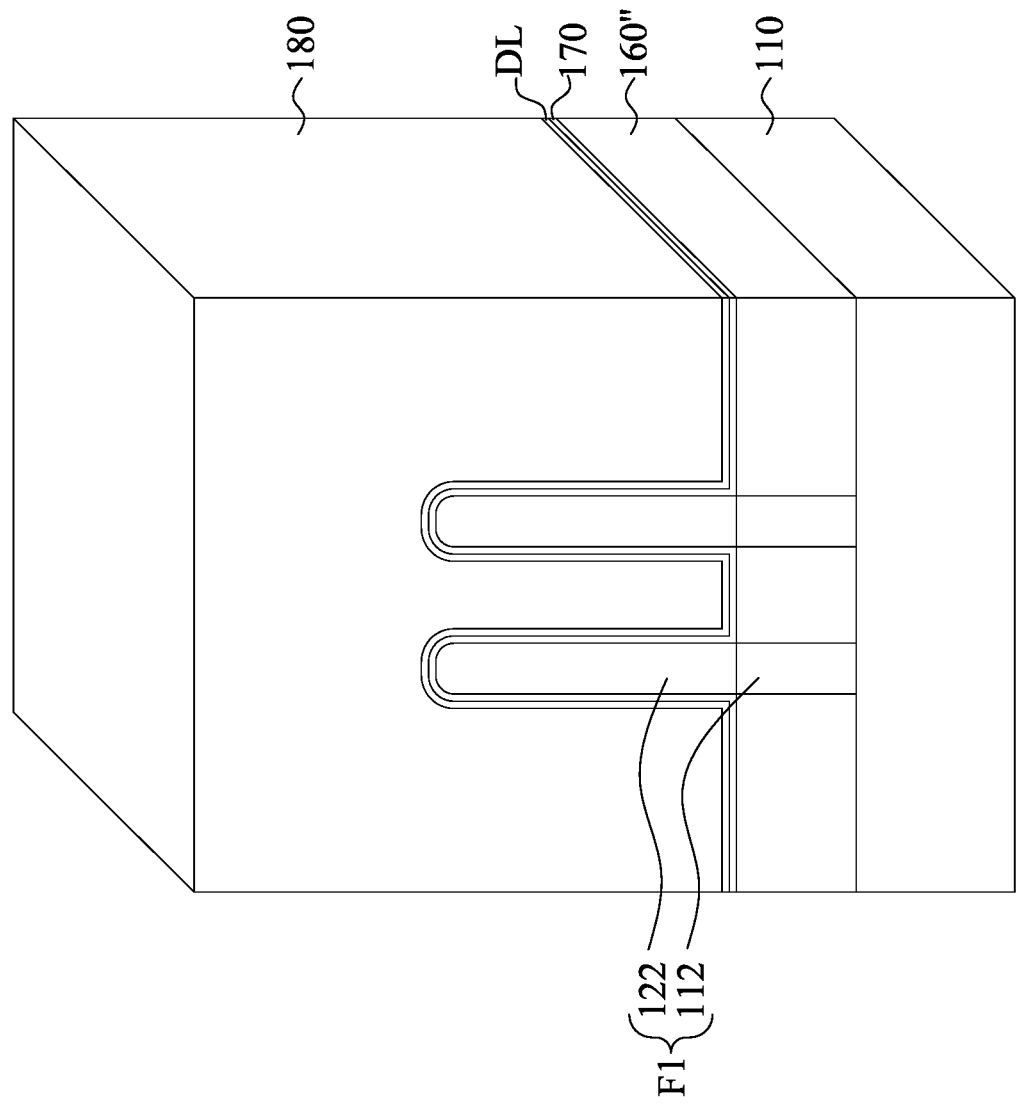

Reference is made to FIG. 11. A dummy gate electrode layer 180 is deposited over the capping layer 170 (referring to FIGS. 10A and 10B). The dummy gate electrode layer 180 may include polysilicon and/or other suitable materials. In some embodiments, the dummy gate electrode layer 180 may include polycrystalline-silicon (poly-Si), poly-crystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

In some embodiments, a dummy gate dielectric layer DL is formed over the capping layer 170 prior to the formation of the dummy gate electrode layer 180. The dummy gate dielectric layer DL may include suitable dielectric materials, such as silicon oxide. In some embodiments, the formation of the dummy gate dielectric layer DL may include a cleaning process, followed by a deposition process. In some embodiments, the cleaning process in the formation of the dummy gate dielectric layer DL may oxidize a portion of the capping layer 170 or the entire capping layer 170. For example, after the formation of the dummy gate dielectric layer DL, the capping layer 170 may be referred to as a semiconductor-containing oxide layer, such as a silicon oxide layer.

Figure 12:
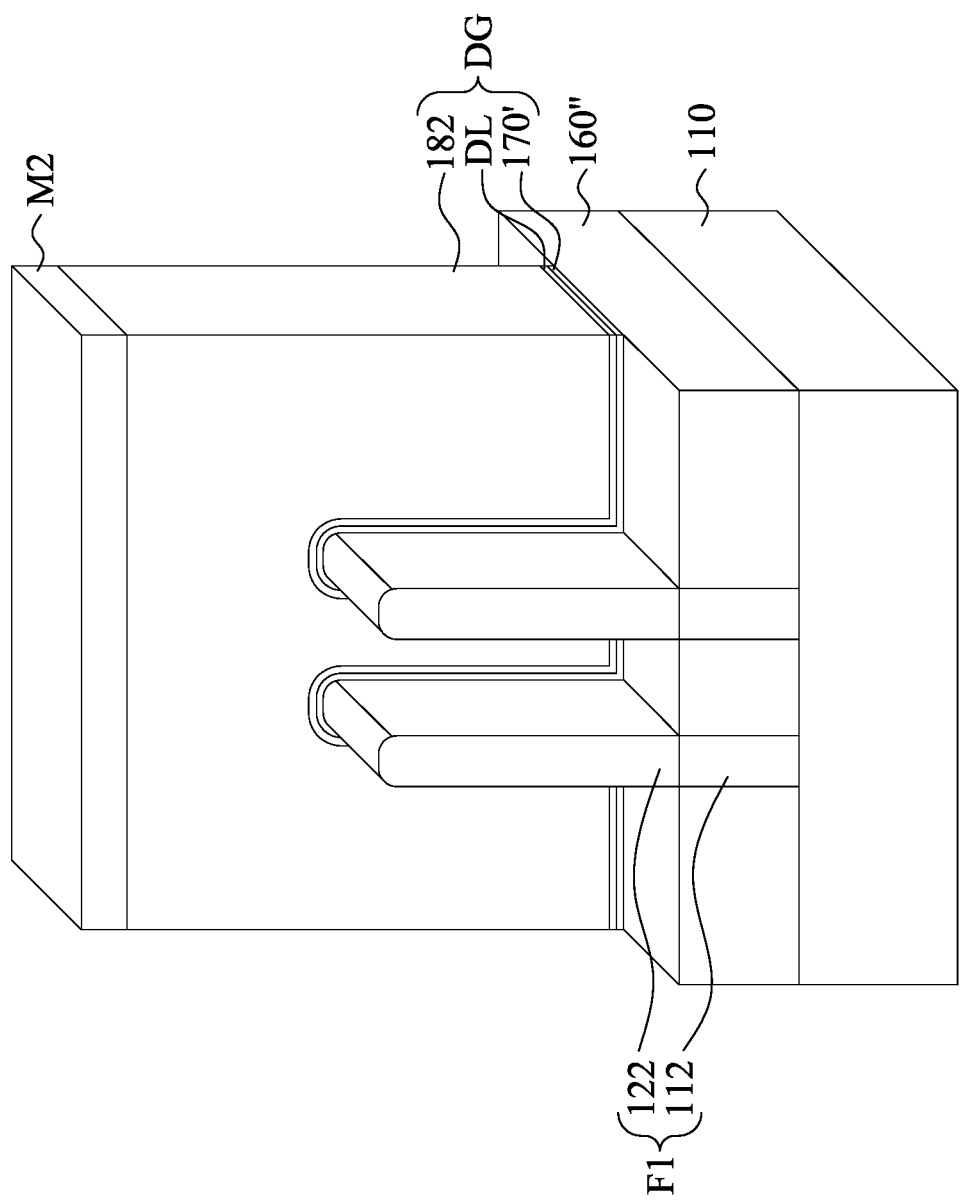

Reference is made to FIG. 12. The dummy gate electrode layer 180, the dummy gate dielectric layer DL, and the capping layer 170 are patterned to form dummy gate structures DG in accordance with some embodiments. For example, a patterned mask M2 is formed over a portion of the dummy gate electrode layer 180, as shown in FIGS. 10A and 10B. The mask M2 may be formed of silicon nitride, silicon carbo-nitride, or the like. The mask M2 may be a hard mask for protecting the underlying dummy gate electrode layer 180, the dummy gate dielectric layer DL, and the capping layer 170 against subsequent etching process. The patterned mask M2 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Plural etching processes are performed to form dummy gate structures DG wrapping the semiconductor fins F1 using the patterned mask M2 as an etching mask, and the patterned mask M2 is removed after the etching. The resulting structure is shown in FIG. 12. Each dummy gate structure DG includes a gate dielectric layer DL and a dummy gate electrode 182 over the gate dielectric layer DL. The dummy gate structure DG may further include a capping layer 170' (patterned from the capping layer 170 in FIG. 11) below the gate dielectric layer DL. The capping layer 170' may be a silicon layer or a silicon oxide layer at this stage, may also referred to as a gate dielectric layer.

It is appreciated that although one dummy gate structure DG is illustrated for clarity, there may be a plurality of dummy gate stacks formed, which are parallel to each other, with the plurality of dummy gate stacks crossing the same semiconductor fin(s) F1. The dummy gate structure DG may cross over a single one or a plurality of protruding fins F1 and/or STI structure 160". The dummy gate structure DG also has a lengthwise direction perpendicular to the lengthwise directions of semiconductor fins F1. The dummy gate structures DG will be replaced with a replacement gate structure using a "gate-last" or replacement-gate process.

Figure 13:
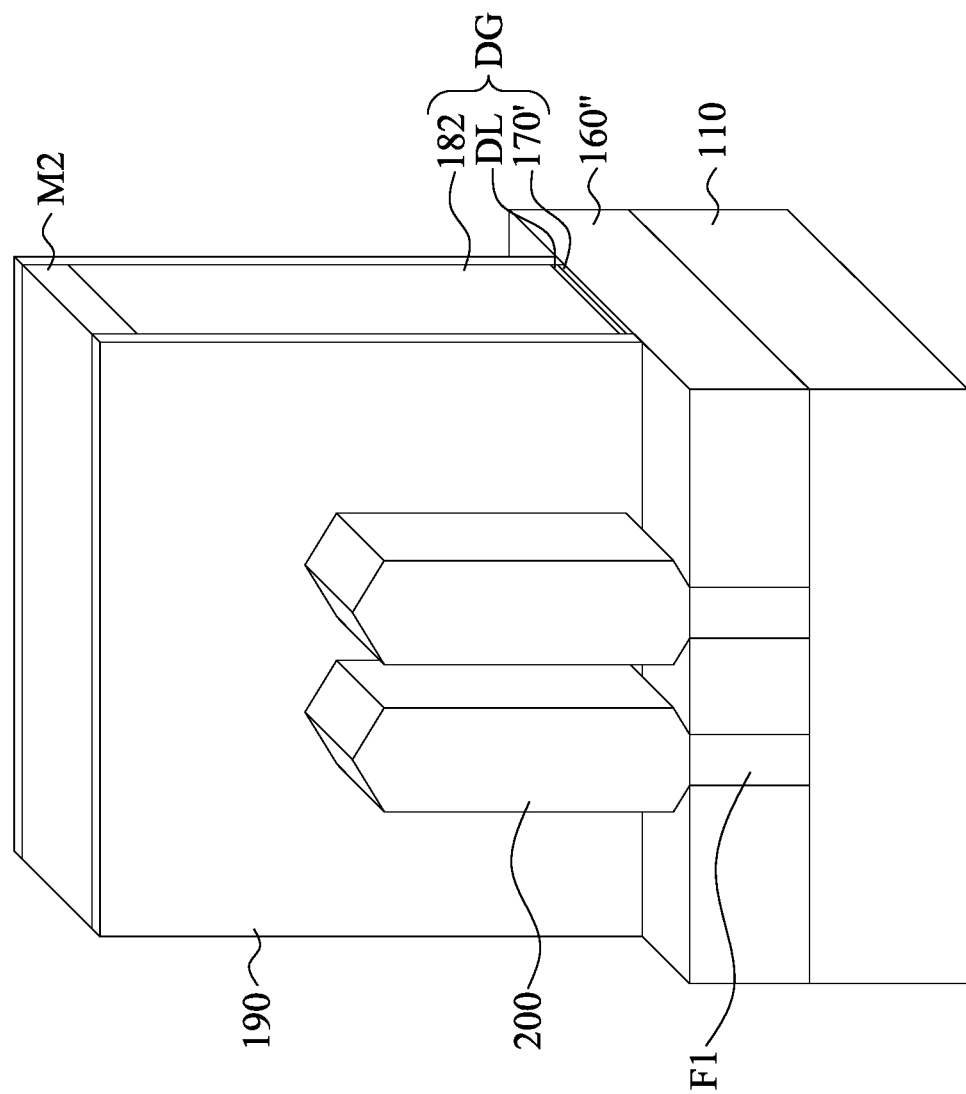

Reference is made to FIG. 13. Gate spacers 190 are respectively formed on opposite sides of the dummy gate structure DG. In some embodiments, a spacer is conformally deposited over the structure of FIG. 12, and then patterned into the gate spacers 190 by suitable anisotropic etching process. The spacer layer may be formed of a dielectric material such as silicon nitride, silicon carbon-oxyitride (SiCN), or the like, and may have a single-layer structure or a multi-layer structure including a plurality of dielectric layers. The formation of the spacer layer may be performed through a conformal deposition method such as ALD or CVD.

Portions of the semiconductor fins F1 uncovered by the mask M2 and the gate spacers 190 are etched, and then epitaxial structures 200 are formed by selectively growing semiconductor materials on the etched portions of the semiconductor fins F1. Depending on whether the resulting FinFET is a p-type FinFET or an n-type FinFET, a p-type or an n-type impurity may be in-situ doped with the proceeding of the epitaxy of the epitaxial structures 200. For example, epitaxial structures 200 in the n-type device may be formed of silicon phosphorous (SiP) or silicon carbon phosphorous (SiCP), and epitaxial structures 200 in the p-type device may be formed of silicon germanium boron (SiGeB).

After the epitaxy step, epitaxial structures 200 and epitaxial portions 122 may be further implanted with an n-type impurity to form source and drain regions for the n-type FinFET. Epitaxy structures 200 and epitaxial portions 122 may also be implanted with a p-type impurity to form source and drain regions for the p-type FinFET. In accordance with alternative embodiments of the present disclosure, the implantation step is skipped when epitaxial structures 200 are in-situ doped with the p-type or n-type impurity during the epitaxy.

Figure 14:
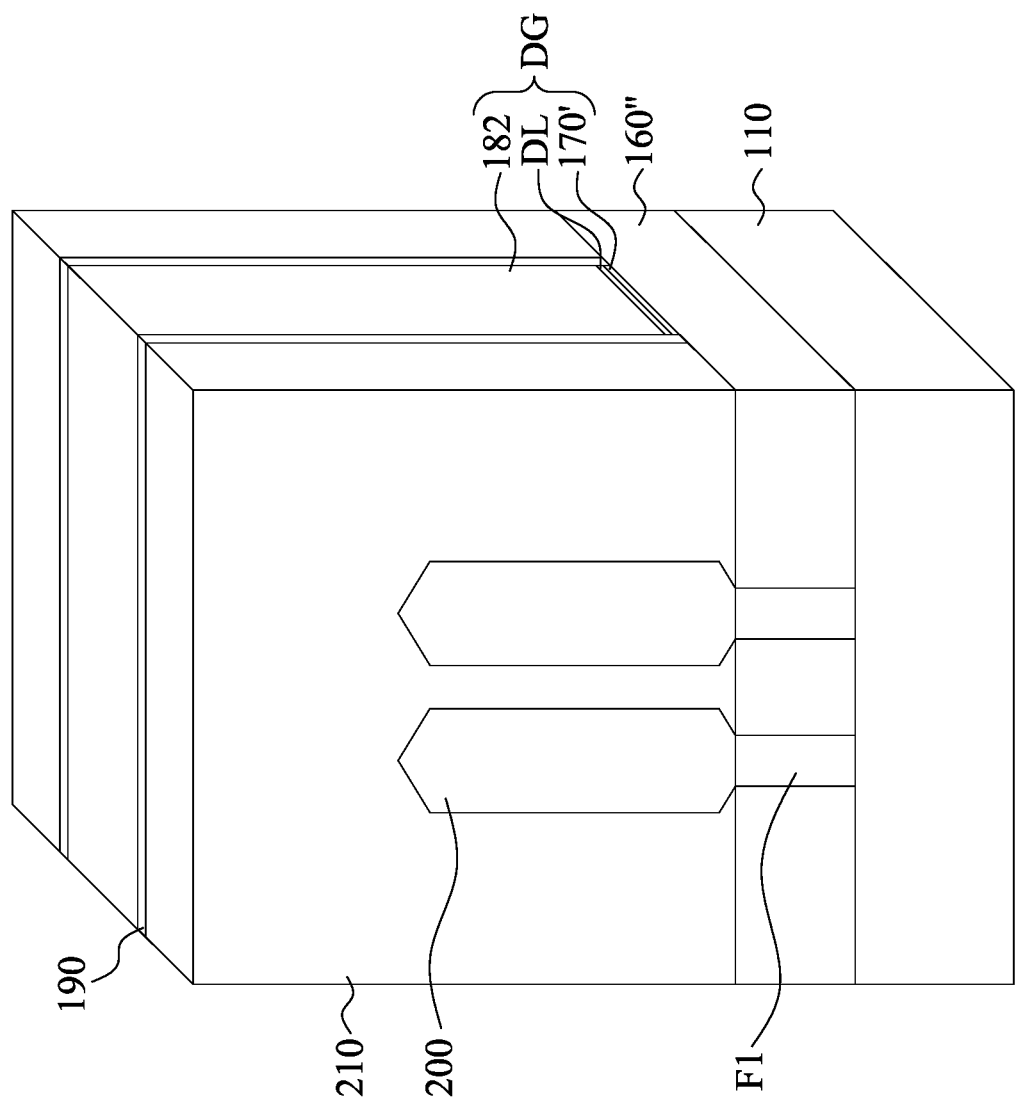

Reference is made to FIG. 14. After the formation of the epitaxial structures 200, an interlayer dielectric (ILD) 210 may be formed over the epitaxial structures 200. The ILD 210 may include a dielectric material formed using, for example, FCVD, spin-on coating, CVD, or other deposition methods. ILD 210 may also be formed of Tetra Ethyl Ortho Silicate (TEOS) oxide, Plasma Enhanced CVD (PECVD) oxide ($SiO_2$), Phospho-Silicate Glass (PSG), Boro-Silicate Glass (BSG), Boron-Doped Phospho-Silicate Glass (BPSG), or the like. Suitable annealing process may be performed to cure the ILD 210.

In some embodiments where the capping layer 170' was not entirely oxidized by the cleaning process in the formation of the gate dielectric layer, the annealing process performed to cure the ILD 210 may also induce oxidation in the capping layer 170'. As a result, the capping layer 170' may be entirely converted into a dielectric layer (e.g., silicon oxide layer) after the formation of the ILD 210.

In some embodiments, prior to the formation of the ILD 210, a contact etch stop layer (CESL) may be formed on the epitaxial structures 200. The CESL may be formed of silicon nitride, silicon carbo-nitride, or the like. The CESL may be formed using a conformal deposition method such as ALD, for example. After the formation of the ILD 210, a planarization process such as CMP may be performed to level the top surfaces of the ILD 210, the dummy gate structure DG, and the gate spacers 190 with each other. The planarization process may remove the hard mask M2, thereby exposing top surfaces of the dummy gate electrode 182.

Figure 15:
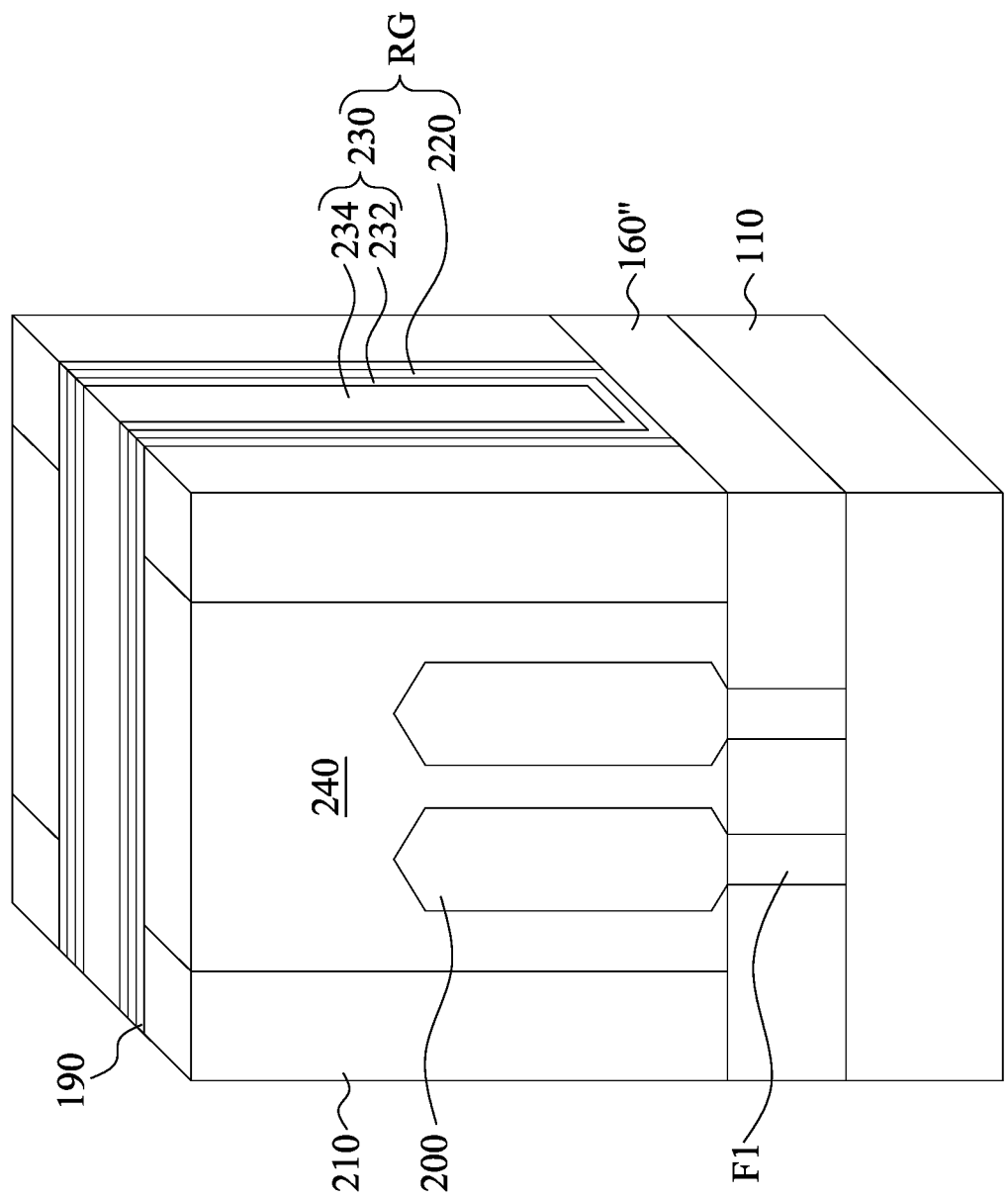

Reference is made to FIG. 15. The dummy gate structure DG is replaced with replacement metal gate structure RG. In some embodiments, the dummy gate structure DG including the capping layer 170', the gate dielectric layer DL, and the dummy gate electrode 182 (referring to FIG. 14) are first removed, resulting a gate trench between the gate spacers 190. Subsequently, a gate dielectric layer 220 and a gate electrode 230 are formed in the gate trench. A planarization process may be performed to remove portions of the gate dielectric layer 220 and the gate electrode 230 out of the gate trench, thereby forming the replacement metal gate structure RG.

The removal of the dummy gate structure DG (referring to FIG. 14) may include plural suitable etching processes. For example, a first etching process is performed to remove the dummy gate electrode 182 (referring to FIG. 14), and a second etching process is performed to remove the capping layer 170' (referring to FIG. 14), which is a silicon oxide layer herein, and the gate dielectric layer DL. The etching process may show etch selectivity between the dummy gate electrode 182 and the gate dielectric layer DL (referring to FIG. 14). The first and second etching processes may be dry etch process that uses different gas etchants.

In some embodiments, the gate dielectric layer 220 includes an interfacial layer (IL, not shown separately) as its lower part. The IL may include an oxide layer such as a silicon oxide layer, which is formed through a chemical oxidation process or a deposition process. The gate dielectric layer 220 may also include a high-k dielectric layer formed over the interfacial layer. The high-k dielectric layer is formed as a conformal layer, and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer in gate dielectric layer 220 is formed using ALD or CVD.

In some embodiments, the gate electrode 230 include a metal layer 232 and a filling metal 234 over the metal layer 232. The metal layer 232 may include a diffusion barrier layer and one (or more) work-function layer over the diffusion barrier layer. The diffusion barrier layer may be formed of titanium nitride (TiN), which may (or may not) be doped with silicon to form TiSiN. The work-function layer determines the work function of the gate, and includes at least one layer, or a plurality of layers formed of different materials. The specific material of the work-function layer is selected according to whether the respective FinFET is an n-type FinFET or a p-type FinFET. For example, for the n-type device, the work-function layer may include a TaN layer and a titanium aluminum (TiAl) layer over the TaN layer. For the p-type device, the work-function layer may include a TaN layer, a TiN layer over the TaN layer, and a TiAl layer over the TiN layer. After the deposition of the work-function layer(s), another barrier layer, which may be another TiN layer, is formed. The filling metal 234 may be formed of tungsten or cobalt, for example.

After the gate replacement process, the ILD 210 is etched to form contact openings. The etching may be performed using, for example, Reactive Ion Etch (RIE). In a subsequent step, source/drain contact plugs 240 are formed in the contact openings. Before forming the contact plugs 240, the portions of CESL exposed to the contact opens are first etched, revealing epitaxial structures 200. Silicide regions (not shown) are then formed on the epitaxial structures 200. In accordance with some embodiments of the present disclosure, the contact plugs 240 include barrier layers and a metal-containing material over the respective barrier layers. In accordance with some embodiments of the present disclosure, the formation of the contact plugs 240 includes forming a blanket barrier layer and a metal-containing material over the blanket barrier layer, and performing a planarization to remove excess portions of the blanket barrier layer and the metal-containing material. The barrier layer may be formed of a metal nitride such as titanium nitride or tantalum nitride. The metal-containing material may be formed of tungsten, cobalt, copper, or the like. Through the process, FinFET is formed.

Figure 16A:
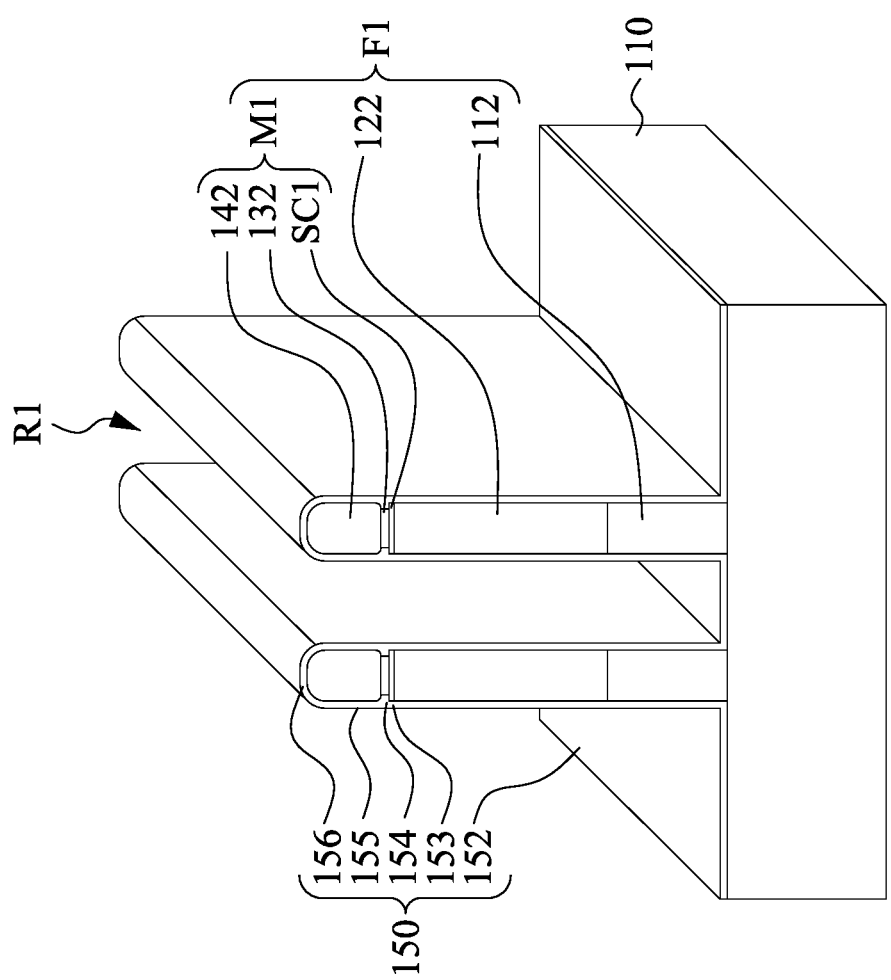
FIGS. 16A through 17 illustrate cross-sectional views and perspective views of intermediate stages in the formation of Fin Field-Effect transistors (FinFETs) in accordance with some embodiments.
Figure 16B:
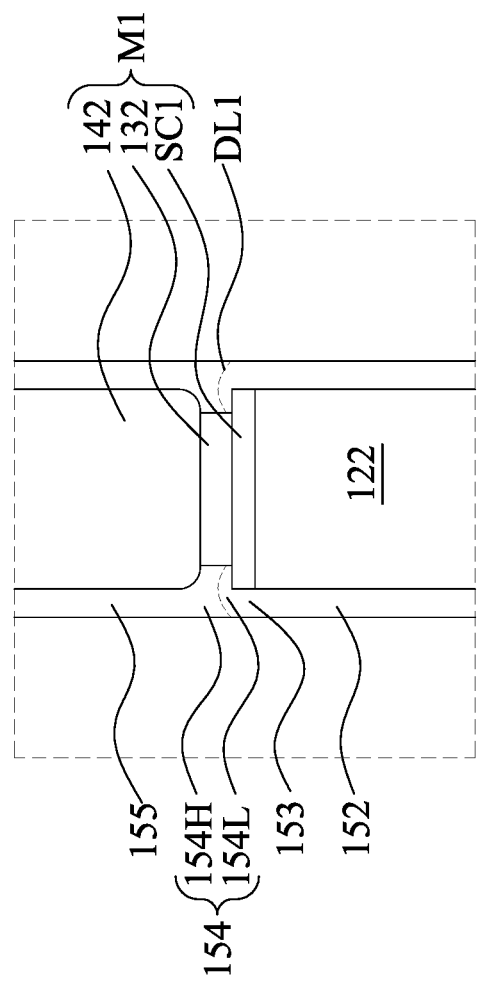
Figure 17:
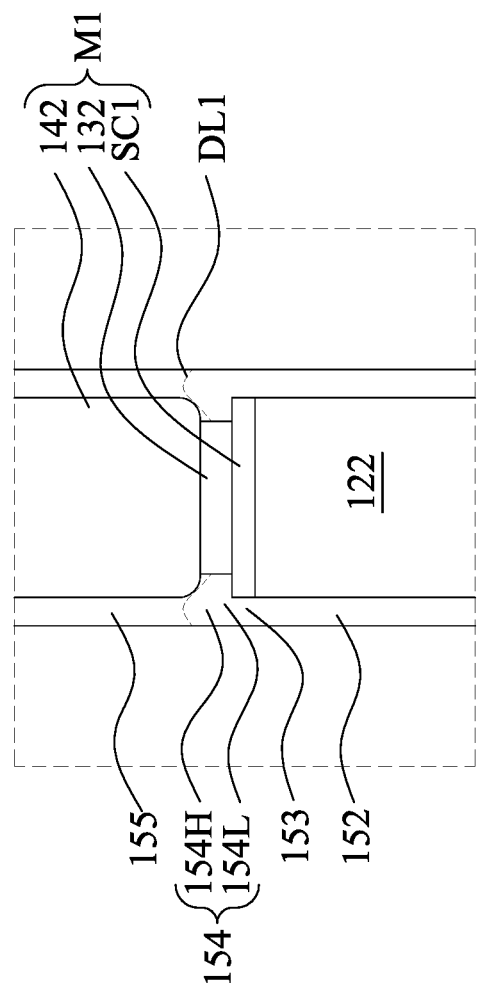

FIGS. 16A through 17 illustrate cross-sectional views and perspective views of intermediate stages in the formation of Fin Field-Effect transistors (FinFETs) in accordance with some embodiments. The illustration is merely exemplary and is not intended to limit beyond what is specifically recited in the claims that follow. The present embodiments may be similar to the embodiments of FIGS. 1-15, except that the mask Ml, which is used as etching mask for forming semiconductor fins, further includes a silicon crystalline layer SC1 below the pad layer 132. For example, in the present embodiments, the operations shown by FIGS. 16A-17 may replace the operations shown by FIGS. 3A-4B. It is understood that additional operations may be provided before, during, and after the operations shown by FIGS. 16A-17, and some of the operations described below can be replaced or eliminated for additional embodiments of the method. The order of the operations/processes may be interchangeable.

Reference is made to FIGS. 16A and 16B. FIG. 16B is an enlarged correctional view of the structure of FIG. 16A. In the present embodiments, the masks M1 includes a silicon crystalline layer SC1, a pad layer 132 over the silicon crystalline layer SC1, and a hard mask layer 142 over the pad layer 132. In some embodiments, the capping layer 150 is conformally formed over the mask M1 and the epitaxial portion 122.

The deposition of the capping layer 150 may be achieved through an epitaxy process, so that at least a part of the capping layer 150 is a crystalline layer, such as a polysilicon layer. For example, portions 152 of the capping layer 150 over sidewalls of the epitaxial portion 122 and the substrate portion 112 and the top surface of the substrate 110 may be crystalline. In some cases, due to the presence of the masks M1, portions of the capping layer 150 over top surfaces and sidewalls of the masks M1 may be amorphous. For example, a dashed line DL1 in the figure indicates a boundary between the crystalline phase and the amorphous phase in the capping layer 150. For clear illustration, herein, portions of the capping layer 150 over the sidewalls of the layers SC1 are referred to as the portions 153, portions of the capping layer 150 over the sidewalls of the layers 132 are referred to as the portions 154, portions of the capping layer 150 over the sidewalls of the layers 142 are referred to as the portions 155, and portions of the capping layer 150 over the top surface of the layers 142 are referred to as the portions 156. In some embodiments, through the epitaxial growth, while the portion 155 and 156 are amorphous, the portion 153 may be crystalline, and the portion 154 may be partially amorphous and partially crystalline. For example, a lower part 154L of the portion 154 adjacent to the epitaxial portion 122 may be crystalline, and a higher part 154H of the portion 154 away from the epitaxial portion 122 may be amorphous. In some embodiments, the capping layer 150 may include a transition region (e.g., the portion 154) from crystalline to amorphous, and the transition region is near the dashed line DL1.

In some embodiments, since the amorphous Si has a less dense structure than crystal Si, the amorphous Si has an oxidation rate higher than an oxidation rate of crystal Si. In some cases, a distance between the epitaxial portion 122 and the amorphous portions (e.g., the part 154H of the portion 154 and portions 155 and 156) is so short, such that a top part of the epitaxial portion 122 near the amorphous portion of the capping layer 150, may not be effectively protected by the capping layer 150 from the undesirable oxidation in some later processes.

Reference is made to FIG. 17. A thermal treatment is performed to convert amorphous silicon to crystallized silicon at the transition region (e.g., the portion 154) in the capping layer 150, thereby effectively protecting the epitaxial portion 122 near the mask M1 from the undesirable oxidation by the capping layer 150 in later processes.

In some embodiments, the thermal treatment induces the crystallization in the capping layer 150 (referring to FIGS. 16A and 16B), such that parts of the amorphous portion adjacent to the silicon crystalline layer SC1 and the epitaxial portion 122 is densified and converted into crystalline. As a result, more crystallized silicon on sidewalls of the mask M1 can be observed, for example, by HR-TEM. In some embodiments, after the thermal treatment, the capping layer 150 includes portions 152, 153, and 154 in crystalline phase, and portions 155 and 156 in amorphous phase. In some embodiments, the dashed line DL1, which indicates a boundary between the crystalline phase and the amorphous phase in the capping layer 150, gets higher after the thermal treatment. Therefore, a distance between the epitaxial portion 122 and the amorphous portions (e.g., portions 155 and 156) of the capping layer 150 is increased by the thermal treatment, such that a top part of the epitaxial portion 122 near the amorphous portion of the capping layer 150 may be more effectively protected by the capping layer 150 from the undesirable oxidation in later processes.

Furthermore, the thermal treatment also results in strain re-balance between the SiGe epitaxial portion 122 and the Si capping layer 150 (which has a smaller lattice constant than SiGe), such that the lattice constant of the SiGe epitaxial portion 122 is reduced due to the presence of the Si capping layer 150 after the thermal treatment. The SiGe epitaxial portion 122 with the reduced lattice constant has an oxidation rate lower than the oxidation rate of the SiGe prior to the thermal treatment. As such, the SiGe epitaxial portion 122 becomes more resistant to oxidation after the thermal treatment.

In some embodiments, the thermal treatment may be performed in a temperature range from about 650° C. to about 950° C. The pressure ($pO_2$) in the chamber is greater than 0.005 torr. The thermal treatment may be performed in soak or spike anneal means. For the soak anneal means, a temperature of the semiconductor structure is elevated to a determined value in the range from about 650° C. to about 950° C., and kept (e.g., soaked) at the value for a determined time range, for example, from about 30 seconds to about 5 minutes, and then decrease. For the spike anneal means, a temperature of the semiconductor structure is elevated to a determined value in the range from about 650° C. to about 950° C., and then decrease. That is, the spike anneal means may not hold or soak the semiconductor structure at the determined high temperature for a time range.

FIGS. 18 through 30 illustrate the cross-sectional views and perspective views of intermediate stages in the formation of gate all around (GAA) transistors in accordance with some embodiments. The illustration is merely exemplary and is not intended to limit beyond what is specifically recited in the claims that follow. It is understood that additional operations may be provided before, during, and after the operations shown by FIGS. 18-30, and some of the operations described below can be replaced or eliminated for additional embodiments of the method. The order of the operations/processes may be interchangeable. In some embodiments, the semiconductor device shown in FIGS. 18-30 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 18:
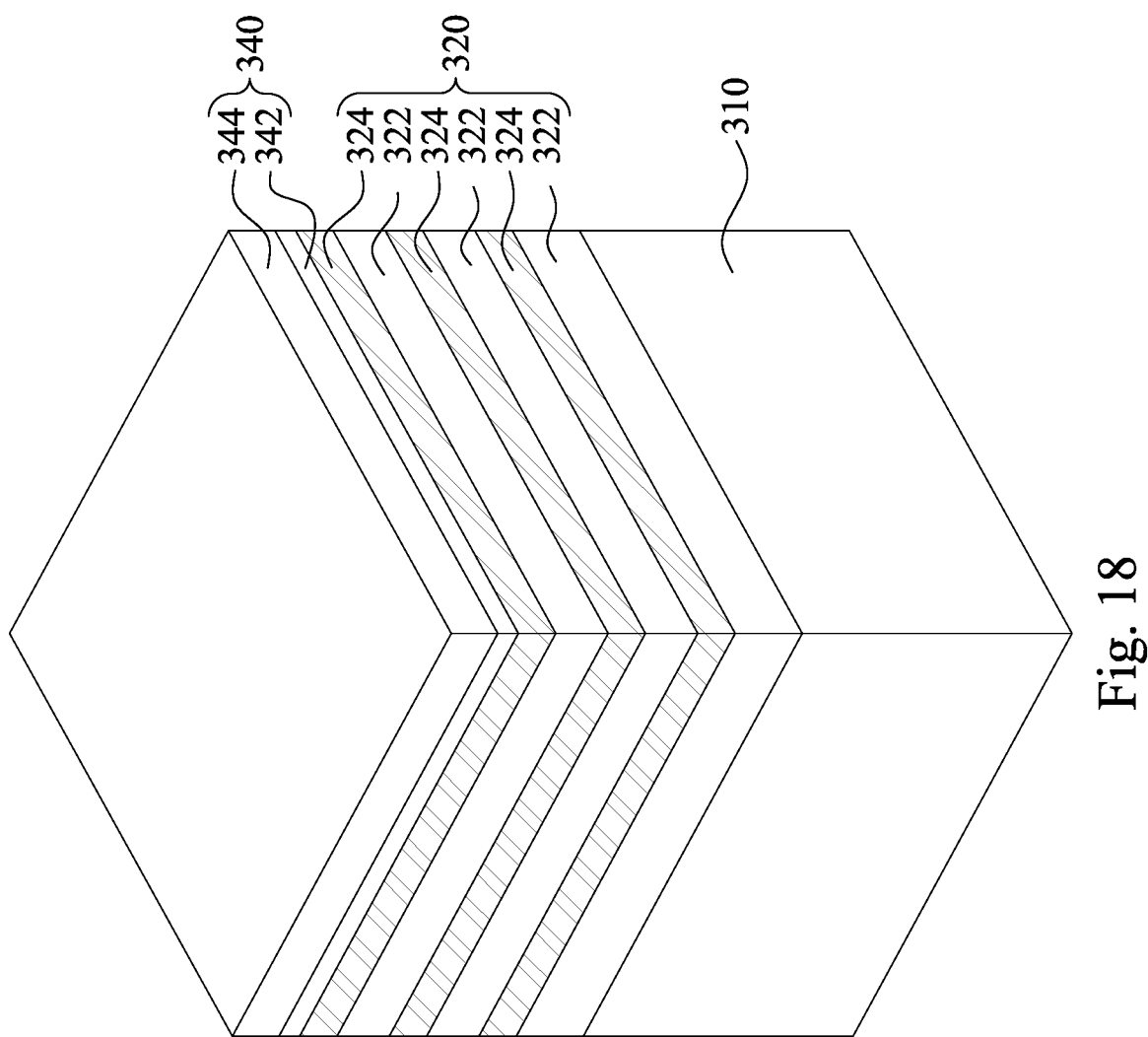
FIGS. 18 through 30 illustrate the cross-sectional views and perspective views of intermediate stages in the formation of gate all around (GAA) transistors in accordance with some embodiments.

Reference is made to FIG. 18. A substrate 310, which may be a part of a wafer, is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

An epitaxial stack 320 is formed on the substrate 310 through epitaxy, such that the epitaxial stack 320 forms crystalline layers. The epitaxial stack 320 includes first semiconductor layers 322 and second semiconductor layers 324 stacked alternately. The first semiconductor layers 322 and the second semiconductor layers 324 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 322 and the second semiconductor layers 324 are made of Si, a Si compound, SiGe, Ge or a Ge compound. In FIG. 18, three layers of the first semiconductor layer 322 and three layers of the second semiconductor layer 324 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

In some embodiments, the first semiconductor layers 322 can be SiGe layers having a germanium atomic percentage greater than zero. In some embodiments, the germanium percentage of the first semiconductor layers 322 is in the range between about 10 percent and about 50 percent. In some embodiments, the second semiconductor layers 324 may be pure silicon layers that are free from germanium. The second semiconductor layers 324 may also be substantially pure silicon layers, for example, with a germanium atomic percentage lower than about 1 percent. Furthermore, the second semiconductor layers 324 may be intrinsic, which are not doped with p-type and n-type impurities.

Subsequently, a mask 340 is formed above the epitaxial stack 320. In some embodiments, the mask 340 includes a first mask layer 342 and a second mask layer 344. The first mask layer 342 may be a pad oxide layer made of a silicon oxide, which can be formed by a thermal oxidation. The second mask layer 344 may be made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process.

Figure 19:
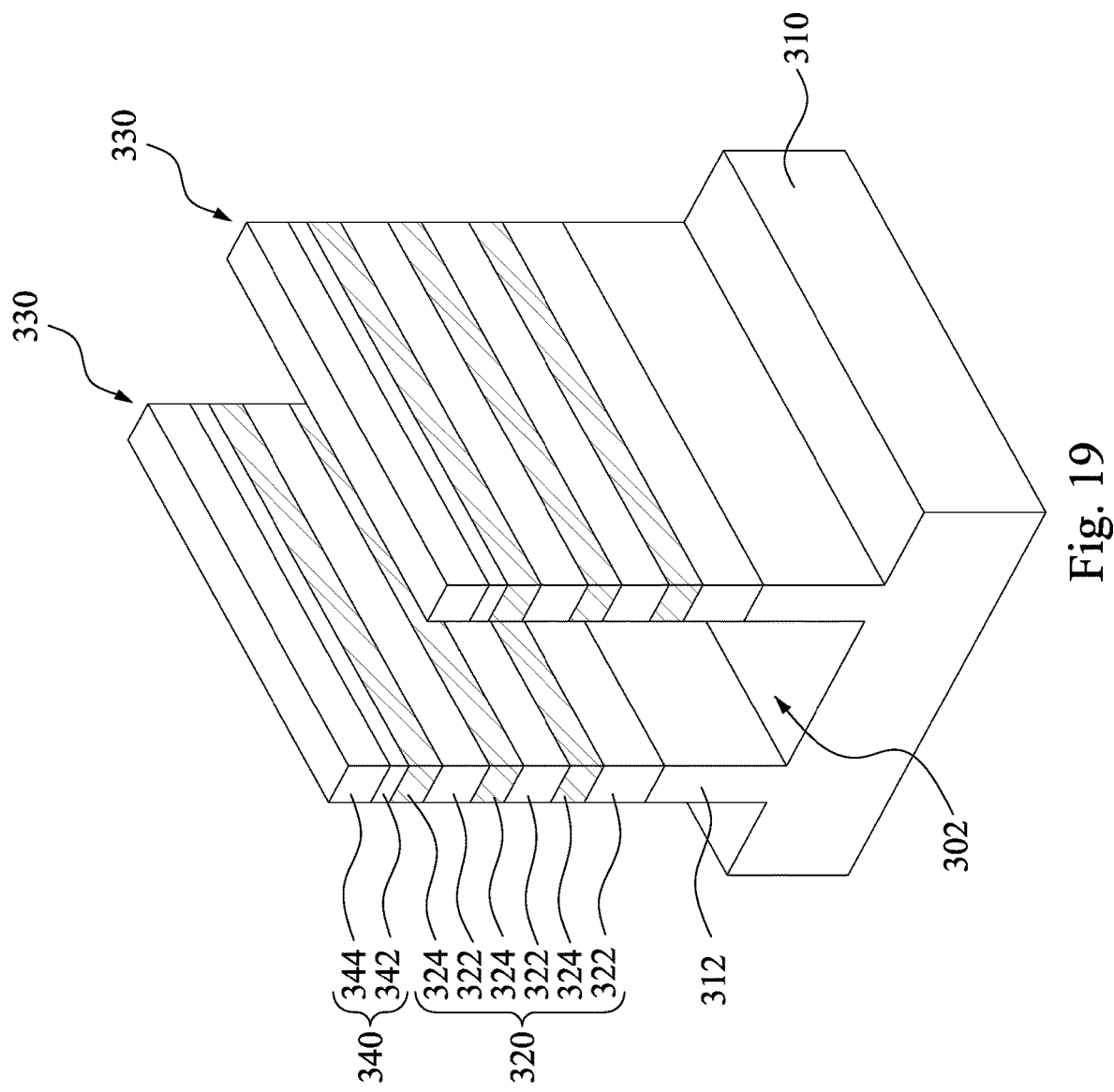

Reference is made to FIG. 19. The mask 340 (see FIG. 1) is patterned into a mask pattern by using patterning operations including photo-lithography and etching. After the patterning of the mask 340, the epitaxial stack 320 (see FIG. 1) is patterned by using the patterned mask 340 as an etch mask, such that the epitaxial stack 320 is patterned into semiconductor fins 330 with trenches 302 formed therebetween. The trenches 302 extend into the substrate 310, and have lengthwise directions substantially parallel to each other. The trenches 302 form base portions 312 in the substrate 310, where the base portions 312 protrude from the substrate 310, and the semiconductor fins 330 are respectively formed above the base portions 312 of the substrate 310. The remaining portions of the epitaxial stack 320 are accordingly referred to as the semiconductor fins 330 alternatively.

Figure 20A:
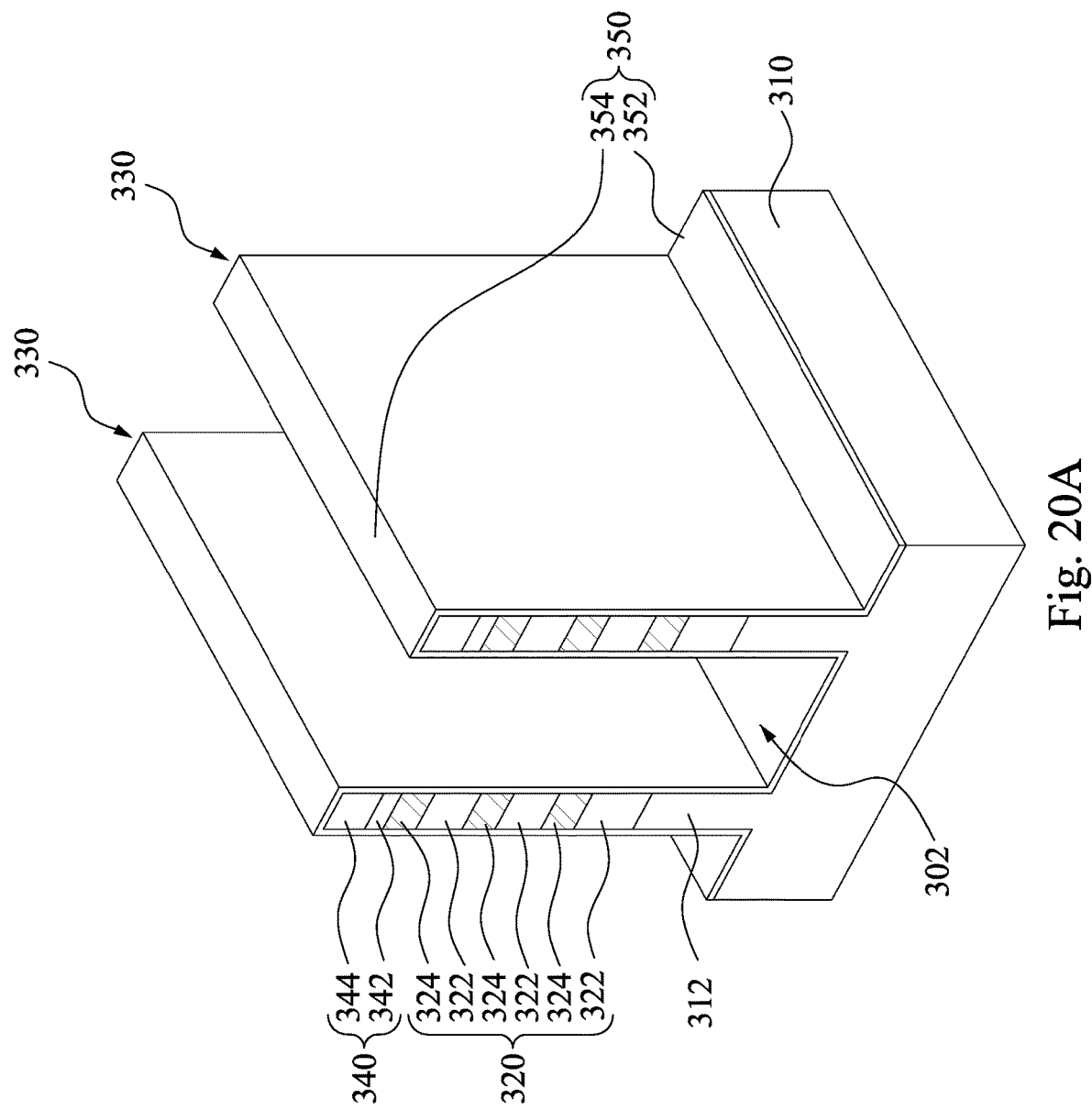
Figure 20B:
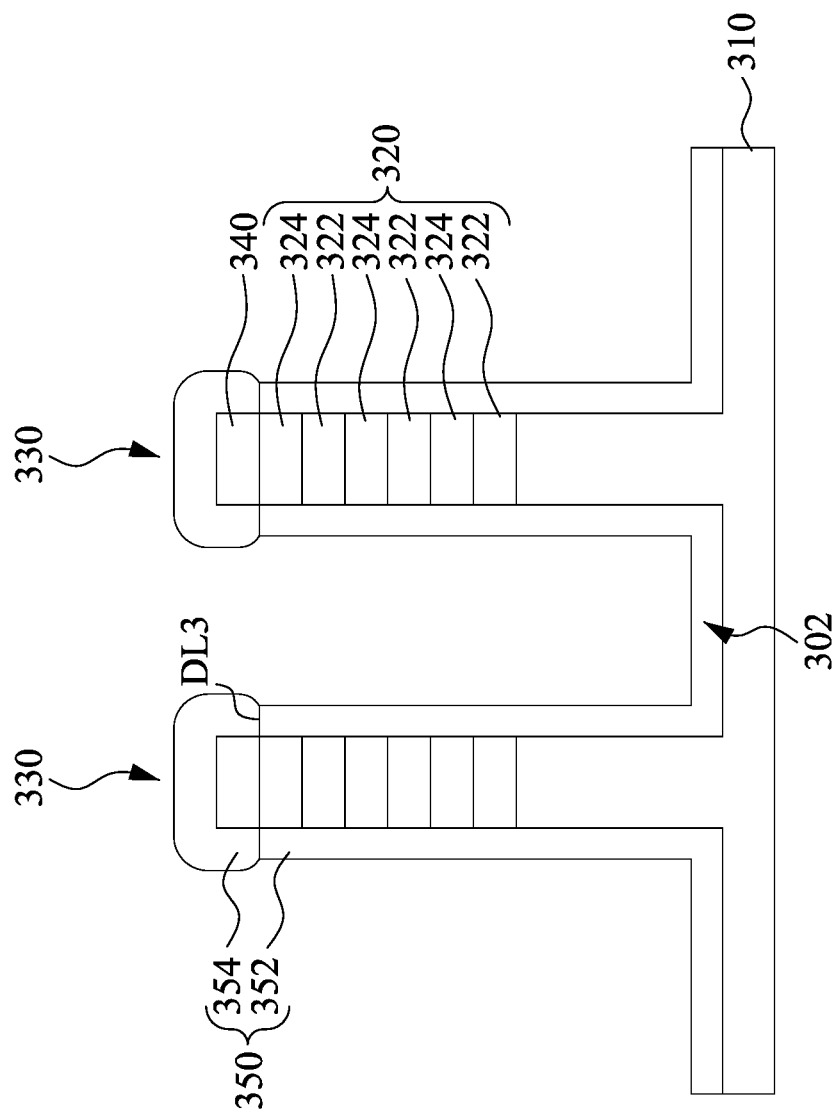

Reference is made to FIGS. 20A and 20B. FIG. 20B is a cross-sectional view of FIG. 20A. A capping layer 350 is conformally formed over the structure of FIG. 19, thereby mask the sidewalls of the semiconductor fins 330 from oxidation. Silicon germanium is prone to oxidation, and also has an oxidation rate significantly higher than the oxidation rate of silicon. In some embodiments, the capping layer 350 is used for protect the semiconductor layers 322 of the semiconductor fins 330 from being oxidized, for example, by the wet annealing process performed later. The capping layer 350 may include silicon, and is free from germanium in some embodiments. Furthermore, the capping layer 350 may be free from oxygen and nitrogen, and hence does not include silicon oxide and silicon nitride. The formation of the capping layer 350 may be performed using a conformal deposition method such as Atomic Layer Deposition (ALD), Chemical Vapor Deposition (CVD), or the combination thereof. In some embodiments, the capping layer 350 may also be referred to as a capping layer.

The deposition of the capping layer 350 may be achieved through an epitaxy process, so that at least a part of the capping layer 350 is a crystalline layer, such as a polysilicon layer. For example, portions 352 of the capping layer 350 over the sidewalls of the semiconductor fins 330 and the top surface of the substrate 310 may be crystalline. In some cases, due to the presence of the mask 340, portions 354 of the capping layer 350 over top surfaces and sidewalls of the masks 340 may be amorphous. For example, a dashed line DL3 in the figure indicates a boundary between the crystalline phase and the amorphous phase in the capping layer 350. In some embodiments, the capping layer 350 may include a transition region from crystalline to amorphous, and the transition region nears the dashed line DL3. Other details of the capping layer 350 may be similar to the capping layer 150 illustrated in FIGS. 3A and 3B, and therefore not repeated herein.

In some embodiments, since the amorphous Si has a less dense structure than crystal Si, the amorphous Si has an oxidation rate higher than an oxidation rate of crystal Si. In some cases, a distance between the semiconductor layers 322 of the semiconductor fins 330 and the amorphous portions of the capping layer 350 is so short, such that a topmost semiconductor layer 322 near the amorphous portion of the capping layer 350, may not be effectively protected by the capping layer 350 from the undesirable oxidation in some later processes.

In some embodiments, since the amorphous Si has a less dense structure than crystal Si, the deposition may be performed such that a thickness of the amorphous Si is greater than a thickness of the crystal Si. For example, the thickness of the portion 354 of the capping layer 350 is greater than the thickness of the portion 352 of the capping layer 350.

Figure 21:
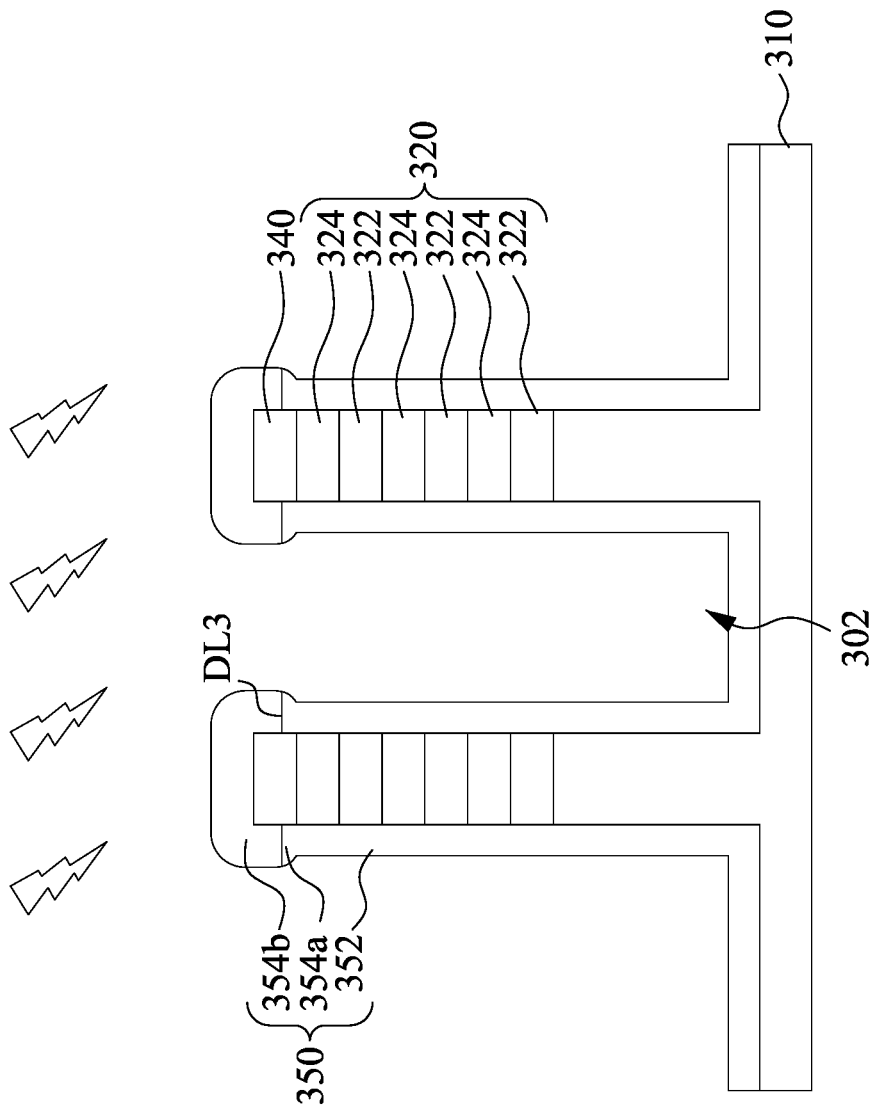

Reference is made to FIG. 21. A thermal treatment is performed to convert a portion of amorphous silicon in the capping layer 350, which is adjacent to the boundary indicated by dashed line DL3, to crystallized silicon. Through the treatment, the capping layer 350 may effectively protect the semiconductor layer 322 near the mask 340 from the undesirable oxidation by the capping layer 350 in later processes.

In some embodiments, the thermal treatment induces the crystallization in the capping layer 350 (referring to FIGS. 20A and 20B), such that a portion 354a in the portion 354 (referring to FIGS. 20A and 20B) near the dashed line DL3 is densified and converted into crystalline. A portion 354b in the portion 354 (referring to FIGS. 20A and 20B) away from the dashed line DL3 may remain amorphous after the thermal treatment. As a result, more crystallized silicon on sidewalls of the mask 340 can be observed, for example, by HR-TEM. For example, after the thermal treatment, the capping layer 350 includes portions 352 and 354a in crystalline phase, and portion 354b in amorphous phase. In some embodiments, the dashed line DL3, which indicates a boundary between the crystalline phase and the amorphous phase in the capping layer 350, gets higher after the thermal treatment. Therefore, a distance between the topmost semiconductor layer 322 and the amorphous portions of the capping layer 350 is increased by the thermal treatment, such that the topmost semiconductor layer 322 near the amorphous portion of the capping layer 350 may be more effectively protected by the capping layer 350 from the undesirable oxidation in later processes.

In some embodiments, the thermal treatment also results in strain re-balance between the SiGe semiconductor layers 322 and the Si capping layer 350 (which has a smaller lattice constant than SiGe), such that the lattice constant of the SiGe semiconductor layers 322 is reduced due to the presence of the Si capping layer 350 after the thermal treatment. The SiGe semiconductor layers 322 with the reduced lattice constant has an oxidation rate lower than the oxidation rate of the SiGe prior to the thermal treatment. For example, a lattice constant of the SiGe semiconductor layers 322 in FIG. 21 is less than a lattice constant of the SiGe semiconductor layers 322 in FIGS. 20A and 20B, and further less than a lattice constant of the SiGe semiconductor layers 322 in FIG. 19. As such, the SiGe semiconductor layers 322 become more resistant to oxidation after the thermal treatment.

In some embodiments, the thermal treatment may be performed in a temperature range from about 650° C. to about 950° C. The pressure ($pO_2$) in the chamber is greater than 0.005 torr. The thermal treatment may be performed in soak or spike anneal means. Other details regarding the thermal treatment may be similar to those illustrated in FIGS. 4A-4C, and therefore not repeated herein.

In some embodiments, the thickness of the capping layer 350 may be reduced by the crystallization induced by the thermal treatment. For example, thickness of the portions 352 and the portion 354a of the portion 354 are reduced. In some embodiments, the thickness of the portions 352 and the portion 354a of the portion 354 is less than the amorphous portion 354b of the portion 354. In some embodiments, being converted from an amorphous portion, the portion 354a of the portion 354 may have a thickness greater than the thickness of the portions 352.

Figure 22:
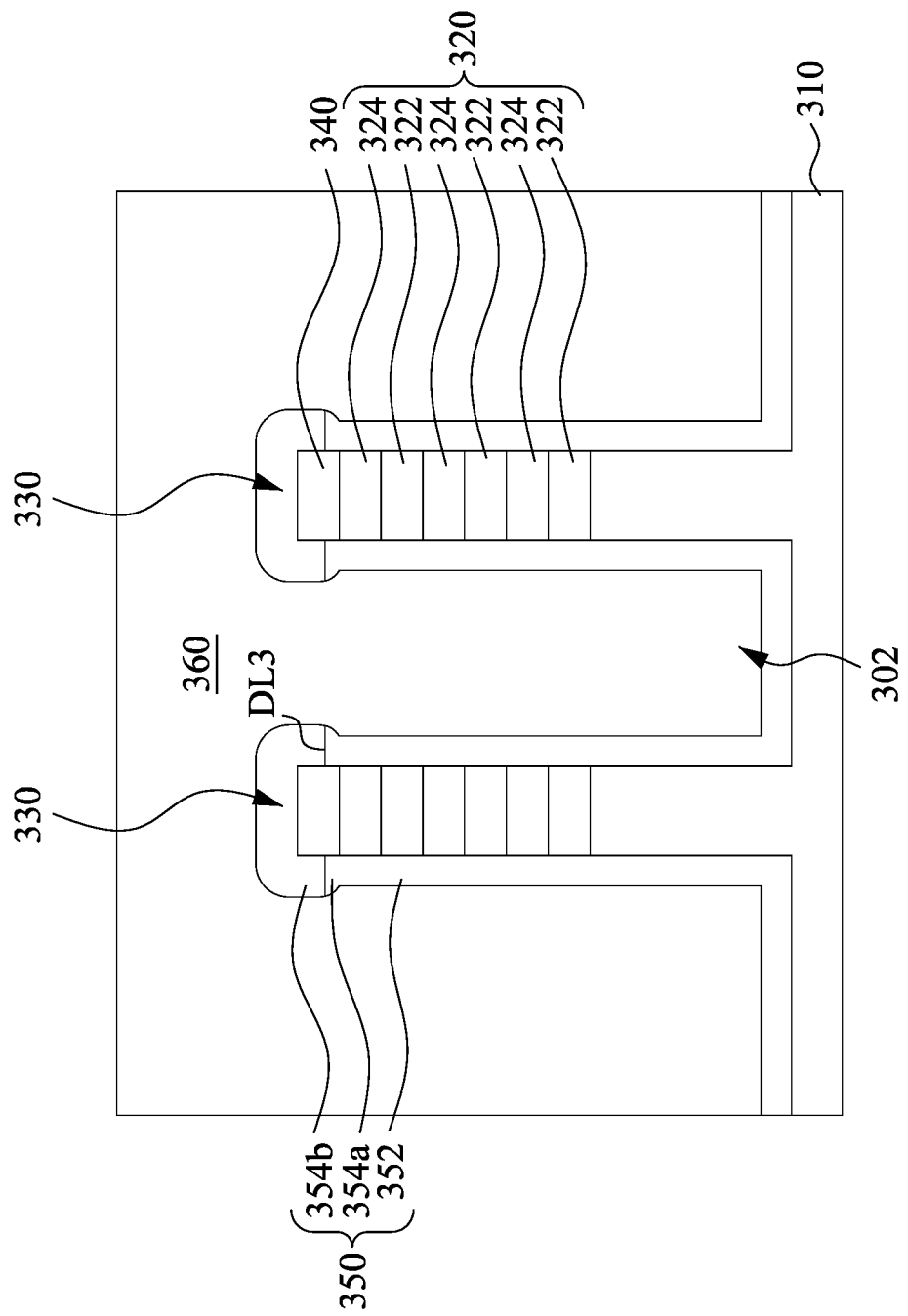

FIG. 22 illustrates the formation a dielectric material 360 in the trenches 302. The dielectric material 360 may include a dielectric liner and a filling dielectric material over the dielectric liner. In some embodiments, a conformal deposition method is used to deposit a conformal dielectric liner on the exposed surfaces of the structure shown in FIG. 21. For example, the dielectric liner may be formed using ALD or CVD. Next, the remaining portions of trenches 302 are overfilled with a dielectric material. The dielectric material may be formed using Flowable Chemical Vapor Deposition (FCVD), spin-on coating, or the like. In accordance with some embodiments in which FCVD is used, a silicon-and nitrogen-containing precursor (for example, trisilylamine (TSA) or disilylamine (DSA)) is used, and hence the resulting dielectric material is flowable (jelly-like). In accordance with alternative embodiments of the present disclosure, the flowable dielectric material is formed using an alkylamino silane based precursor. During the deposition, plasma is turned on to activate the gaseous precursors for forming the flowable oxide.

Figure 23:
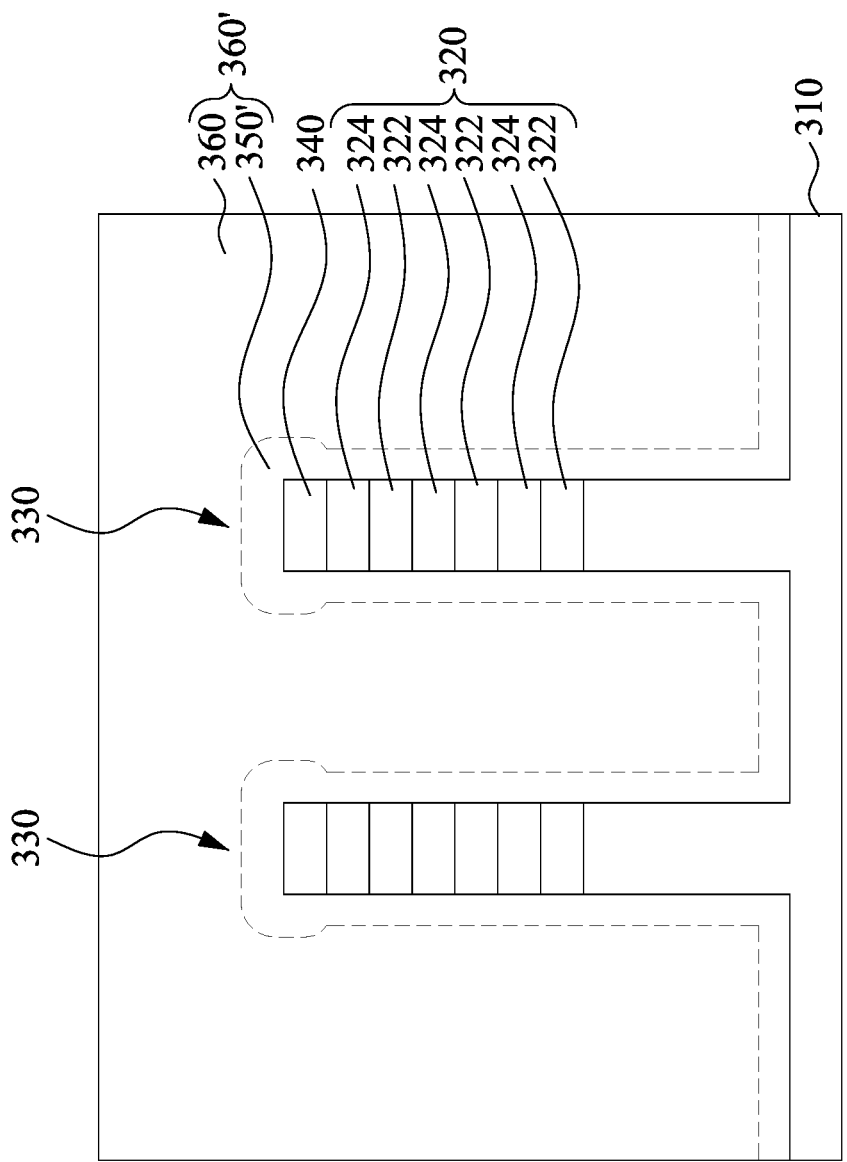

Reference is made to FIG. 23. An oxide annealing process may be performed for removing impurities in the dielectric material 360. The oxide annealing process may include introducing wet steam, such as $H_2O$, $O_2$, or the like. As illustrated previously, in the present embodiments, the capping layer 350 is formed around the semiconductor layers 322, and the distance between the amorphous portion of the capping layer 350 and the semiconductor layers 322 is increased by the thermal treatment (referring FIG. 22), thereby keeping the semiconductor layers 322 from being oxidized during the oxide annealing process.

Through the oxide annealing process, the capping layer 350 (referring to FIG. 22) may be oxidized into a semiconductor-containing oxide layer 350', such as a silicon oxide layer. In some embodiments, the semiconductor-containing oxide layer 350' may also be referred to as a dielectric liner, and a combination of the semiconductor-containing oxide layer 350' and the dielectric material 360 may be referred to as a dielectric material 360'. In some embodiments, a remaining portion of the capping layer 350 (referring to FIG. 22) may form a Si residue layer between the semiconductor-containing oxide layer 350' and the semiconductor fins 330 after the annealing process. The Si residue layer may be oxidized and removed in a later process.

Figure 24:
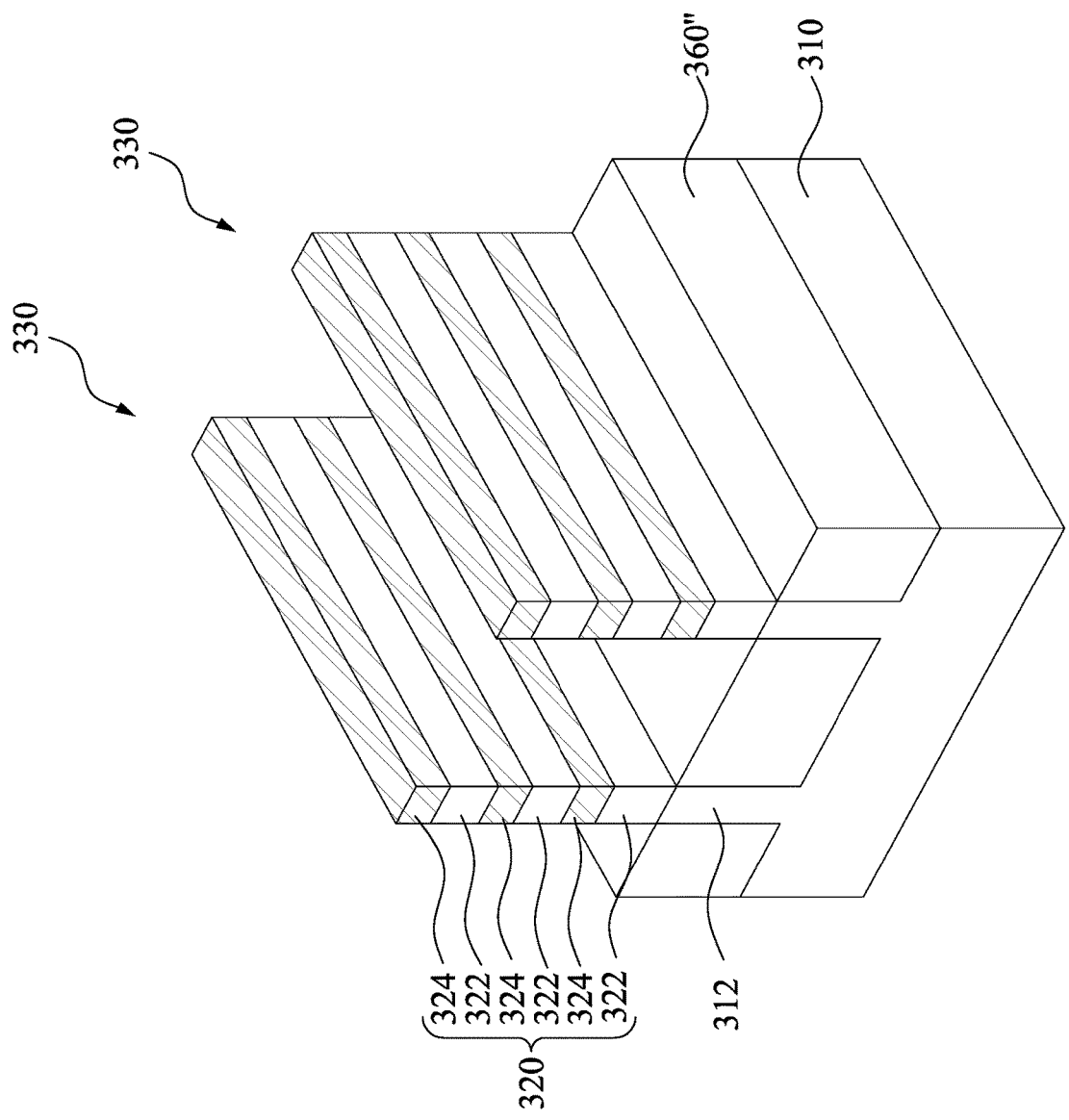

Reference is made to FIG. 24. The dielectric material 360' are recessed by suitable etching process. In some embodiments, the recessing process may include a dry etching process, a wet etching process, and/or a combination thereof. The remaining portions of the dielectric material 360' are referred to as the STI structures 360", and the fins 330 extending above the STI structures 360" with the epitaxial stack 320 exposed. In some embodiments, prior to recessing the dielectric material 360' (referring to FIG. 23), the dielectric material 360' (referring to FIG. 23) is thinned and planarized, for example, by a chemical mechanical polishing (CMP) process. In some embodiments, the masks 340 (referring to FIG. 23) function as a CMP stop layer. The masks 340 may also be removed before, during, and/or after the recessing of the STI structures 360".

In some embodiments, one or more cleaning processes may be performed during or after the planarization process and/or the recessing process. In some embodiments where a Si residue layer is between the semiconductor-containing oxide layer 350' (referring to FIG. 23) and the semiconductor fins 330, the cleaning processes may convert the Si residue layer into silicon oxide layer serving as a portion of the STI structures 360". As a result, there may be no Si residue layer after the recessing process.

Figure 25A:
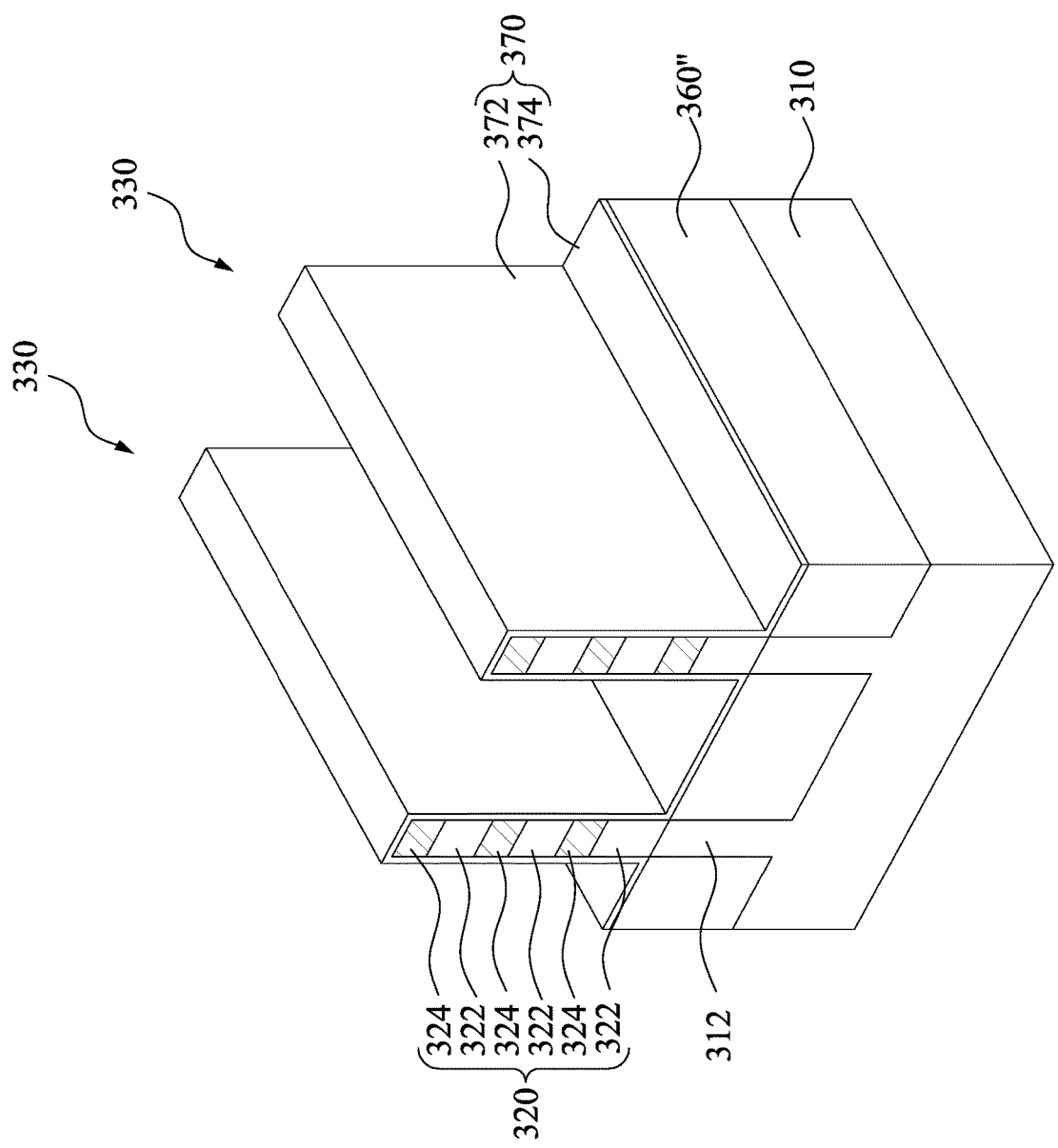
Figure 25B:
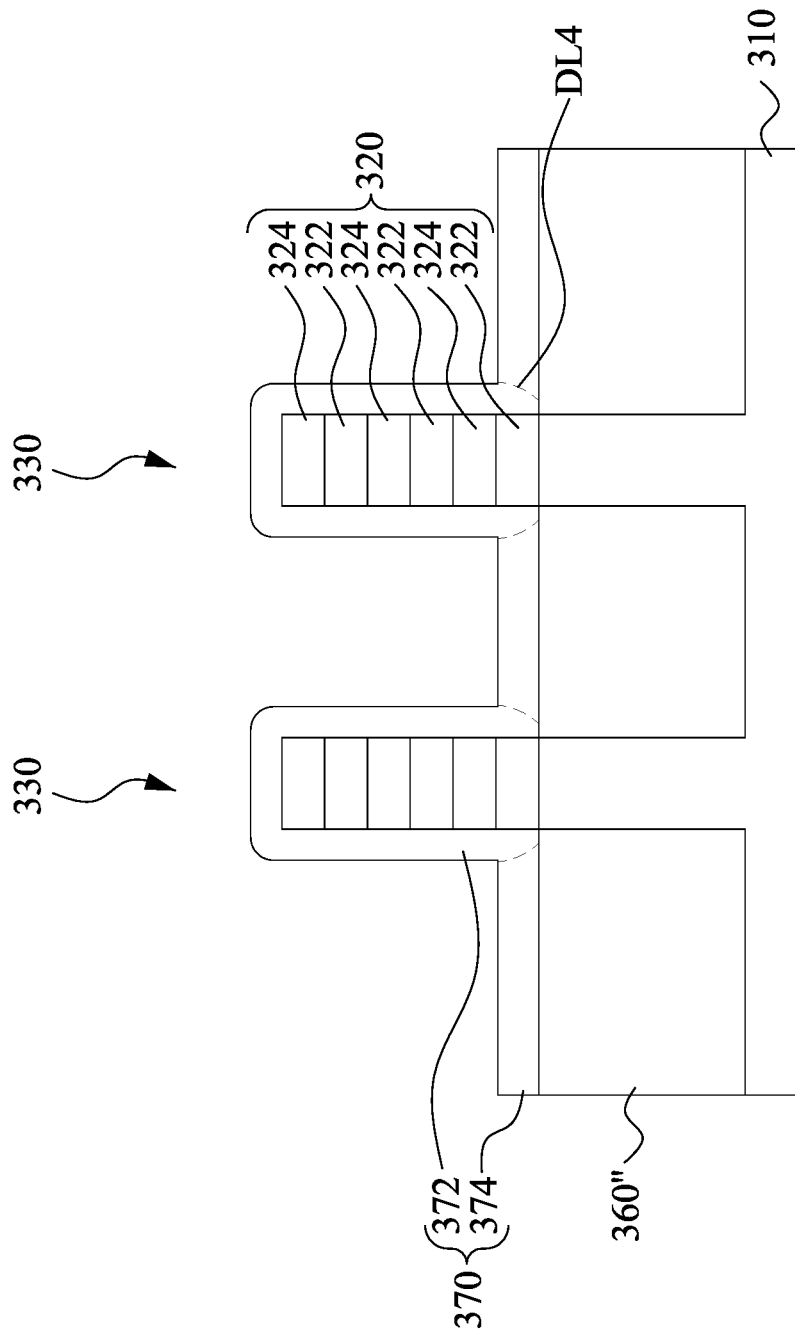

Reference is made to FIGS. 25A and 25B. FIG. 25B is a cross-sectional view of the structure of FIG. 25A. A capping layer 370 is conformally formed over the structure of FIG. 24, thereby mask the exposed sidewalls and top surfaces of the fins 330 from oxidation. The capping layer 370 is used for protect the underlying epitaxial layers 322 from being oxidized in subsequent processes. The capping layer 370 may include silicon, and is free from germanium in some embodiments. Furthermore, the capping layer 370 may be free from oxygen and nitrogen, and hence does not include silicon oxide and silicon nitride. The formation of the capping layer 370 may be performed using a conformal deposition method such as Atomic Layer Deposition (ALD) or Chemical Vapor Deposition (CVD).

The deposition of the capping layer 370 may be achieved through an epitaxy process, so that at least a part of the capping layer 370 is a crystalline layer, such as a polysilicon layer. In some cases, due to the presence of the STI structures 360", portions of the capping layer 370 over top surfaces of the STI structures 360" may be amorphous. For example, a dashed line DL4 in the figure indicates a boundary between crystalline phase and the amorphous phase in the capping layer 370. In some embodiments, the portions 372 of capping layer 370 are formed on sidewalls and top surfaces of the fins 330, and therefore are crystalline. In some embodiments, the portions 374 of capping layer 370 are formed on top surfaces of the STI structures 360", and therefore are almost amorphous. In some embodiments, the capping layer 350 may include a transition region (near the dashed line DL4) from crystalline to amorphous between portions 372 and 374.

In some embodiments, since the amorphous Si has a less dense structure than crystal Si, the amorphous Si has an oxidation rate higher than an oxidation rate of crystal Si. Therefore, the bottommost epitaxial layer 322 near the portion 374 of the capping layer 370 may not be effectively protected by the capping layer 370 from the undesirable oxidation in subsequent process.

In some embodiments, since the amorphous Si has a less dense structure than crystal Si, the deposition may be performed such that a thickness of the amorphous Si is greater than a thickness of the crystal Si. For example, the thickness of the portion 374 of the capping layer 170 is greater than the thickness of the portion 372 of the capping layer 170.

Figure 26:
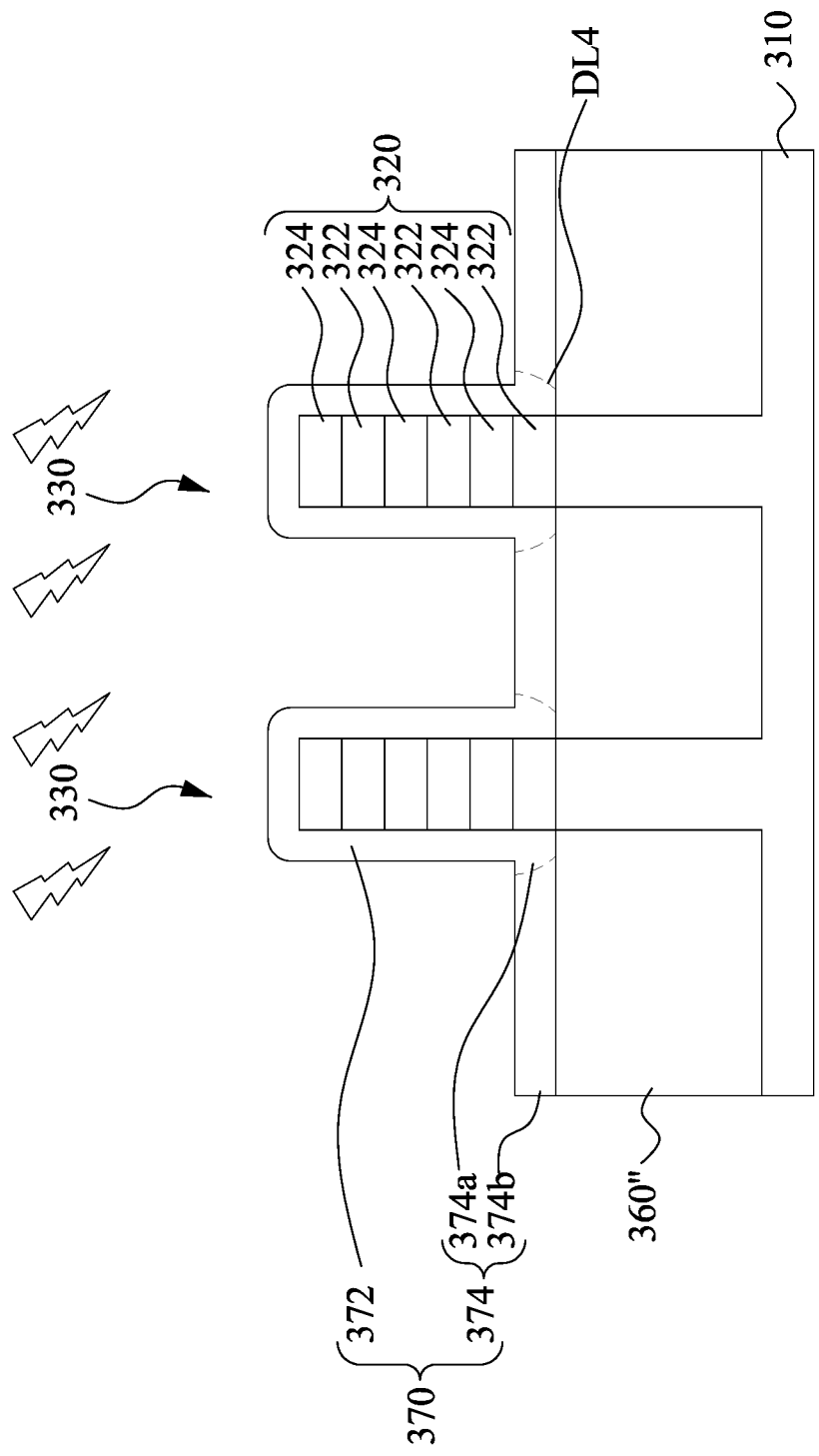

Reference is made to FIG. 26. A thermal treatment is performed to convert amorphous silicon to crystallized silicon at the transition region (near the dashed line DL4) in the capping layer 370, thereby effectively protecting the bottommost epitaxial layer 322 from the undesirable oxidation by the capping layer 370.

In some embodiments, the thermal treatment is performed to induce the crystallization in the portion 374 (referring to FIGS. 25A and 25B), such that a portion 374a in the portion 374 adjacent to the portion 372 and the bottommost epitaxial layer 322 is densified and converted into crystalline. After the thermal treatment, the capping layer 370 includes the portion 374a in the portion 374 and the portion 372 in crystalline phase, and a portion 374b in the portion 374 away from the epitaxial layer 322 in amorphous phase. For example, the dashed line DL4, which indicates a boundary between the crystalline phase and the amorphous phase in the capping layer 370, gets shifted after the thermal treatment. Therefore, a distance between the epitaxial layer 322 and the amorphous portion of the capping layer 370 is increased by the thermal treatment, such that the bottommost epitaxial layer 322 near the amorphous portion of the capping layer 370 may be more effectively protected by the capping layer 370 from the undesirable oxidation.

Furthermore, the thermal treatment also results in strain re-balance between the SiGe epitaxial layer 322 and the Si capping layer 370 (which has a smaller lattice constant than SiGe), such that the lattice constant of the SiGe epitaxial layer 322 is reduced due to the presence of the Si capping layer 370 after the thermal treatment. The SiGe epitaxial layer 322 with the reduced lattice constant has an oxidation rate lower than the oxidation rate of the SiGe prior to the thermal treatment. For example, a lattice constant of the SiGe semiconductor layers 322 in FIG. 26 is less than a lattice constant of the SiGe semiconductor layers 322 in FIGS. 25A and 25B, and further less than a lattice constant of the SiGe semiconductor layers 322 in FIG. 24. As such, the SiGe epitaxial layer 322 becomes more resistant to oxidation after the thermal treatment.

In some embodiments, the thermal treatment may be performed in a temperature range from about 650° C. to about 950° C. The pressure ($pO_2$) in the chamber is greater than 0.005 torr. The thermal treatment may be performed in soak or spike anneal means. Other details regarding the thermal treatment may be similar to those illustrated in FIGS. 10A and 10B, and therefore not repeated herein.

In some embodiments, the thickness of the capping layer 370 may be reduced by the crystallization induced by the thermal treatment. For example, thickness of the portion 372 and the portion 374*a* of the portion 374 are reduced. In some embodiments, the thickness of the portion 372 and the portion 374*a* of the portion 374 is less than the amorphous portion 374*b* of the portion 374. In some embodiments, being converted from an amorphous portion, the portion 374*a* may have a thickness greater than the thickness of the portion 372.

Figure 27:
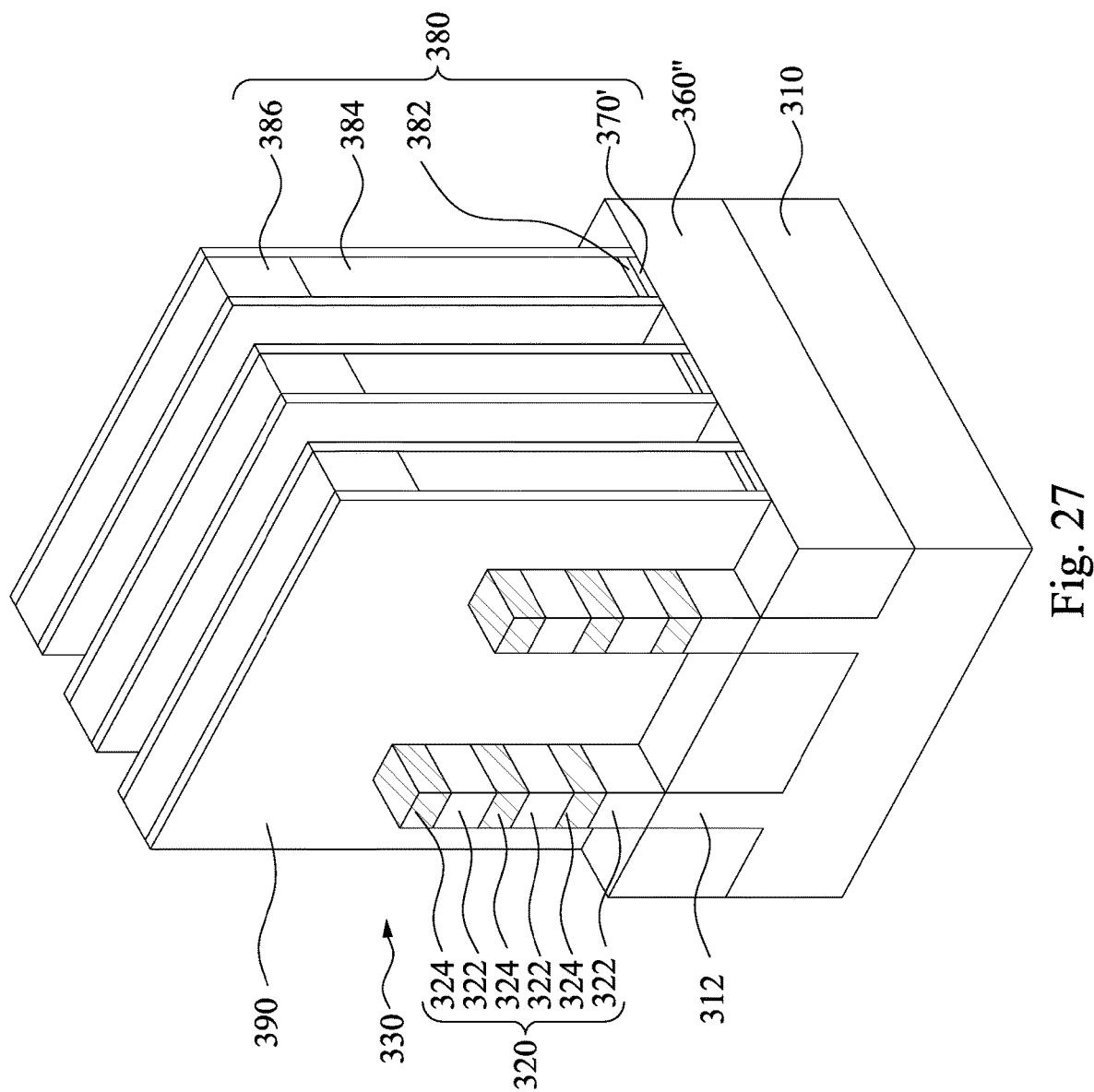

Reference is made to FIG. 27. At least one dummy gate structure 380 is then formed over the structure of FIG. 26. The dummy gate structure 380 includes a gate dielectric layer 382, a dummy gate electrode layer 384, and a mask 386 formed over the pad layer 384. Formation of the dummy gate structure 380 includes depositing in sequence a gate dielectric layer, depositing a dummy gate electrode layer, a mask layer over the substrate 310, patterning the mask layer into masks 386 using suitable photolithography and etching techniques, followed by patterning the dummy gate electrode layer using the masks 386 as masks to form the patterned dummy gate layer 384, and then patterning the gate dielectric layer and the capping layer 370 (referring to FIG. 26), using the mask 386 as masks to form the gate dielectric layer 382 and the capping layer 370'.

The gate dielectric layer 382 may include silicon dioxide, silicon nitride, a high-κ dielectric material or other suitable material. In various examples, the sacrificial gate dielectric layer 382 may be deposited by an ALD process, a CVD process, a subatmospheric CVD (SACVD) process, a flowable CVD process, a PVD process, or other suitable process. In some embodiments, prior to depositing the gate dielectric layer, a cleaning process is performed. In some embodiments, the cleaning process may oxidize a portion of the capping layer 370 or the entire capping layer 370 (referring to FIG. 26). As a result, after the formation of the dummy gate structure 380, the capping layer 370' may be referred to as a semiconductor-containing oxide layer, such as a silicon oxide layer.

In some embodiments, the dummy gate electrode layer 384 may be made of polycrystalline-silicon (poly-Si), polycrystalline silicon-germanium (poly-SiGe), or other suitable materials. The mask 386 may include a pad layer made of silicon nitride or other suitable materials, and a hard mask layer made of silicon dioxide or other suitable materials.

In some embodiments, patterning the dummy gate electrode layer may include suitable etching process, and the gate dielectric layer may serve as an etch stop layer, thereby protecting the underlying Si capping layer 370 (referring to FIG. 26) from being etched by the etching process. In some embodiments, patterning the dummy gate electrode layer may include suitable etching process, such that portions of the underlying Si capping layer 370 (referring to FIG. 26) not covered by the masks 386 may also be etched. Therefore, after patterning these layers, the dummy gate structures 380 are formed, and the Si capping layer 370 (referring to FIG. 26) are patterned and referred to as Si capping layer 370'. The dummy gate structures 380 and the Si capping layer 370' may expose portions of the semiconductor fins 330, thereby defining source/drain (S/D) regions. In context, a source and a drain are interchangeably used and the structures thereof are substantially the same.

Subsequently, gate spacers 390 are formed on opposite sidewalls of the dummy gate structures 380. For example, a blanket layer of an insulating material for sidewall spacers is conformally formed to cover the dummy gate structures 380 by using plasma enhanced chemical vapor deposition (PECVD), low-pressure chemical vapor deposition (LPCVD), sub-atmospheric chemical vapor deposition (SACVD), or the like. The blanket layer is deposited in a conformal manner so that it is formed to have substantially equal thicknesses on vertical surfaces, such as the sidewalls, horizontal surfaces, and the top of the dummy gate structures 380. In some embodiments, the insulating material of the blanket layer is a silicon nitride-based material, such as SiN, SiON, SiOCN or SiCN and combinations thereof. The blanket layer is then etched using an anisotropic process to form the gate spacers 390 on opposite sidewalls of the dummy gate structures 380.

The gate spacers 390 may include a seal spacer and a main spacer (not shown). The seal spacers may be formed on sidewalls of the dummy gate structure 380 and the main spacers are formed on the seal spacers. The anisotropic etching performed on the blanket layer can be, for example, reactive ion etching (RIE). During the anisotropic etching process, most of the insulating material is removed from horizontal surfaces, leaving the dielectric spacer layer on the vertical surfaces such as the sidewalls of the dummy gate structures 380.

Figure 28:
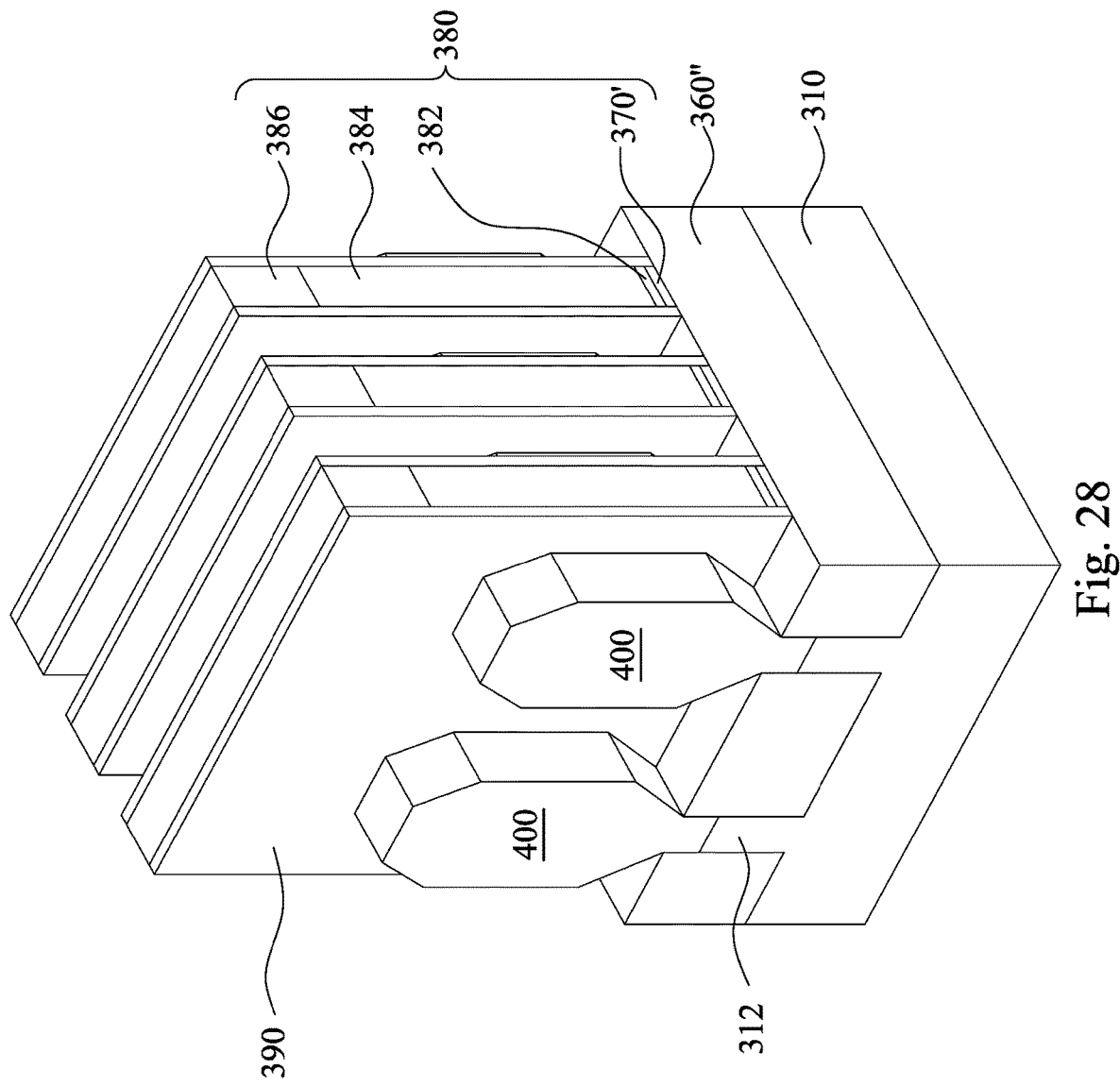

Reference is made to FIG. 28. The exposed portions of the semiconductor fins 330 are removed by using suitable etching process, and then source/drain (S/D) epitaxial structures 400 are epitaxially grown from the recessed semiconductor fins 330 (e.g., the base portions 312). The S/D epitaxial structures 400 includes one or more layers of Si, SiP, SiC and SiCP for an n-channel FET or Si, SiGe, Ge for a p-channel FET. The S/D epitaxial structures 400 are formed by an epitaxial growth method using CVD, ALD or molecular beam epitaxy (MBE). In some embodiments as depicted in FIG. 28, the S/D epitaxial structures 400 grown from neighboring base portions 312 of the substrate 310 do not merged. In some other embodiments, the S/D epitaxial structures 400 grown from neighboring base portions 312 merge in some embodiments.

Figure 29A:
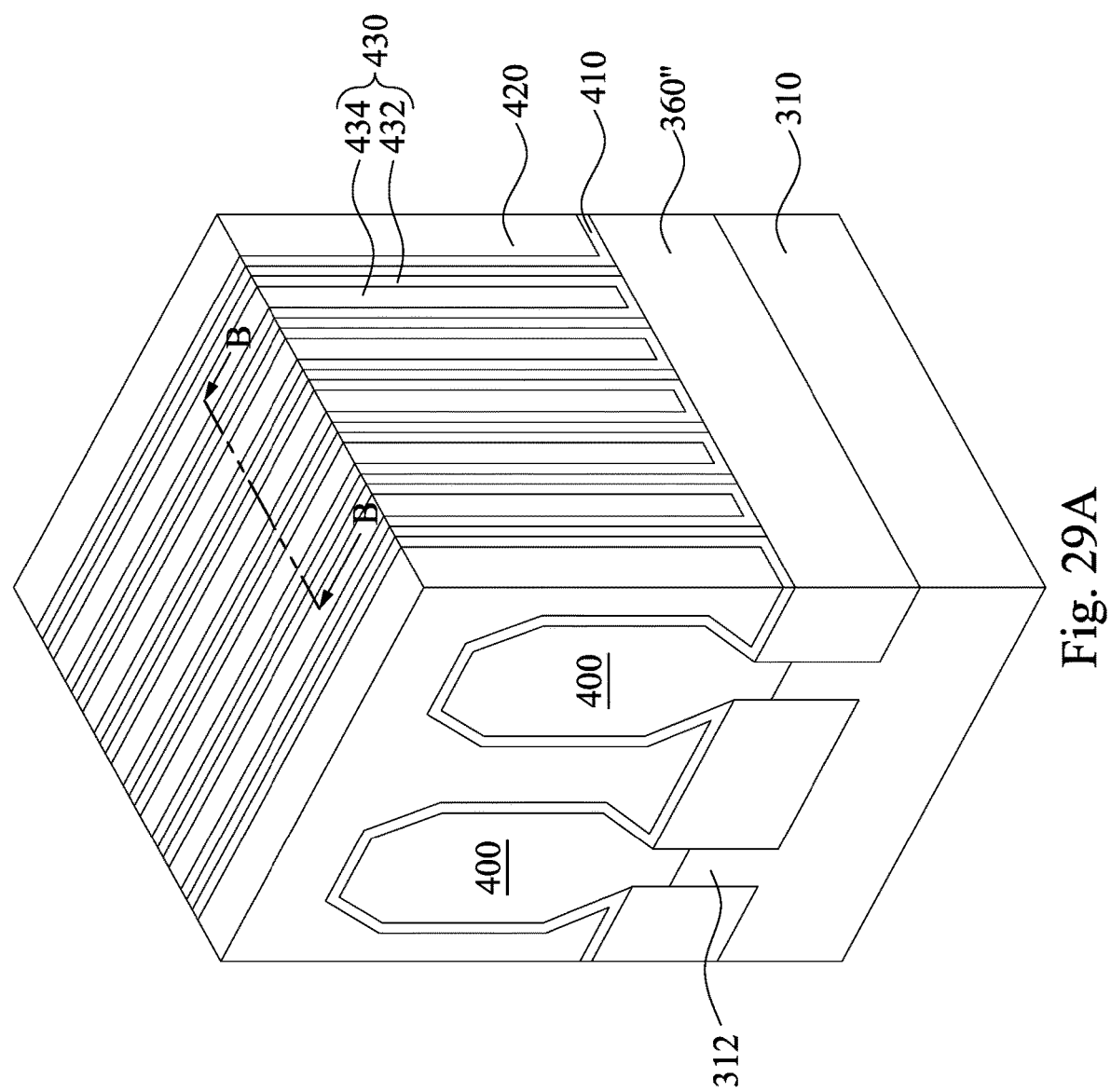
Figure 29B:
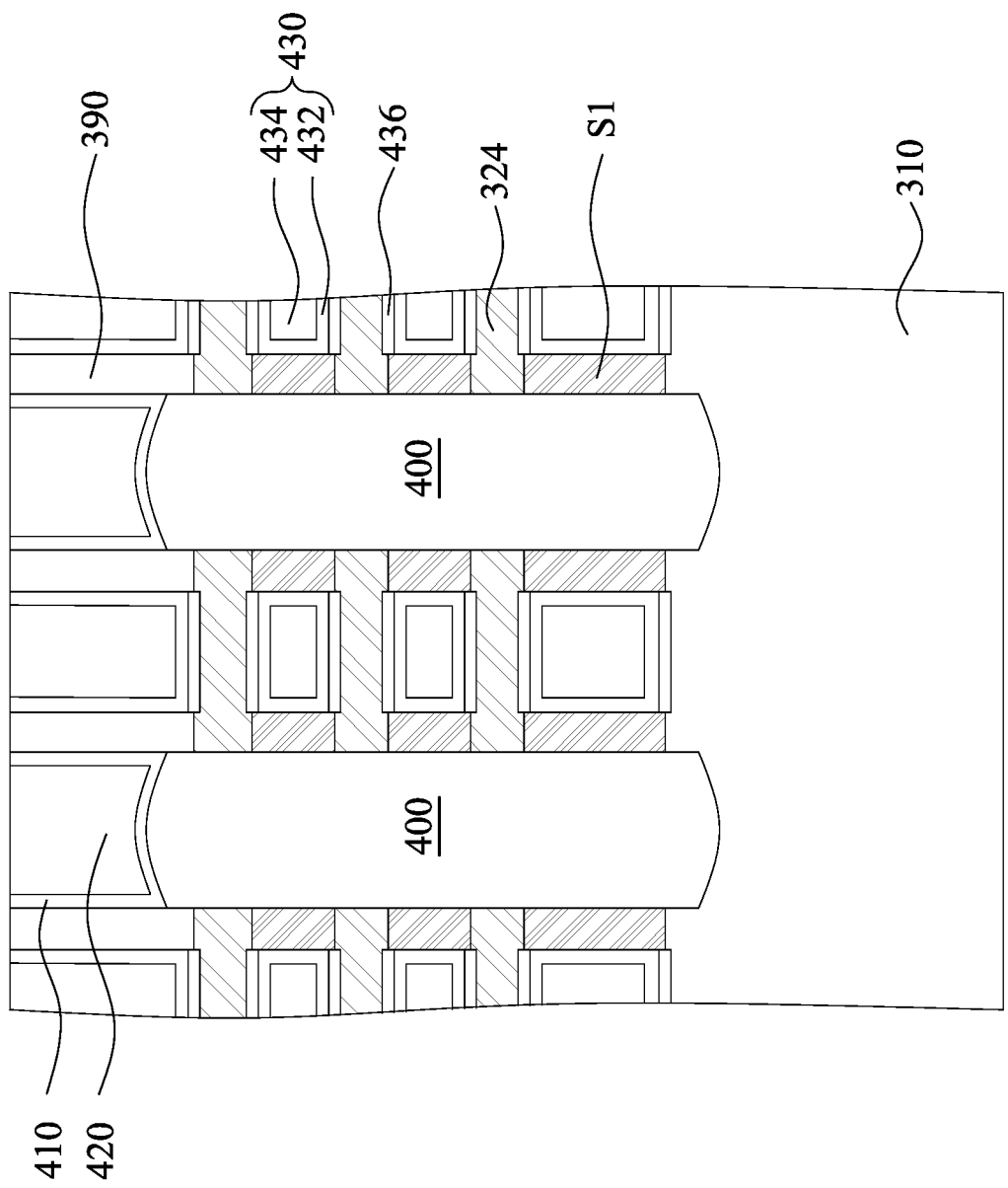
Figure 29C:
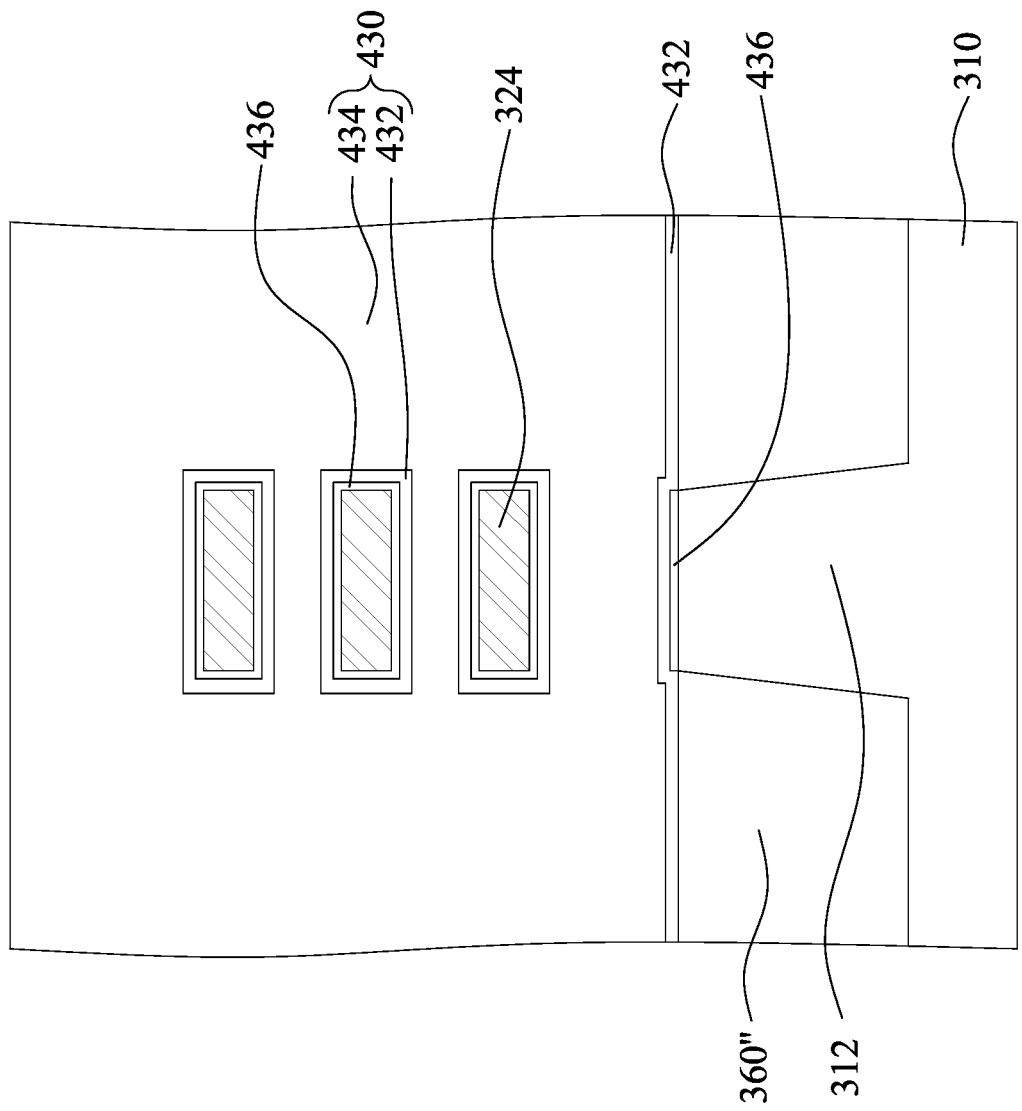

Reference is made to FIGS. 29A-29C, where FIG. 29B is a cross-sectional view taken along line B-B of FIG. 29A, and FIG. 29C is a cross-sectional view taken along line C-C of FIG. 29A. A contact etch stop layer (CESL) 410 is conformally formed over the structure of FIG. 7. In some embodiments, the CESL 410 can be a stressed layer or layers. In some embodiments, the CESL 410 has a tensile stress and is formed of $Si_3N_4$. In some other embodiments, the CESL 410 includes materials such as oxynitrides. In yet some other embodiments, the CESL 410 may have a composite structure including a plurality of layers, such as a silicon nitride layer overlying a silicon oxide layer. The CESL 410 can be formed using plasma enhanced CVD (PECVD), however, other suitable methods, such as low pressure CVD (LPCVD), atomic layer deposition (ALD), and the like, can also be used.

An interlayer dielectric (ILD) 420 is then formed on the CESL 410. The ILD 420 may be formed by chemical vapor deposition (CVD), high-density plasma CVD, spin-on, sputtering, or other suitable methods. In some embodiments, the ILD 420 includes silicon oxide. In some other embodiments, the ILD 420 may include silicon oxy-nitride, silicon nitride, compounds including Si, O, C and/or H (e.g., silicon oxide, SiCOH and SiOC), a low-k material, or organic materials (e.g., polymers). After the ILD 420 is formed, a planarization operation, such as CMP, is performed, so that the mask 386 (referring to FIG. 28) are removed and the dummy gate electrode layer 384 (referring to FIG. 28) is exposed.

The dummy gate electrode layer 384, the gate dielectric layer 382, and the capping layer 370' (referring to FIG. 28)

are then removed, thereby exposing the semiconductor fins 330. The ILD 420 protects the S/D epitaxial structures 400 during the removal of the dummy gate electrode layer 384 (referring to FIG. 28). The dummy gate electrode layer 384 (referring to FIG. 28) can be removed using plasma dry etching and/or wet etching. When the dummy gate electrode layer 384 (referring to FIG. 28) is polysilicon and the ILD 420 is silicon oxide, a wet etchant such as a TMAH solution can be used to selectively remove the dummy gate electrode layer 384. The dummy gate electrode layer 384 can be removed using plasma dry etching and/or wet etching. Subsequently, the gate dielectric layer 382 and the capping layer 370' (referring to FIG. 28) are removed as well. As such, the semiconductor layers 322 and 324 (referring to FIG. 27) in the semiconductor fins 330 are exposed.

The semiconductor layers 322 (referring to FIG. 27) in the semiconductor fins 330 are then removed, thereby forming nanosheets (or nanowires or nanorods or nano-columns) of the semiconductor layers 324. The semiconductor layers 322 can be removed or etched using an etchant that can selectively etch the first semiconductor layers 322 at a faster etching rate than etching the semiconductor layers 324. In some embodiments, prior to the formation of the epitaxial structures 400, inner spacers S1 are formed on exposed sidewall of the semiconductor layers 322 (referring to FIG. 27). The inner spacers Si is made of a material that has etching selectivity to that of the semiconductor layers 322, such that the inner spacers S1 may protect the S/D epitaxial structures 400 from the etchant used in etching the semiconductor layers 322.

In some embodiments, interfacial layers 436 are optionally formed to surround exposed surfaces of the semiconductor layers 324 and exposed surfaces of the base portions of the substrate 310. In various embodiments, the interfacial layer 436 may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods.

Metal gate structures 430 are then formed and/or filled between the gate spacers 390 and the inner spacers S1. That is, the gate structure 430 encircles (or surrounds or wraps) the semiconductor layers 324, in which the second semiconductor layers 324 are referred to as channels of the semiconductor device. The gate spacers 390 are disposed on opposite sides of the gate structure 430. The gate structure 430 includes a gate dielectric layer 432 and a gate electrode 434. The gate electrode 434 includes one or more work function metal layer (s) and a filling metal. The gate dielectric layer 432 is conformally formed. That is, the gate dielectric layer 432 is in contact with the STI structures 360" and the interfacial layers 436 (or the semiconductor layers 324 when the interfacial layers 436 are omitted). Furthermore, the gate dielectric layer 432 surrounds the second semiconductor layers 324, and spaces between the second semiconductor layers 324 are still left after the deposition of the gate dielectric layer 432. In some embodiments, the gate dielectric layer 432 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. In some embodiments, the gate dielectric layer 432 may be formed by performing an ALD process or other suitable process.

The work function metal layer of the gate electrode 434 is conformally formed on the gate dielectric layer 432, and the work function metal layer surrounds the second semiconductor layers 124 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process. The filling metal of the gate electrode 434 fills the remained space between the gate spacers 390 and between the inner spacers S1. That is, the work function metal layer(s) is in contact with and between the gate dielectric layer 432 and the filling metal. The filling metal may include material such as tungsten or aluminum. After the deposition of the gate dielectric layer 432 and the gate electrode 434, a planarization process, such as a CMP process, may be then performed to remove excess portions of the gate dielectric layer 432 and the gate electrode 434 to form the gate structure 430.

Figure 30:
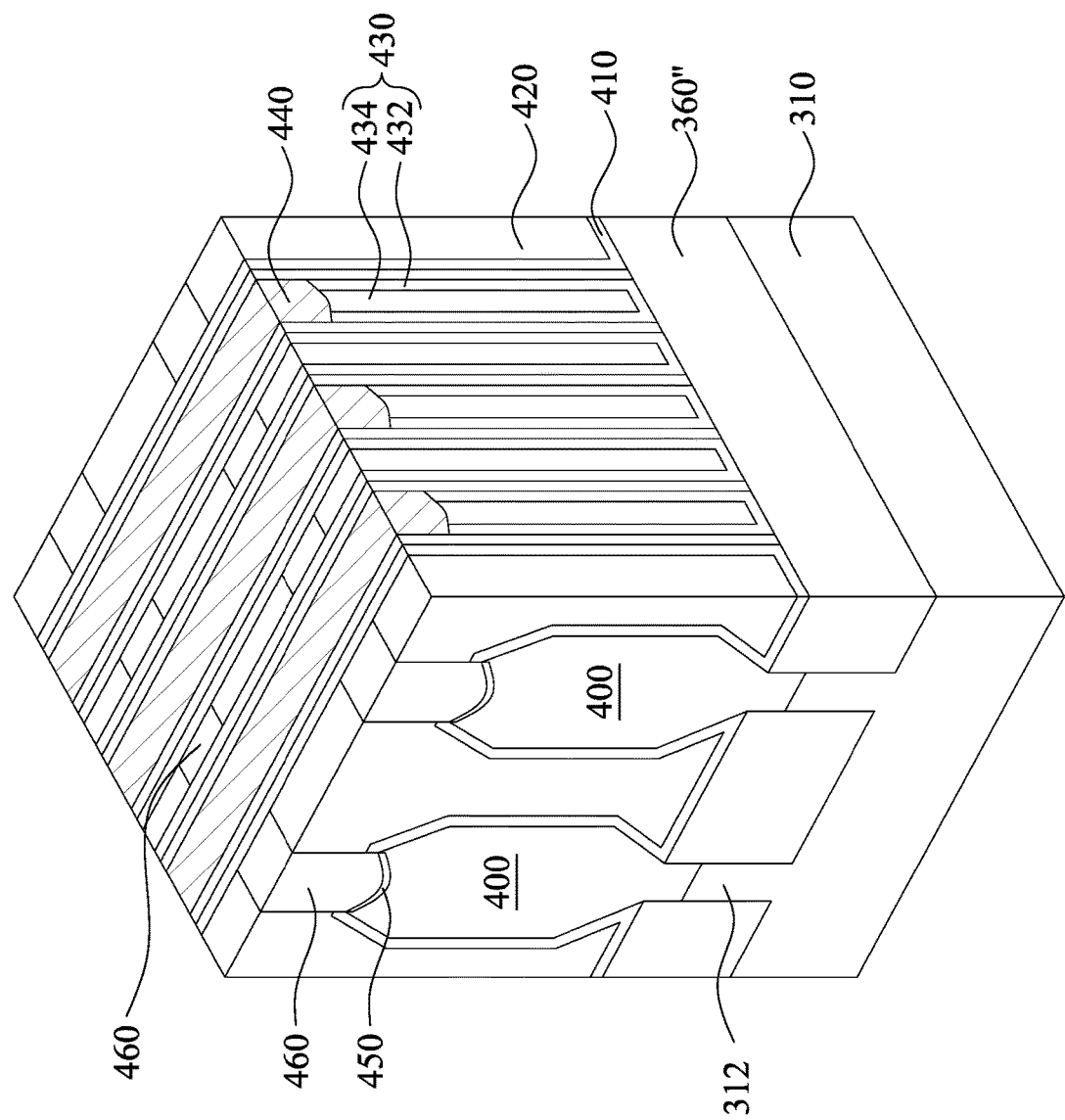

Reference is made to FIG. 30. In some embodiments, the gate structures 430 are recessed, and dielectric caps 440 are formed over respective gate structures 430 using, for example, a deposition process to deposit a dielectric material over the substrate 110, followed by a CMP process to remove excess dielectric material outside the gate trenches. In some embodiments, the dielectric caps 440 include silicon nitride or other suitable dielectric material. The dielectric caps 440 have different etch selectivity than the gate spacers 390, the contact etch stop layer 410, and/or the ILD 420, so as to selective etch back the dielectric caps 440. The dielectric caps 440 can be used to define self-aligned contact region and thus referred to as SAC structures or a SAC layer.

The ILD 420 is then patterned to form trenches on opposite sides of the gate structures 430, and then the CESL 410 is patterned to expose the S/D epitaxial structures 400. In some embodiments, multiple etching processes are performed to pattern the ILD 420 and the CESL 410. The etching processes include dry etching process, wet etching process, or combinations thereof.

In some embodiments, metal alloy layers 450 are respectively formed above the S/D epitaxial structures 200. The metal alloy layers 450, which may be silicide layers, are respectively formed in the trenches and over the exposed S/D epitaxial structures 200 by a self-aligned silicide (salicide) process. The silicide process converts the surface portions of the S/D epitaxial structures 200 into the silicide contacts. Silicide processing involves deposition of a metal that undergoes a silicidation reaction with silicon (Si). In order to form silicide contacts on the S/D epitaxial structures 200, a metal material is blanket deposited on the S/D epitaxial structures 200. After heating the wafer to a temperature at which the metal reacts with the silicon of the S/D epitaxial structures 200 to form contacts, unreacted metal is removed. The silicide contacts remain over the S/D epitaxial structures 200, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 450 may include germanium.

Contacts 460 are then formed in the trenches and above the metal alloy layers 450. As such, the contacts 460 are electrically connected to the S/D epitaxial structures 400. In some embodiments, the contacts 460 may be made of metal, such as W, Co, Ru, Al, Cu, or other suitable materials. After the deposition of the contacts 460, a planarization process, such as a chemical mechanical planarization (CMP) process, may be then performed. In some embodiments, barrier layers may be formed in the trenches before the formation of the contacts 460. The barrier layers may be made of TiN, TaN, or combinations thereof.

Figure 31:
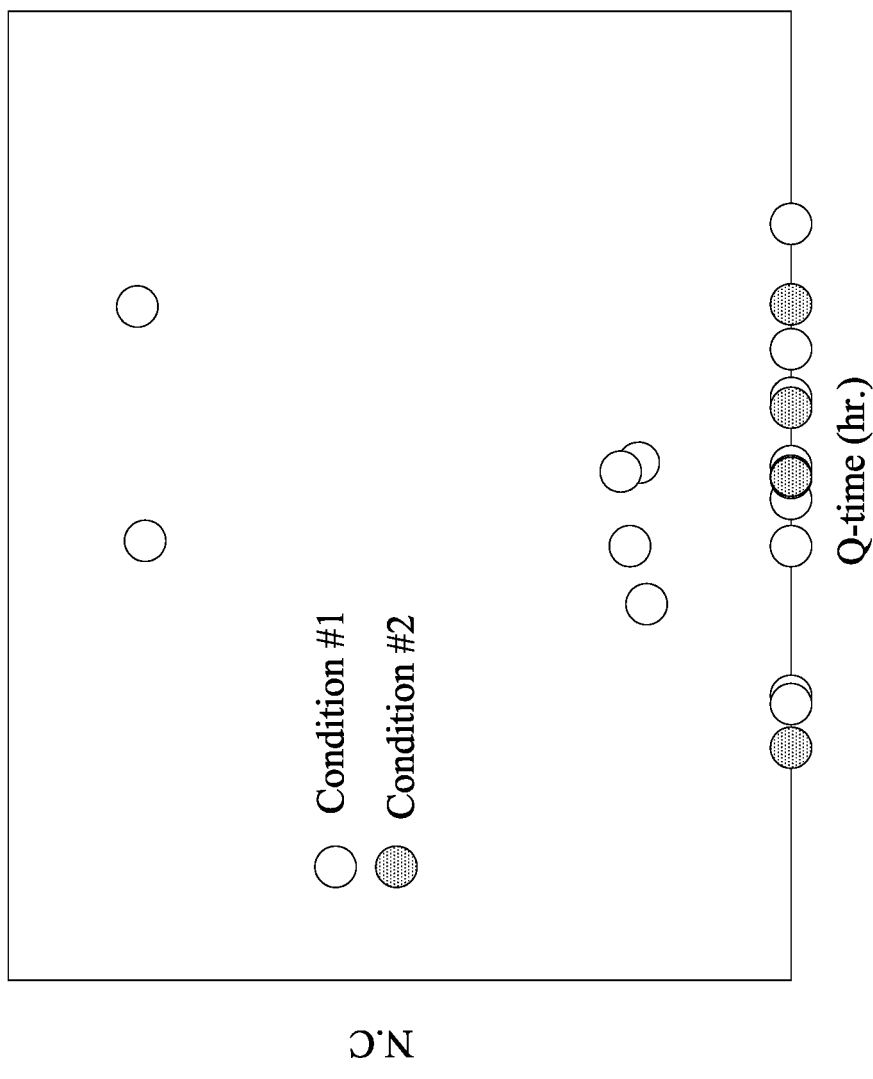
FIG. 31 is graph illustrating experimental results showing number of counted defects in different conditions according to some embodiments of the present disclosure.

FIG. 31 is graph illustrating experimental results showing number of counted defects in different conditions according to some embodiments of the present disclosure, wherein the Queue time (Q-time) is shown on the horizontal axis in FIG. 31, and the number or counts of defects (N.C.) is shown on the vertical axis in FIG. 31. In Condition #1, after the deposition of Si capping layer (referring to FIGS. 3A-3C), the annealing process in FIGS. 4A-4C is omitted. In Condition #2, after the deposition of Si capping layer (referring to FIGS. 3A-3C), the annealing process in FIGS. 4A-4C is performed.

In Condition #1, among plural devices, the number or counts of defects is quite large. The defects may be oxide-definition (OD) defects, which results from oxidation in SiGe. Comparing Condition #2 with Condition #1, among plural devices, the number or counts of defects is reduced. This graph shows that, by annealing the Si capping layer as illustrated in FIGS. 4A-4C, the SiGe is well protected, thereby achieving reduction of OD pits and N/P bias (N/P fin loading issue), and more square fin top profile (viewed in end-of line (EOL)).

Figure 32:
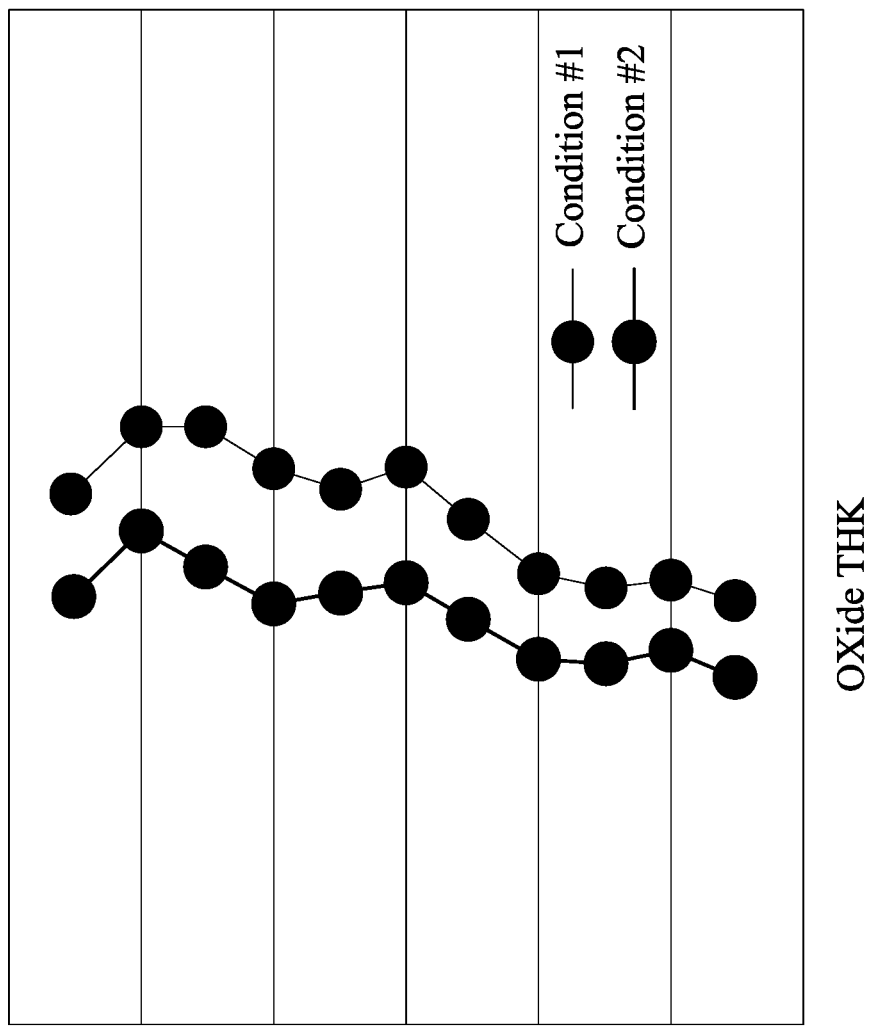
FIG. 32 is graph illustrating experimental results showing sidewall oxide thickness in different conditions according to some embodiments of the present disclosure.

FIG. 32 is graph illustrating experimental results showing sidewall oxide thickness in different conditions according to some embodiments of the present disclosure, wherein the sidewall oxide thickness on SiGe fin sidewall is shown on the horizontal axis in FIG. 32, and the vertical position of SiGe fin is shown on the vertical axis in FIG. 32. In Condition #1, the SiGe fin is capped with a Si capping layer, in which after the deposition of Si capping layer (referring to FIGS. 3A-3C), the annealing process in FIGS. 4A-4C is omitted. In Condition #2, the SiGe fin is capped with a Si capping layer, in which after the deposition of Si capping layer (referring to FIGS. 3A-3C), the annealing process in FIGS. 4A-4C is performed.

In Condition #1, on the SiGe fin sidewall, the oxide thickness is quite large. Comparing Condition #2 with Condition #1, the oxide thickness is reduced. This graph shows that, by annealing the Si capping layer as illustrated in FIGS. 4A-4C, the SiGe may be well protected from oxidation.

Figure 33:
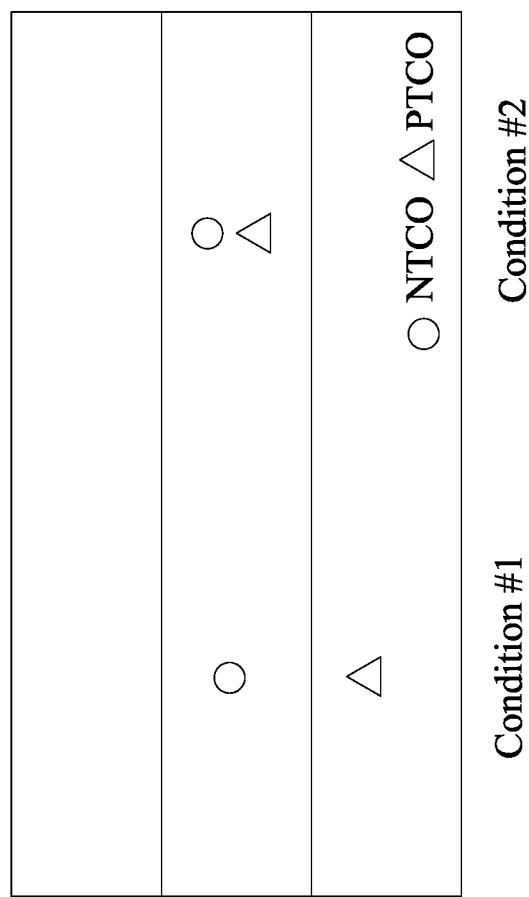
FIG. 33 is graph illustrating experimental results showing N/P fin loading in different conditions according to some embodiments of the present disclosure.

FIG. 33 is graph illustrating experimental results showing N/P fin loading in different conditions according to some embodiments of the present disclosure, wherein the different condition is shown on the horizontal axis in FIG. 33, and the top critical dimension (TCD) is shown on the vertical axis in FIG. 32. In Condition #1, after the deposition of Si capping layer (referring to FIGS. 3A-3C), the annealing process in FIGS. 4A-4C is omitted. In Condition #2, after the deposition of Si capping layer (referring to FIGS. 3A-3C), the annealing process in FIGS. 4A-4C is performed. The TCD may be obtained by Critical Dimension Scanning Electron Microscope (CDSEM).

In Condition #1, a TCD difference between an N-type fin (Si fin) and an P-type fin (SiGe fin) is quite large, such that N/P fin loading issue (N/P bias) may be serious. Comparing Condition #2 with Condition #1, the TCD difference between an N-type fin (Si fin) and a P-type fin (SiGe fin) is reduced. This graph shows that, by annealing the Si capping layer as illustrated in FIGS. 4A-4C, N/P fin loading issue (N/P bias) may be addressed.

Figure 34:
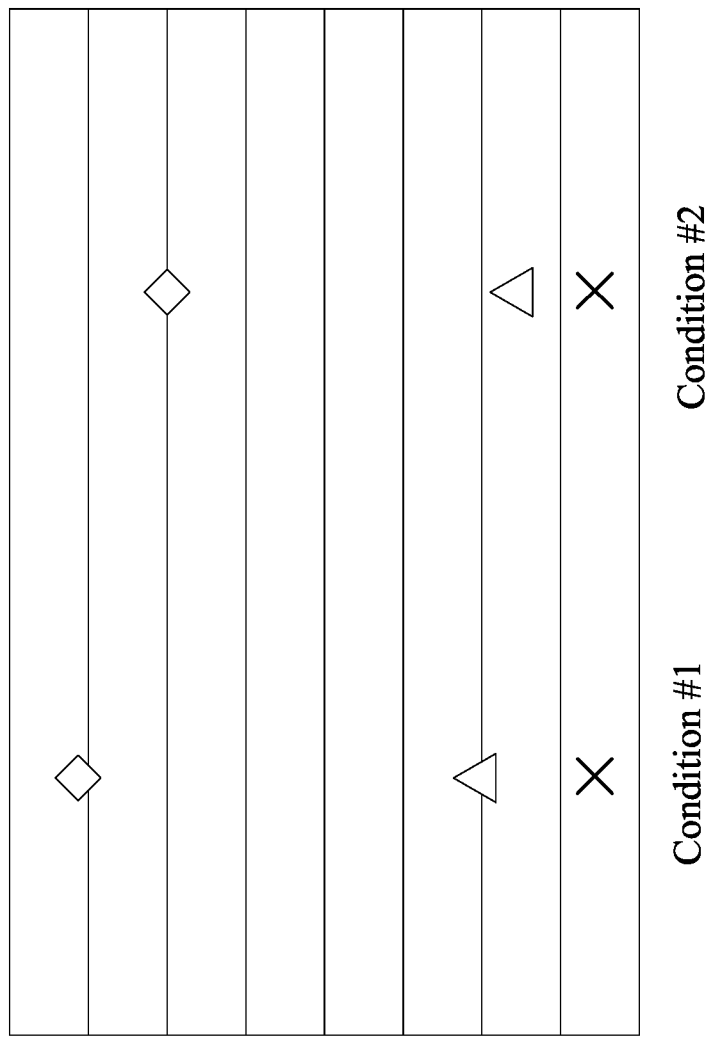
FIG. 34 is graph illustrating experimental results showing fin roughness in different conditions according to some embodiments of the present disclosure.

FIG. 34 is graph illustrating experimental results showing fin roughness in different conditions according to some embodiments of the present disclosure, wherein the conditions is shown on the horizontal axis in FIG. 34, and the roughness is shown on the vertical axis in FIG. 34. In Condition #1, after the deposition of Si capping layer (referring to FIGS. 3A-3C), the annealing process in FIGS. 4A-4C is omitted. In Condition #2, after the deposition of Si capping layer (referring to FIGS. 3A-3C), the annealing process in FIGS. 4A-4C is performed. The term HF, MF, LF in the figure may respectively represent high portion, middle portion, and low portion of the fin.

In Condition #1, the fin roughness is quite large. Comparing Condition #2 with Condition #1, for the high portion, middle portion, and low portion of the fin, the roughness is reduced. This graph shows that, by annealing the Si capping layer as illustrated in FIGS. 4A-4C, the formed fin have more smooth surface, and fin line edge roughness is lowered, thereby achieving better fin line edge roughness (LER) and more silicon layer at bottom (as viewed in EOL).

Figure 35:
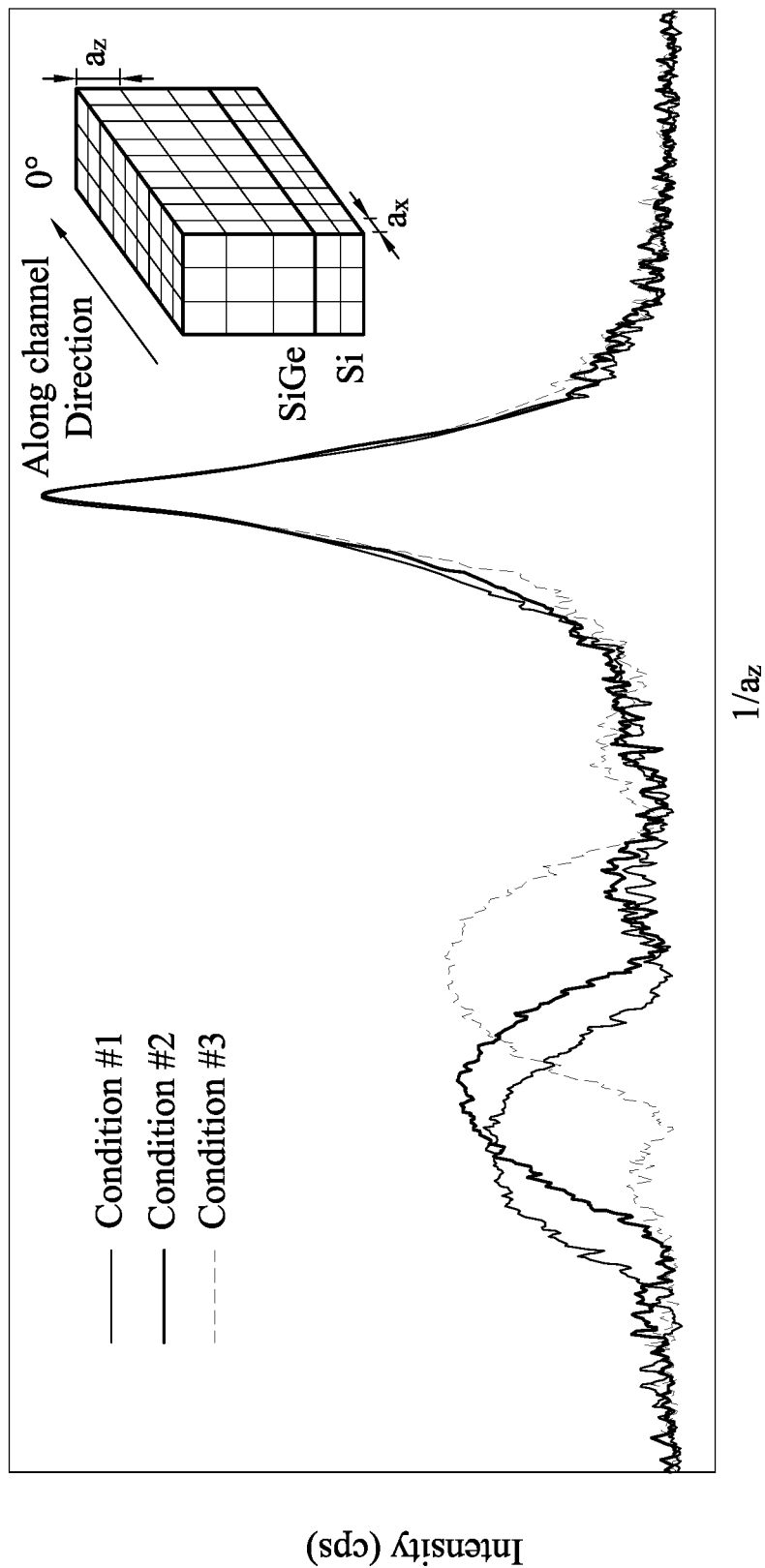
FIG. 35 is graph illustrating experimental results showing reciprocal lattice constant ($1/a_z$) in SiGe in different conditions according to some embodiments of the present disclosure.

FIG. 35 is graph illustrating experimental results showing reciprocal lattice constant ($1/a_z$) in SiGe in different conditions according to some embodiments of the present disclosure, wherein the reciprocal lattice constant ($1/a_z$) is shown on the horizontal axis in FIG. 35, and the intensity is shown on the vertical axis in FIG. 35. In Condition #1, the fin including Si and SiGe is not capped with a Si capping layer (referring to FIGS. 3A-3C). In Condition #2, the fin including Si and SiGe is capped with a Si capping layer, in which after the deposition of Si capping layer (referring to FIGS. 3A-3C), the annealing process in FIGS. 4A-4C is omitted. In Condition #3, the fin including Si and SiGe is capped with a Si capping layer, in which after the deposition of Si capping layer (referring to FIGS. 3A-3C), the annealing process in FIGS. 4A-4C is performed.

In Condition #1, the lattice constant (e.g., $a_z$) of SiGe is quite large. Comparing Condition #2 with Condition #1, the lattice constant (e.g., $a_z$) of SiGe is lowered. Comparing Condition #3 with Condition #2, the lattice constant (e.g., $a_z$) of further lowered. This graph shows that, by capping the fin with a Si capping layer as illustrated in FIGS. 3A-3C, the formed SiGe may experience a lattice strain, thereby having a lowered lattice constant. Furthermore, the thermal anneal treatment in FIGS. 4A-4C also results in strain re-balance between the SiGe and the Si capping layer, such that the lattice constant (e.g., $a_z$) of the SiGe further is reduced due to the presence of the Si capping layer after the thermal anneal treatment. As such, the SiGe with a reduced lattice constant (e.g., $a_z$) has a denser structure and therefore becomes more resistant to oxidation.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that a Si capping layer can be formed on sidewalls of the SiGe and densified by a thermal treatment, thereby effectively protect the SiGe from being oxidation. That is, the thermal treatment may robust OD/STI fabrication of p-type fully strained channel (PFSC). Another advantage is that an amorphous portion of the Si capping layer is converted into crystalline (which is more resistant to oxidation) by the thermal treatment, such that a distance between the SiGe and the amorphous portion of the Si capping layer is increased, thereby ensuring the SiGe from the oxidation. In some embodiments, the Si capping layer may be formed prior to the formation of the STI structure and may protect the SiGe from oxidation during annealing the STI structure, thereby achieving better SiGe fin (or nanosheet) protection, reduction of OD pits and N/P bias, and more square fin top profile (viewed in end-of line (EOL)). In some embodiments, the Si capping layer may be formed after the formation of the STI structure and may protect the SiGe from oxidation during the formation of dummy gate structures, thereby achieving better fin line edge roughness (LER) and more silicon layer at bottom (as viewed in EOL).

In some embodiments of the present disclosure, a method for manufacturing a semiconductor device is provided. The method includes forming at least one epitaxial layer over a substrate; forming a mask over the epitaxial layer; patterning the epitaxial layer into a semiconductor fin; depositing a semiconductor capping layer over the semiconductor fin and the mask, wherein the semiconductor capping layer has a first portion that is amorphous on a sidewall of the mask; performing a thermal treatment such that the first portion of the semiconductor capping layer is converted from amorphous into crystalline; forming an isolation structure around the semiconductor fin; and forming a gate structure over the semiconductor fin.

In some embodiments, a method for manufacturing a semiconductor device is provided. The method includes forming at least one epitaxial layer over a substrate; patterning the epitaxial layer into a semiconductor fin; forming an isolation structure around the semiconductor fin; depositing a semiconductor capping layer over the semiconductor fin and the isolation structure, wherein the semiconductor capping layer has a first portion that is amorphous on a top surface of the isolation structure and adjacent to the semiconductor fin; perform a thermal treatment such that the first portion of the semiconductor capping layer is converted from amorphous into crystalline; and forming a gate structure over the semiconductor fin.

In some embodiments, a method for manufacturing a semiconductor device is provided. The method includes forming an epitaxial stack over a substrate; patterning the epitaxial stack into a semiconductor fin, wherein the semiconductor fin comprises a plurality of first semiconductor layers and a plurality of second semiconductor layers alternatively arranged; depositing a semiconductor capping layer on a sidewall of the semiconductor fin; annealing the semiconductor capping layer to induce crystallization in the semiconductor capping layer; forming a dielectric material around the semiconductor fin after annealing the semiconductor capping layer; removing the first semiconductor layers from the semiconductor fin; and forming a gate structure surrounding the second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising: forming at least one epitaxial layer over a substrate; forming a mask over the epitaxial layer; patterning the epitaxial layer into a semiconductor fin; depositing a conformal semiconductor capping layer over the semiconductor fin and the mask, wherein the conformal semiconductor capping layer has a first portion that is amorphous on a sidewall of the mask and a second portion that is crystalline on a sidewall of the semiconductor fin; performing a thermal treatment such that the first portion of the conformal semiconductor capping layer is converted from amorphous into crystalline; forming an isolation structure around the semiconductor fin; and forming a gate structure over the semiconductor fin.

2. The method of claim 1, wherein forming the isolation structure comprises: depositing a dielectric material over the conformal semiconductor capping layer; and annealing the dielectric material, such that the conformal semiconductor capping layer is converted into a semiconductor-containing oxide layer.

3. The method of claim 2, wherein forming the isolation structure further comprises: planarizing the dielectric material and the semiconductor-containing oxide layer.

4. The method of claim 2, wherein forming the isolation structure further comprises: recessing the dielectric material and the semiconductor-containing oxide layer.

5. The method of claim 1, wherein depositing the conformal semiconductor capping layer is performed such that the conformal semiconductor capping layer has a third portion that is amorphous at least on a top surface of the mask, and the thermal treatment is performed such that the third portion of the conformal semiconductor capping layer remains amorphous.

6. The method of claim 1, wherein a plurality of the epitaxial layers are formed over the substrate and patterned into the semiconductor fin.

7. The method of claim 1, wherein the mask comprises a pad layer and a hard mask layer, and the thermal treatment is performed such that the first portion of the conformal semiconductor capping layer that is crystalline has a top higher than a top surface of the pad layer.

8. A method for manufacturing a semiconductor device, comprising: forming at least one epitaxial layer over a substrate; patterning the epitaxial layer into a semiconductor fin; forming an isolation structure around the semiconductor fin; depositing a conformal semiconductor capping layer over the semiconductor fin and the isolation structure, wherein the conformal semiconductor capping layer has a first portion that is amorphous on a top surface of the isolation structure and adjacent to the semiconductor fin; performing a thermal treatment such that the first portion of the conformal semiconductor capping layer is converted from amorphous into crystalline; and forming a dummy gate structure over the semiconductor fin.

9. The method of claim 8, wherein depositing the conformal semiconductor capping layer is performed such that the conformal semiconductor capping layer has a second portion that is crystalline on a sidewall of the semiconductor fin.

10. The method of claim 8, wherein depositing the conformal semiconductor capping layer is performed such that the conformal semiconductor capping layer has a second portion that is crystalline on a top surface of the semiconductor fin.

11. The method of claim 8, wherein depositing the conformal semiconductor capping layer is performed such that the conformal semiconductor capping layer has a third portion that is amorphous on the top surface of the isolation structure and away from the semiconductor fin, and the thermal treatment is performed such that the third portion of the conformal semiconductor capping layer remains amorphous.

12. The method of claim 8, further comprising: replacing the dummy gate structure with a metal gate structure, wherein replacing the dummy gate structure with the metal gate structure is performed such that the conformal semiconductor capping layer is removed.

13. The method of claim 12, wherein forming the dummy gate structure comprises: depositing a gate dielectric layer over the conformal semiconductor capping layer; depositing a gate electrode layer over the gate dielectric layer; patterning the gate electrode layer into a gate electrode; and patterning the gate dielectric layer and the conformal semiconductor capping layer into a gate dielectric.

14. The method of claim 13, wherein depositing the gate dielectric layer is performed such that the conformal semiconductor capping layer is oxidized.

15. A method for manufacturing a semiconductor device, comprising: forming an epitaxial stack over a substrate; patterning the epitaxial stack into a semiconductor fin, wherein the semiconductor fin comprises a plurality of first semiconductor layers and a plurality of second semiconductor layers alternatively arranged; depositing a conformal semiconductor capping layer on a sidewall of the semiconductor fin; annealing the conformal semiconductor capping layer to induce crystallization in the conformal semiconductor capping layer; removing the first semiconductor layers from the semiconductor fin; and forming a metal gate structure surrounding the second semiconductor layers.

16. The method of claim 15, further comprising: forming a mask over the epitaxial stack, wherein patterning the epitaxial stack is performed such that the mask is over a top surface of the semiconductor fin, and annealing the conformal semiconductor capping layer is performed such that a portion of the conformal semiconductor capping layer adjacent to the top surface of the semiconductor fin is converted from amorphous into crystalline.

17. The method of claim 15, further comprising: forming an isolation structure on the sidewall of the semiconductor fin prior to depositing the conformal semiconductor capping layer, wherein annealing the conformal semiconductor capping layer is performed such that a portion of the conformal semiconductor capping layer adjacent to the sidewall of the semiconductor fin is converted from amorphous into crystalline.

18. The method of claim 15, wherein depositing the conformal semiconductor capping layer is performed such that the conformal semiconductor capping layer is free from oxygen.

19. The method of claim 15, wherein depositing the conformal semiconductor capping layer is performed such that the conformal semiconductor capping layer comprises a composition different from one of the first semiconductor layers and the second semiconductor layers.

20. The method of claim 1, wherein the mask comprises a pad layer and a hard mask layer, and depositing the conformal semiconductor capping layer is performed such that the second portion of the conformal semiconductor capping layer that is crystalline has a top higher than a top surface of the semiconductor fin and lower than a top surface of the pad layer.

* * * * *